(12) United States Patent
Tanaka

(10) Patent No.: US 8,409,905 B2
(45) Date of Patent: Apr. 2, 2013

(54) METHOD OF FORMING DISPLAY DEVICE THAT INCLUDES REMOVING MASK TO FORM OPENING IN INSULATING FILM

(75) Inventor: Koichiro Tanaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/270,271

(22) Filed: Oct. 11, 2011

(65) Prior Publication Data

US 2012/0028391 A1 Feb. 2, 2012

Related U.S. Application Data

(63) Continuation of application No. 12/795,771, filed on Jun. 8, 2010, now Pat. No. 8,053,269, which is a continuation of application No. 11/889,546, filed on Aug. 14, 2007, now Pat. No. 7,736,936.

(30) Foreign Application Priority Data

Aug. 29, 2006 (JP) .................................. 2006-231956

(51) Int. Cl.
*H01L 21/4763* (2006.01)

(52) U.S. Cl. .... 438/69; 438/151; 438/675; 257/E21.411

(58) Field of Classification Search .................. 438/926
See application file for complete search history.

(56) References Cited

U.S. PATENT DOCUMENTS

| | | | |
|---|---|---|---|
| 5,275,973 | A | 1/1994 | Gelatos |
| 5,880,038 | A | 3/1999 | Yamazaki et al. |
| 5,940,732 | A | 8/1999 | Zhang |
| 6,396,078 | B1 | 5/2002 | Uochi et al. |
| 6,677,243 | B2 | 1/2004 | Okada et al. |
| 6,715,871 | B2 | 4/2004 | Hashimoto et al. |
| 6,849,308 | B1 | 2/2005 | Speakman et al. |
| 6,849,549 | B1 | 2/2005 | Chiou et al. |
| 6,861,670 | B1 | 3/2005 | Ohtani et al. |
| 6,905,906 | B2 | 6/2005 | Sirringhaus et al. |
| 7,160,794 | B1 | 1/2007 | Hsueh et al. |
| 7,179,733 | B2 | 2/2007 | Saito et al. |
| 7,202,497 | B2 | 4/2007 | Ohtani et al. |
| 7,399,704 | B2 | 7/2008 | Fujii et al. |
| 7,425,474 | B2 | 9/2008 | Kawase et al. |
| 7,510,905 | B2 | 3/2009 | Fujii et al. |

(Continued)

FOREIGN PATENT DOCUMENTS

| | | |
|---|---|---|
| CN | 1536937 | 10/2004 |
| CN | 1649096 | 8/2005 |

(Continued)

OTHER PUBLICATIONS

Chinese Office Action (Application No. 200710148218.1 CN09907) Dated Nov. 8, 2011 with English translation.

(Continued)

*Primary Examiner* — Stephen W Smoot
(74) *Attorney, Agent, or Firm* — Nixon Peabody LLP; Jeffrey L. Costellia

(57) ABSTRACT

To improve the use efficiency of materials and provide a technique of fabricating a display device by a simple process. The method includes the steps of providing a mask on a conductive layer, forming an insulating film over the conductive layer provided with the mask, removing the mask to form an insulating layer having an opening; and forming a conductive film in the opening so as to be in contact with the exposed conductive layer, whereby the conductive layer and the conductive film can be electrically connected through the insulating layer. The shape of the opening reflects the shape of the mask. A mask having a columnar shape (e.g., a prism, a cylinder, or a triangular prism), a needle shape, or the like can be used.

29 Claims, 35 Drawing Sheets

U.S. PATENT DOCUMENTS

| | | |
|---|---|---|
| 7,655,499 B2 | 2/2010 | Fujii et al. |
| 7,753,751 B2 | 7/2010 | Yamazaki |
| 8,237,355 B2 | 8/2012 | Yamazaki |
| 2002/0106887 A1 | 8/2002 | Chang |
| 2004/0160179 A1 | 8/2004 | Omura |
| 2005/0062057 A1 | 3/2005 | Yamazaki et al. |
| 2005/0074963 A1 | 4/2005 | Fujii et al. |
| 2005/0158665 A1 | 7/2005 | Maekawa et al. |
| 2005/0170565 A1 | 8/2005 | Fujii et al. |
| 2005/0170643 A1 | 8/2005 | Fujii et al. |
| 2005/0266693 A1 | 12/2005 | Maekawa |
| 2006/0043592 A1 | 3/2006 | Tanaka |
| 2007/0287207 A1 | 12/2007 | Fujii |
| 2007/0292986 A1 | 12/2007 | Fujii |
| 2008/0227232 A1 | 9/2008 | Yamazaki et al. |
| 2009/0148971 A1 | 6/2009 | Fujii et al. |
| 2012/0305922 A1 | 12/2012 | Yamazaki |

FOREIGN PATENT DOCUMENTS

| | | |
|---|---|---|
| JP | 10-112499 | 4/1998 |
| JP | 2000-133636 | 5/2000 |
| JP | 2004-304162 | 10/2004 |
| JP | 2006-126817 | 5/2006 |

OTHER PUBLICATIONS

Office Action (Application No. 200710148218.1; CN09907) Dated Mar. 2, 2010.

METHOD OF FORMING DISPLAY DEVICE THAT INCLUDES REMOVING MASK TO FORM OPENING IN INSULATING FILM

BACKGROUND OF THE INVENTION

1. Field of the Invention

The present invention relates to a method of fabricating a display device having a stacked structure of thin films. More specifically, the invention relates to the step of forming an opening in a thin film in the process of fabricating a display device.

2. Description of the Related Art

Thin film transistors (also referred to as "TFTs") and electronic circuits having TFTS are fabricated by the steps of stacking various thin films such as a semiconductor film, an insulating film, and a conductive film, and forming predetermined patterns in the films by a photolithography technique as appropriate. A photolithography technique is a technique of transferring a circuit pattern or the like, which is called a photomask and is formed from a non-light-transmissive material on a transparent flat plate, onto a substrate through light exposure, and is widely used in the process of fabricating semiconductor integrated circuits and the like.

A fabrication process of a semiconductor device using a conventional photolithography technique involves a number of steps such as light exposure, development, baking, and peeling for the process of handling a mask pattern which is formed from a photosensitive organic resin material called photoresist. Therefore, the more the number of photolithography steps is increased, the more the fabrication cost is inevitably increased. In order to overcome such drawbacks, a fabrication process of TFTs with a reduced number of photolithography steps has been studied (e.g., see Reference 1: Japanese Published Patent Application No. 2000-133636). In Reference 1, a resist mask formed by photolithography steps which is used once is subjected to cubical expansion by swelling treatment so that the mask can be used again.

SUMMARY OF THE INVENTION

It is an object of the invention to provide a technique of fabricating TFTs, electronic circuits having TFTs, and display devices having TFTs at low cost with high yield, using a simplified process with a reduced number of photolithography steps. It is also an object of the invention to provide a technique of fabricating such devices over a large substrate having one side longer than one meter at low cost with high yield.

In the invention, in the case of electrically connecting thin films (e.g., a conductive layer and a semiconductor layer) that are stacked with an insulating layer sandwiched therebetween, an opening (a so-called contact hole) is formed in the insulating layer. In this case, the insulating layer is selectively formed so as to have an opening without using an etching step. Specifically, a mask is provided in a region where an opening is to be formed, and an insulating layer is formed in a region excluding the mask. After the formation of the insulating layer, the mask is removed physically or chemically, so that an insulating layer having an opening in the region where the mask has been provided is formed. Thus, an insulating layer having an opening is formed over a conductive layer in such a manner that a part of the conductive layer below the insulating layer is exposed at the bottom of the opening. Then, another conductive film is formed in the opening so as to be in contact with the exposed conductive layer, whereby the conductive layer and the conductive film are electrically connected at the opening provided in the insulating layer.

The shape of the opening reflects the shape of the mask. Therefore, any mask with which an opening with a desired shape can be formed is acceptable. The mask can have a columnar shape (e.g., a prism, a cylinder, or a triangular prism), a needle shape, or the like. In addition, the depth direction of the opening can be determined by the force generated upon providing the mask and by the film strength of the conductive layer that is provided with the mask. When a needle-shaped mask having a sharp end is provided in such a manner that a part of the sharp end sticks into the conductive layer, an opening with a recessed portion can be formed in the conductive layer. Further, after the formation of the opening, the conductive layer exposed at the bottom of the opening may be removed by etching, using the insulating layer having the opening as a mask.

The insulating layer can be formed by an evaporation method, a PVD (Physical Vapor Deposition) method such as a sputtering method, a CVD (Chemical Vapor Deposition) method such as a low-pressure CVD (LPCVD) method or a plasma CVD method, or the like. In the invention, a region above the conductive layer where the opening is to be formed is physically blocked with a mask so that the material for forming the insulating layer does not adhere to the conductive layer. Thus, a non-formation region of the insulating layer can be determined physically and, therefore, an insulating layer having an opening can be formed with high accuracy. Thus, using the invention can fabricate a highly reliable semiconductor device and display device with high yield.

According to the invention, an insulating layer having an opening can be selectively formed without using a photolithography process. Therefore, the number of steps and materials can be reduced.

Further, a conductive layer, a semiconductor layer, or the like can also be selectively formed into a desired shape without using a photolithography process. Specifically, a light-absorbing film such as a conductive film or a semiconductor film is formed on a first substrate (i.e., a substrate from which a film is transferred) having a light-transmitting property, and then the light-absorbing film is irradiated with laser light from the side of the first substrate, so that a region of the light-absorbing film irradiated with the laser light is transferred to a second substrate (a substrate to which the film on the first substrate is transferred). As a result, a conductive layer or a semiconductor layer which is a light-absorbing layer having a desired shape (pattern) is formed on the second substrate. In this specification, a substrate on which a conductive film or a semiconductor film which is a light-absorbing film is formed in the first step, which is followed by laser irradiation is referred to as a first substrate. Meanwhile, a substrate on which a conductive layer or a semiconductor layer which is a light-absorbing layer is selectively formed finally is referred to as a second substrate. Since a desired pattern can be selectively formed without using a photolithography process, it is possible to realize a simplified process, cost reduction, and the like.

One aspect of the invention is a method of fabricating a display device, which includes the steps of providing a mask on a conductive layer, forming an insulating film over the conductive layer provided with the mask, removing the mask to form an opening in the insulating film, and forming a conductive film in the opening so as to be in contact with the conductive layer.

One aspect of the invention is a method of fabricating a display device, which includes the steps of forming a thin film transistor having a gate electrode layer, a gate insulating layer, a semiconductor layer, a source electrode layer, and a drain electrode layer, providing a mask on the source electrode layer or the drain electrode layer, forming an insulating film over the thin film transistor having the source electrode layer or the drain electrode layer provided with the mask, removing the mask to form an opening in the insulating film, and forming a pixel electrode layer in the opening so as to be in contact with the source electrode layer or the drain electrode layer.

One aspect of the invention is a method of fabricating a display device, which includes the steps of forming a thin film transistor having a gate electrode layer, a gate insulating layer, a semiconductor layer, a source electrode layer, and a drain electrode layer, providing a mask on the source electrode layer or the drain electrode layer, forming an insulating film over the thin film transistor having the source electrode layer or the drain electrode layer provided with the mask, removing the mask to form an opening in the insulating film, forming a first electrode layer in the opening so as to be in contact with the source electrode layer or the drain electrode layer, forming an electroluminescent layer over the first electrode layer, and forming a second electrode layer over the electroluminescent layer.

Instead of the conductive layer formed in the above-described process, it is also possible to use a semiconductor layer. A semiconductor layer can be formed by using a semiconductor material. The invention can be applied to any component of a display device such as conductive layers and semiconductor layers. Examples of the conductive layers include a wiring layer, a gate electrode layer, a source electrode layer, a drain electrode layer, a pixel electrode layer, and the like.

The invention can be applied to a display device having a display function. Examples of display devices that apply the invention include a light-emitting display device having a light-emitting element and a TFT connected together, in which the light-emitting element includes a layer which contains an organic substance, an inorganic substance, or a mixture of an organic substance and an inorganic substance between a pair of electrodes and which exhibits light emission called electroluminescence (hereinafter also referred to as "EL"); a liquid crystal display device which uses a liquid crystal element containing a liquid crystal material as a display element; and the like. In the invention, a "display device" means a device having display elements (e.g., liquid crystal elements or light-emitting elements). Note that the display device can be a display panel in which a plurality of pixels each having a display element such as a liquid crystal element or an EL element and a peripheral driver circuit for driving these pixels are formed over a substrate. Further, a flexible printed circuit (FPC) or a printed wiring board (PWB) (e.g., ICs, resistors, capacitors, inductors, and transistors) can be attached to such a display panel. Furthermore, a display panel may include optical sheets such as a polarizing plate and a retardation plate. In addition, a display panel may also include a backlight unit (which may include a light guide plate, a prism sheet, a diffusion sheet, a reflection sheet, and a light source (e.g., LED or a cold cathode tube)).

Note that a display element and a display device can be in various forms and have various elements. For examples, the following can be used: an EL element (an organic EL element, an inorganic EL element, or an EL element containing an organic substance and an inorganic substance), an electron-emissive element, a liquid crystal element, electronic ink, a grating light valve (GLV), a plasma display panel (PDP), a digital micromirror device (DMD), a piezoceramic display, a carbon nanotube, and a display medium whose contrast changes by an electromagnetic action. Note that display devices using EL elements include an EL display; display devices using electron-emissive elements include a field emission display (FED), a surface-conduction electron-emitter display (SED), and the like; display devices using liquid crystal elements include a liquid crystal display, a transmissive liquid crystal display, a semi-transmissive liquid crystal display, and a reflective liquid crystal display; and display devices using electronic ink include electronic paper.

With the invention, a device having a circuit which includes semiconductor elements (transistors, memory elements, diodes, and the like) and a semiconductor device such as a chip having a processor circuit can be fabricated. Note that semiconductor devices of the invention include all devices that can function by utilizing semiconductor characteristics.

According to the invention, components of a display device or the like such as wirings or a contact hole that enable electrical connection between two components through an insulating layer can be formed with a reduced number of complicated photolithography steps. Therefore, a display device can be fabricated by a simplified process, waste of materials can be reduced, and cost reduction can be achieved. Therefore, a display device with high performance and high reliability can be fabricated with high yield.

DETAILED DESCRIPTION OF THE INVENTION

Figure 1A:
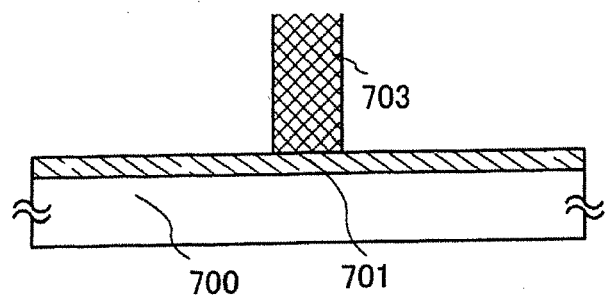
FIGS. 1A to 1D are schematic views illustrating the invention.

Embodiment modes of the invention will be described below with reference to the accompanying drawings. Note that the invention is not limited to the following description, and it will be easily understood by those skilled in the art that various changes and modifications can be made without departing from the spirit and scope of the invention. Therefore, the invention should not be construed as being limited to the description in the following embodiment modes. Note that in the structure of the invention described below, portions that are identical or portions having similar functions in different drawings are denoted by the same reference numerals, and their repetitive description will be omitted.

(Embodiment Mode 1)

This embodiment mode will describe a method of forming a contact hole with high reliability at low cost through a simplified process, with reference to FIGS. 1A to 1D.

In the case of electrically connecting thin films (e.g., a conductive layer and a semiconductor layer) that are stacked with an insulating layer sandwiched therebetween, an opening (so-called contact hole) is formed in the insulating layer. In this case, the insulating layer is selectively formed so as to have an opening without using an etching step. Specifically, a mask is provided in a region where an opening is to be formed, and an insulating layer is formed in a region excluding the mask. After the formation of the insulating layer, the mask is removed physically or chemically, so that an insulating layer having an opening in the region where the mask has been provided is formed. Thus, an insulating layer having an opening is formed over a conductive layer in such a manner that a part of the conductive layer below the insulating layer is exposed at the bottom of the opening. Then, another conductive film is formed in the opening so as to be in contact with the exposed conductive layer, whereby the conductive layer and the conductive film are electrically connected at the opening provided in the insulating layer.

The shape of the opening reflects the shape of the mask. Therefore, any mask with which an opening with a desired shape can be formed is acceptable. The mask can have a columnar shape (e.g., a prism, a cylinder, or a triangular prism), a needle shape, or the like. In addition, the depth direction of the opening can be determined by the force generated upon providing the mask and by the film strength of the conductive layer that is provided with the mask. When a needle-shaped mask having a sharp end is provided in such a manner that a part of the sharp end sticks into the conductive layer, an opening with a recessed portion can be formed in the conductive layer. Further, after the formation of the opening, the conductive layer exposed at the bottom of the opening may be removed by etching, using the insulating layer having the opening as a mask.

The insulating layer can be formed by an evaporation method, a PVD (Physical Vapor Deposition) method such as a sputtering method, a CVD (Chemical Vapor Deposition) method such as a low-pressure CVD (LPCVD) method or a plasma CVD method, or the like. In the invention, a region above the conductive layer where the opening is to be formed is physically blocked with a mask so that the material for forming the insulating layer does not adhere to the conductive layer. Thus, a non-formation region of the insulating layer can be determined physically and, therefore, an insulating layer having an opening can be formed with high accuracy. Thus, using the invention can fabricate a highly reliable semiconductor device and display device with high yield.

According to the invention, an insulating layer having an opening can be selectively formed without using a photolithography process. Therefore, the number of steps and materials can be reduced.

Specific description will be given below with reference to FIGS. 1A to 1D. In this embodiment mode, a conductive layer 701 is formed over a substrate 700 having an insulating surface, and a mask 703 is formed in a region above the conductive layer 701 where an opening is to be formed, as shown in FIG. 1A. Although a mask supporting means is not shown in FIG. 1A, the mask may be provided on the conductive layer 701 by utilizing the gravity or adhesion of the mask. When the mask has weak adhesion or attachment to the conductive layer 701, it may be provided on a supporting substrate so that the mask is supported to be in contact with the conductive layer 701.

Figure 1B:
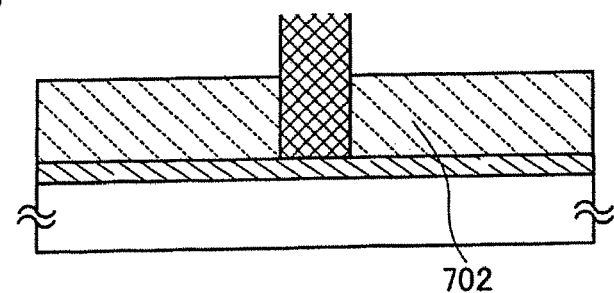

An insulating film 702 is deposited over the conductive layer 701 with the mask 703 selectively provided on the conductive layer 701 (see FIG. 1B). The insulating film 702 is deposited over a region of the conductive layer 701 excluding the mask 703.

Figure 1C:
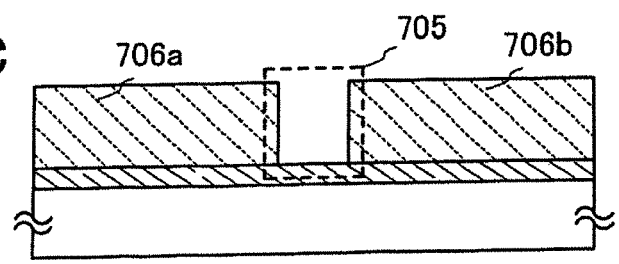
Figure 1D:
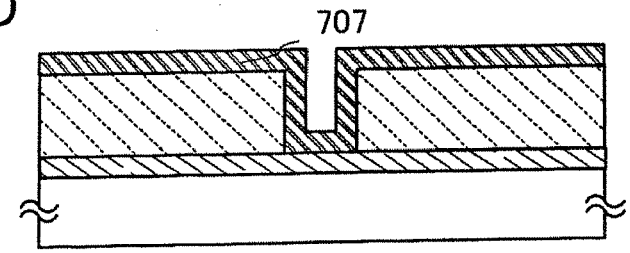

Next, the mask 703 is removed, whereby insulating layers 706a and 706b having an opening 705 can be formed (see FIG. 1C). Referring to the cross-sectional view of FIG. 1C, the opening 705 is provided between the insulating layers 706a and 706b. Then, a conductive film 707 is formed in the opening 705 where the conductive layer 701 is exposed, whereby the conductive layer 701 and the conductive film 707 can be electrically connected (see FIG. 1D).

The insulating film 702 can be formed by an evaporation method, a PVD (Physical Vapor Deposition) method such as a sputtering method, a CVD (Chemical Vapor Deposition) method such as a low-pressure CVD (LPCVD) method or a plasma CVD method, or the like. In particular, the plasma CVD method whose reaction pressure is 1 Pa to several hundred Pa which is higher than the reaction pressure of a physical deposition method by two digits or more is preferably used because it has a short mean free path of particles and particles can smoothly get around obstructions. Therefore, the insulating film can be deposited so as to fully cover the underlying layer except for the region blocked by the mask. In this specification, "to fully cover" means a film that has few discontinuous states such as holes can be formed so as to continuously and tightly cover the underlying layer. In particular, when a plurality of openings are to be provided in close positions, a plurality of masks should also be provided in close positions. Therefore, when the plasma CVD method by which particles can smoothly get around obstructions is used, an insulating film with an excellent shape can be formed so as to fully cover the underlying layer excluding the region of the mask provided for formation of the openings. The resultant insulating layer having an opening can be a film that has an opening at an accurate and desired place and is free from damage, defects, or the like.

The shape of the opening reflects the shape of the mask. Therefore, any mask with which an opening with a desired shape can be formed is acceptable. The mask can have a columnar shape (e.g., a prism, a cylinder, or a triangular prism), a needle shape, or the like. Further, after the formation of the opening, the conductive layer exposed at the bottom of the opening may be removed by etching, using the insulating layer having the opening as a mask.

When the mask is designed to have a top surface with a punctate shape, a circular shape, an elliptical shape, a rectangular shape, or a linear shape (to be strict, an elongated rectangle) as appropriate, an opening formed in the insulating layer can also have a top surface which reflects the shape of the mask.

Figure 2A:
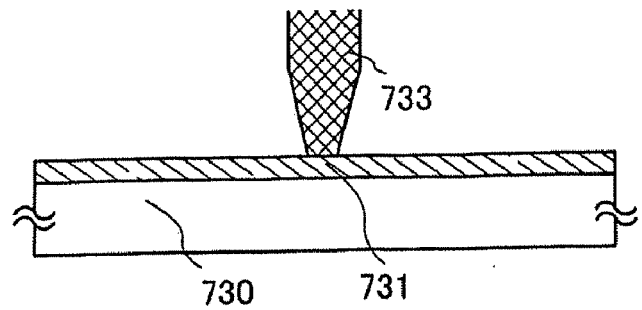
FIGS. 2A to 2D are schematic views illustrating the invention.
Figure 2B:
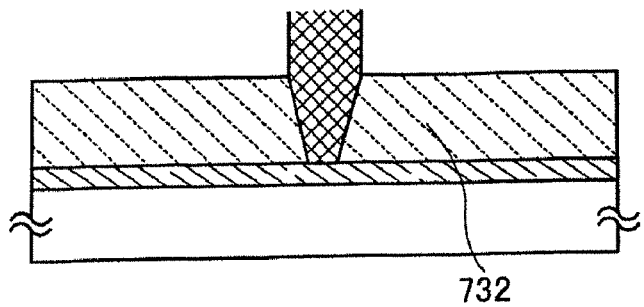

FIGS. 2A to 2D show an example of using a mask that has an elongated conical end. Referring to FIG. 2A, a conductive layer 731 is formed over a substrate 730, and a mask 733 is provided in contact with the conductive layer 731. The mask 733 has a tapered portion whose cross section becomes narrow toward the conductive layer. An insulating film 732 is formed with the mask 733 provided on the conductive layer 731 (see FIG. 2B). The insulating film 732 is deposited over a region of the conductive layer 731 excluding the mask 733.

Figure 2C:
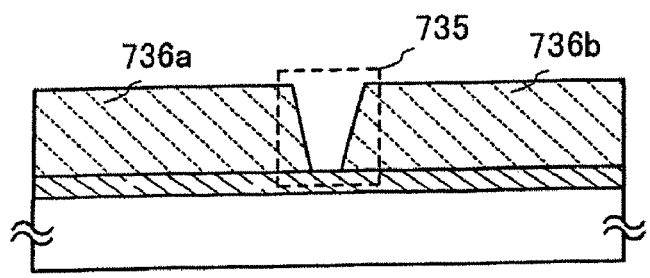
Figure 2D:
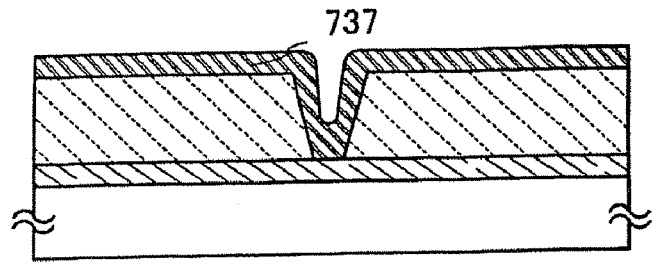

Next, the mask 733 is removed, whereby insulating layers 736a and 736b having an opening 735 can be formed (see FIG. 2C). Referring to the cross-sectional view of FIG. 2C, the opening 735 is provided between the insulating layers 736a and 736b. Then, a conductive film 737 is formed in the opening 735 where the conductive layer 731 is exposed, whereby the conductive layer 731 and the conductive film 737 can be electrically connected (see FIG. 2D). The opening 735 reflects the shape of the mask 733, and opposite side surfaces of the opening are tapered.

Figure 30A:
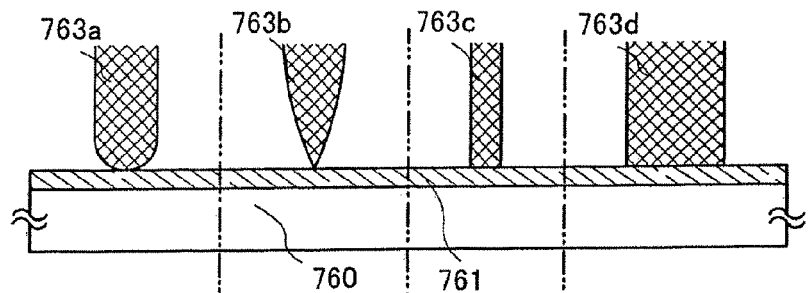
FIGS. 30A to 30D are schematic views illustrating the invention.
Figure 30B:
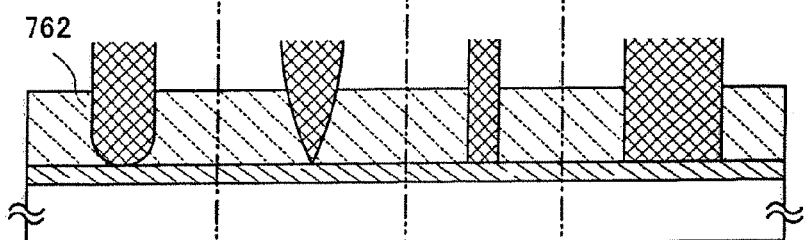
Figure 30C:
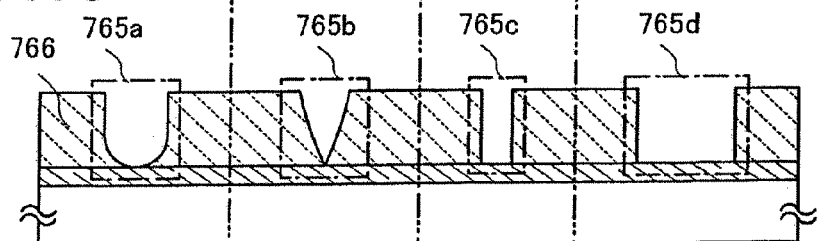
Figure 30D:
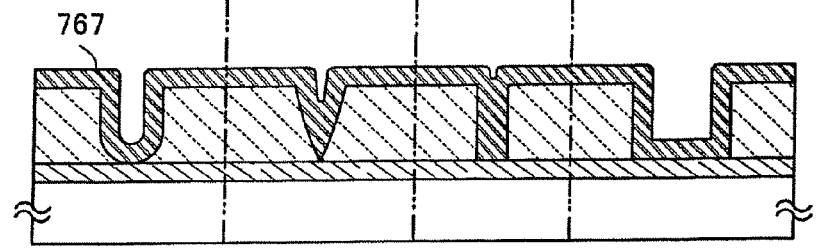

FIGS. 30A and 30D exemplarily illustrate masks with other shapes. Referring to FIG. 30A, masks 763a to 763d having different cross-sectional shapes are provided in contact with a conductive layer 761 formed over a substrate 760. The mask 763a has a dome shape whose projecting end is roundish, and the mask 763b has a needle shape whose end has a sharp point. Although both the masks 763c and 763d have columnar shapes, they have different sizes: the mask 763c is thinner than the mask 763d.

An insulating film 762 is formed with the masks 763a to 763d provided on the conductive layer 761 (FIG. 30B). The insulating film 762 is deposited in regions above the conductive layer 761 excluding the masks 763a to 763d.

Next, the masks 763a to 763d are removed, whereby an insulating layer 766 having openings 765a to 765d can be formed (see FIG. 30C). Then, by forming a conductive film 767 in the openings 765a to 765d where the conductive 761 is exposed, the conductive layer 761 and the conductive film 767 can be electrically connected in the openings 765a to 765d (see FIG. 30D). The shapes of the openings 765a to 765d reflect the shapes of the masks 763a to 763d, respectively. The opening 765a has a shape which is roundish toward the bottom of the opening. The opening 765b has a needle shape whose end has a sharp point such that the diameter of the opening becomes narrow toward the bottom of the opening. The openings 765c and 765d have different sizes and the opening 765c is smaller than the opening 765d. In this manner, an insulating layer having a plurality of opening with different shapes can be easily fabricated by one step. Accordingly, a plurality of shapes of openings can be selected and, therefore, design flexibility of wirings and the like of a display device or a semiconductor device can be improved.

The depth direction of the opening can be determined by the force generated upon providing the mask and by the film strength of the conductive layer that is provided with the mask. When a needle-shaped mask having a sharp end is provided in such a manner that a part of the sharp end sticks into the conductive layer, an opening with a recessed portion can be formed in the conductive layer. An example of providing a mask in such a manner that a part of the mask sticks into the surface of the conductive layer will be described, with reference to FIGS. 14A to 14D.

Figure 14A:
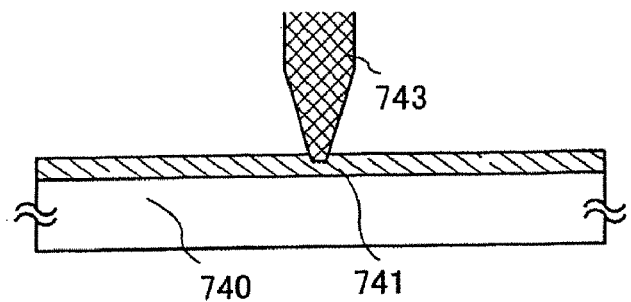
FIGS. 14A to 14D are schematic views illustrating the invention.
Figure 14B:
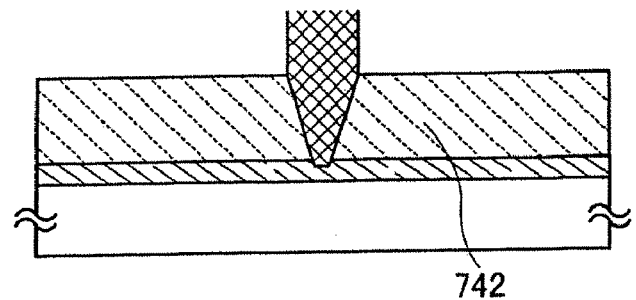

FIGS. 14A to 14D illustrate an example of using a mask that has an elongated conical end. Referring to FIG. 14A, a conductive layer 741 is formed over a substrate 740, and a mask 743 is provided to be in contact with and to partly stick into the conductive layer 741. The mask 743 has a tapered portion whose cross section becomes narrow toward the conductive layer. An insulating film 742 is formed with the mask 743 partly sticking into the conductive layer 741 (see FIG. 14B). The insulating film 742 is deposited over a region of the conductive layer 741 excluding the mask 743.

Figure 14C:
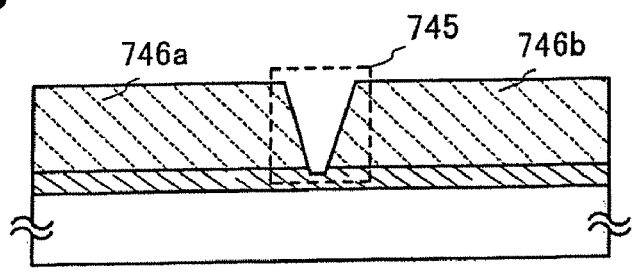
Figure 14D:
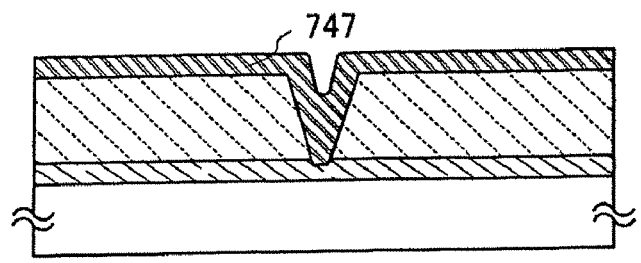

Next, the mask 743 is removed, whereby insulating layers 746a and 746b having an opening 745 can be formed (see FIG. 14C). The opening 745 is also formed in a part of the conductive layer 741. Referring to the cross-sectional view of FIG. 14C, the opening 745 is provided between the insulating layers 746a and 746b. Then, a conductive film 747 is formed in the opening 745 where the conductive layer 741 is exposed, whereby the conductive layer 741 and the conductive film 747 can be electrically connected (see FIG. 14D). The opening 745 reflects the shape of the mask 743, and opposite side surfaces of the opening are tapered. When the mask is provided to partly stick into the conductive layer (so as to form a recessed portion in the surface of the conductive layer) as shown in FIGS. 14A to 14D, the area of the conductive layer exposed at the opening is increased. Thus, a contact area between the conductive layer and the conductive film formed in the opening is increased, providing advantages in that resistance can be lowered and electrical contact can be easily obtained.

The conductive layer 701 can be formed by an evaporation method, a PVD (Physical Vapor Deposition) method such as a sputtering method, a CVD (Chemical Vapor Deposition) method such as a low-pressure CVD (LPCVD) method or a plasma CVD method, or the like. Further, it is also possible to use a method by which a desired pattern can be formed by transferring or drawing a composition. For example, various printing methods (e.g., pattern formation methods such as screen printing (stencil printing), offset printing (planographic printing), relief printing, or gravure printing (intaglio printing)), a dispending method, a selective coating method, and the like can be used.

Each of the conductive layer 701 and the conductive film 707 can be formed using an element selected from among chromium, molybdenum, nickel, titanium, cobalt, copper, tungsten, aluminum, silver, gold, platinum, lead, iridium, rhodium, and tantalum, or an alloy material or a compound material containing such an element as a main component. Alternatively, it is also possible to use a semiconductor film typified by a polycrystalline silicon film doped with an impurity element such as phosphorus or an alloy of silver, lead, or copper. Further, either a single-layer structure or a stacked-layer structure may be employed. For example, a two-layer structure may be formed by sequentially depositing a tungsten nitride film and a molybdenum film or a three-layer structure may also be formed by sequentially depositing a tungsten film with a thickness of 50 nm, an aluminum-silicon alloy film with a thickness of 500 nm, and a titanium nitride film with a thickness of 30 nm. When the three-layer structure is employed, the tungsten film of the first conductive film may be replaced with a tungsten nitride film, the aluminum-silicon alloy film of the second conductive film may be replaced with an aluminum-titanium alloy film, and the titanium nitride film of the third conductive film may be replaced with a titanium film.

The conductive layer 701 and the conductive film 707 can also be formed using the following conductive materials: indium tin oxide (ITO), ITO containing silicon oxide (ITSO), zinc oxide (ZnO), zinc oxide doped with gallium (Ga), and indium zinc oxide (IZO). Alternatively, when a semiconductor layer is formed instead of the conductive layer, a semiconductor material may be used. For example, the following inorganic semiconductor materials can be used: silicon, germanium, silicon germanium, gallium arsenide, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, strontium titanate, and the like.

The insulating layer having the opening can be formed using a material selected from among silicon oxide, silicon nitride, silicon oxynitride, aluminum oxide, aluminum nitride, aluminum oxynitride, diamond-like carbon (DLC), carbon containing nitrogen, polysilazane, and other inorganic insulating materials. Further, a material containing siloxane can also be used.

When the insulating layer is formed so as to have a plurality of openings, a mask having a plurality of projecting portions on a supporting substrate can be used. An example of using a mask with which a plurality of openings can be formed will be described, with reference to FIGS. 34A to 34C.

Figure 34A:
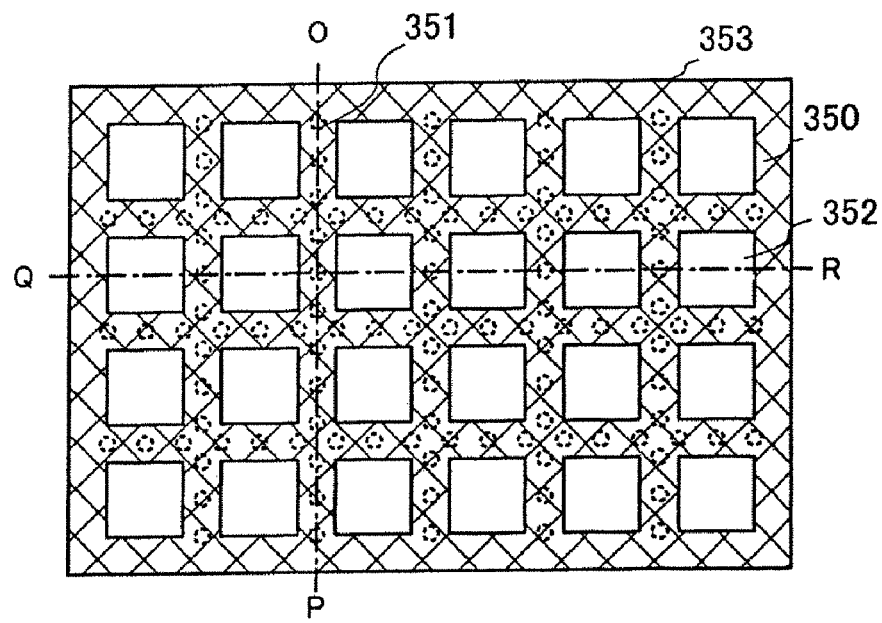
FIGS. 34A to 34C illustrate masks that can be applied to the invention.
Figure 34B:
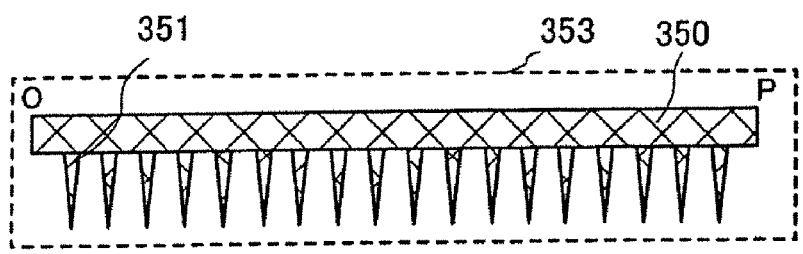
Figure 34C:
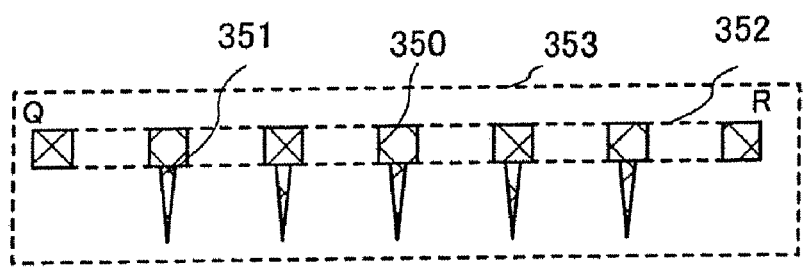

FIG. 34A is a plan view of a mask seen from the side of a supporting substrate. FIG. 34B is a cross-sectional view taken along line O-P of FIG. 34A, and FIG. 34C is a cross-sectional view taken along line Q-R of FIG. 34A.

In FIG. 34A, a mask 353 has a supporting substrate 350 and projecting portions 351. The plurality of projecting portions 351 are provided on the supporting substrate 350, which is a supporting means, at corresponding positions of opening formation regions. The mask 353 may be provided opposite a substrate over which an insulating layer is to be formed such that the projecting portions 351 are in contact with the substrate. The mask shown in FIGS. 34A to 34C has a structure in which the supporting substrate 350 has a plurality of openings 352. Although the supporting substrate is not necessarily required to have openings, the provision of the openings can yield an advantageous effect in that a reactive gas used for the CVD method or the like can easily travel through the openings 352 to reach the substrate.

The projecting portions of the mask may be designed based on data of a circuit design pattern so that an insulating layer can be formed to have openings at predetermined positions. In addition, the positional relationship between the mask and the substrate over which an insulating layer is to be formed may be adjusted by forming alignment markers on the mask and the substrate in advance. The alignment can be performed either before or after the mask and the substrate to be processed are placed in a deposition chamber.

After the formation of the insulating layer having openings, the mask may be physically removed or chemically removed by use of etching (dry etching or wet etching) under the condition of high etching selectivity with respect to the insulating layer having the openings. When there is weak adhesion strength between the insulating layer and the conductive layer, the mask is preferably removed by etching. Meanwhile, when the mask is removed from the insulating layer by a physical method without deformation of its original shape, the removing process can be simple and the mask can be repeatedly reused, which is advantageous in that cost can be reduced.

The mask can be formed by the steps of depositing a thin film by a vacuum evaporation method, a PVD (Physical Vapor Deposition) method such as a sputtering method, or a CVD (Chemical Vapor Deposition) method such as a low-pressure CVD (LPCVD) method or a plasma CVD method, and etching the thin film into a desired shape. It is also possible to use a droplet discharge method by which patterns can be selectively formed, a printing method by which patterns can be transferred or drawn (e.g., a pattern formation method such as screen printing or offset printing), a coating method such as a spin coating method, a dipping method, a dispensing method, and the like. Further, it is also possible to use an imprinting technique such as a nanoimprinting technique by which three-dimensional patterns with a size on the order of nanometers can be formed. Imprinting and nanoimprinting are techniques by which three-dimensional patterns with a small feature size can be formed without the use of a photolithography process.

The mask can be formed using an inorganic material, an organic material, or a material having a skeletal structure with the bond of silicon and oxygen. Since the mask has a function of blocking the deposition of an insulating film, it may also be formed using a conductive material such as metal or an insulating material such as resin. Further, fiber and the like can also be used. Considering that the mask is placed in a chamber, the mask is preferably formed from a material which is relatively lightweight and is easy to be processed. In the case of forming openings with a small size, nanotube materials such as a carbon nanotube can also be used. Superfine carbon fibers like a carbon nanotube include graphite nanofibers, carbon nanofibers, tubular graphite, carbon nanocones, conical graphite, and the like.

The mask can be formed using a material selected from among silicon oxide, silicon nitride, silicon oxynitride, aluminum oxide, aluminum nitride, aluminum oxynitride, diamond-like carbon (DLC), carbon containing nitrogen, polysilazane, and other inorganic insulating materials. Alternatively, a material containing siloxane can also be used. As a further alternative, the following materials can also be used: organic materials such as an epoxy resin, a phenol resin, a novolac resin, an acrylic resin, a melamine resin, a urethane resin, benzocyclobutene, parylene, fluorinated arylene ether, and polyimide.

After the formation of the openings, a conductive material or an insulating material which remains in the vicinity of the openings (residues produced upon removing the conductive layer or the insulating layer) may be washed away with liquid so that the residues can be removed. In that case, either a nonreactive substance such as water or a chemical solution that reacts with (dissolves) the insulating layer such as etchant can be used for washing. When etchant is used, the conductive layer below the opening is over-etched, whereby dust and the like are removed and the surface can be planarized. Further, the size of the openings can be increased.

In this manner, an opening (a contact hole) for enabling electrical connection between the conductive layer and the conductive film can be formed in the insulating layer without forming a resist mask layer by a complicated photolithography process.

Thus, fabricating a display device using the invention can simplify a process, whereby waste of materials can be reduced and cost reduction can be achieved. Therefore, a display device can be fabricated with high yield.

(Embodiment Mode 2)

This embodiment mode will describe a method of forming a plurality of contact holes with high reliability at low cost through a simplified process, with reference to FIGS. 4A to 4H.

In the case of electrically connecting thin films (e.g., a conductive layer and a semiconductor layer) that are stacked with an insulating layer sandwiched therebetween, an opening (so-called contact hole) is formed in the insulating layer. In this case, the insulating layer is selectively formed so as to have an opening without using an etching step. Specifically, a mask is provided in a region where an opening is to be formed, and an insulating layer is formed in a region excluding the mask. After the formation of the insulating layer, the mask is removed physically or chemically, so that an insulating layer having an opening in the region where the mask has been provided is formed. Thus, an insulating layer having an opening is formed over a conductive layer in such a manner that a part of the conductive layer below the insulating layer is exposed at the bottom of the opening. Then, another conductive film is formed in the opening so as to be in contact with the exposed conductive layer, whereby the conductive layer and the conductive film are electrically connected at the opening provided in the insulating layer.

The shape of the opening reflects the shape of the mask. Therefore, any mask with which an opening with a desired shape can be formed is acceptable. The mask can have a columnar shape (e.g., a prism, a cylinder, or a triangular prism), a needle shape, or the like. In addition, the depth direction of the opening can be determined by the force generated upon providing the mask and by the film strength of the conductive layer that is provided with the mask. When a needle-shaped mask having a sharp end is provided in such a manner that a part of the sharp end sticks into the conductive layer, an opening with a recessed portion can be formed in the conductive layer. Further, after the formation of the opening, the conductive layer exposed at the bottom of the opening may be removed by etching, using the insulating layer having the opening as a mask.

The insulating layer can be formed by an evaporation method, a PVD (Physical Vapor Deposition) method such as a sputtering method, a CVD (Chemical Vapor Deposition) method such as a low-pressure CVD (LPCVD) method or a plasma CVD method, or the like. In the invention, a region above the conductive layer where the opening is to be formed is physically blocked with a mask so that the material for forming the insulating layer does not adhere to the conductive layer. Thus, a non-formation region of the insulating layer can be determined physically and, therefore, an insulating layer having an opening can be formed with high accuracy. Thus, using the invention can fabricate a highly reliable semiconductor device and display device with high yield.

According to the invention, an insulating layer having an opening can be selectively formed without using a photolithography process. Therefore, the number of steps and materials can be reduced.

Specific description will be given below with reference to FIGS. 4A to 4H. FIGS. 4B, 4D, 4F, and 4H are plan views of conductive layers, and FIGS. 4A, 4C, 4E, and 4G are cross-sectional views taken along lines L-M of FIGS. 4B, 4D, 4F, and 4H, respectively.

Figure 4A:
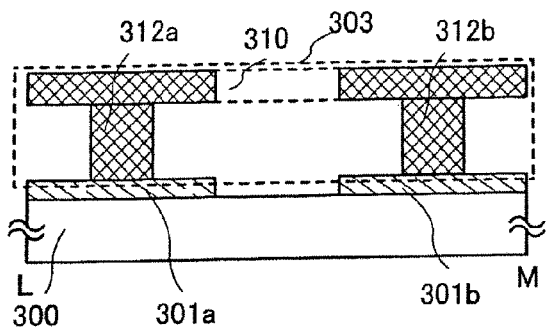
FIGS. 4A to 4H are schematic views illustrating the invention.
Figure 4B:
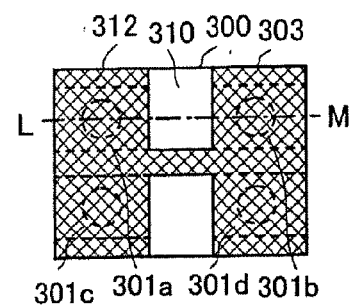

As shown in FIGS. 4A to 4H, conductive layers 301a to 301d are formed over a substrate 300. In this embodiment mode, as shown in FIGS. 4A and 4B, the conductive layers 301a to 301d are formed over the substrate 300 having an insulating surface, and a mask 303 having projecting portions 312 (312a and 312b) and an opening 310 is provided so that the projection portions 312 (312a and 312b) are positioned above regions of the conductive layers 301a to 301d where openings are to be formed. The mask 303 may be provided on the conductive layers by utilizing the gravity or adhesion of the mask. When the mask has weak adhesion or attachment to the conductive layers, it may be provided on a supporting substrate so that the mask is supported to be in contact with the conductive layers.

Figure 4C:
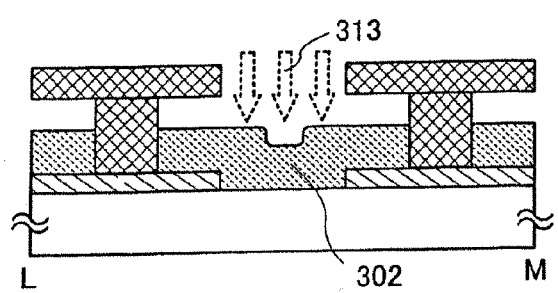
Figure 4D:
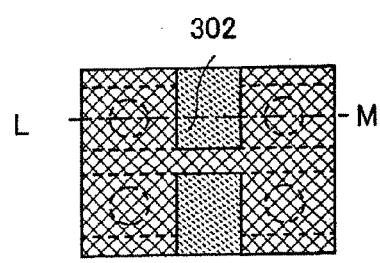

An insulating film 302 is deposited over the conductive layers 301a to 301d with the mask 303 selectively provided on the conductive layers 301a to 301d (see FIGS. 4C and 4D). The insulating film 302 is deposited over regions of the conductive layers 301a to 301d excluding the mask 303.

Figure 4E:
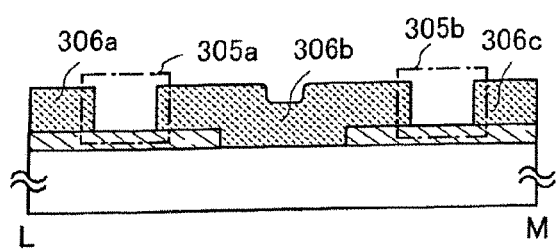
Figure 4F:
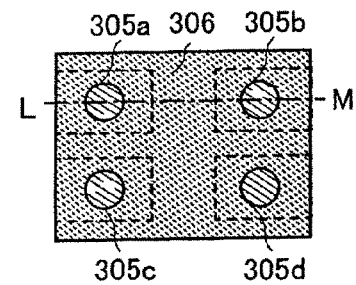
Figure 4G:
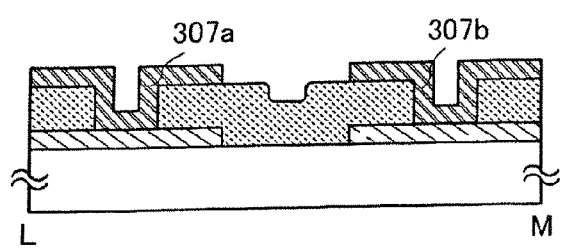
Figure 4H:
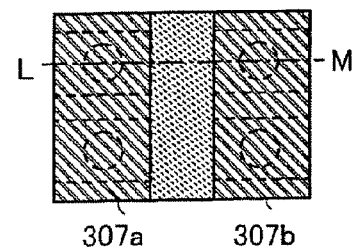

Next, the mask 303 is removed, whereby insulating layers 306 (306a to 306c) having openings 305a to 305d can be formed (see FIGS. 4E and 4F). The mask 303 has the plurality of projecting portions 312 (312a and 312b) on a supporting substrate at corresponding positions of the opening formation regions. The mask 303 shown in FIGS. 4A to 4H has a structure that the supporting substrate has a plurality openings 310. Although the supporting substrate is not necessarily required to have the openings, the provision of the openings can yield an advantageous effect in that a reactive gas 313 used for the CVD method can easily travel through the openings 310 to reach the substrate.

Referring to the cross-sectional views of FIGS. 4E and 4F, the opening 305a is provided between the insulating layers 306a and 306b, and the opening 305b is provided between the insulating layers 306b and 306c. Then, a conductive film 307a is formed in the opening 305a where the conductive layer 301a is exposed, whereby the conducive layer 301a and the conductive film 307a can be electrically connected. Similarly, a conductive film 307b is formed in the opening 305b where the conductive layer 301b is exposed, whereby the conductive layer 301b and the conductive film 307b can be electrically connected (see FIGS. 4G and 4H).

The insulating film 302 can be formed by an evaporation method, a PVD (Physical Vapor Deposition) method such as a sputtering method, a CVD (Chemical Vapor Deposition) method such as a low-pressure CVD (LPCVD) method or a plasma CVD method, or the like. In particular, the plasma CVD method whose reaction pressure is 1 Pa to several hundred Pa which is higher than the reaction pressure of a physical deposition method by two digits or more is preferably used because it has a short mean free path of particles and particles can smoothly get around obstructions. Therefore, the insulating film can be deposited so as to fully cover the underlying layer except for the region blocked by the mask. In particular, when a plurality of openings are to be provided in close positions, a plurality of masks should also be provided in close positions. Therefore, when the plasma CVD method by which particles can smoothly get around obstructions is used, an insulating film with an excellent shape can be formed so as to fully cover the underlying layer excluding the region of the mask provided for formation of the openings. The resultant insulating layer having openings can be a film that has openings at accurate and desired places and is free from damage, defects, or the like.

The insulating layer having the openings (the deposited insulating film) can be formed using a material selected from among silicon oxide, silicon nitride, silicon oxynitride, aluminum oxide, aluminum nitride, aluminum oxynitride, diamond-like carbon (DLC), carbon containing nitrogen, polysilazane, and other inorganic insulating materials. Further, a material containing siloxane can also be used.

The shapes of the openings reflect the shape of the mask. Therefore, any mask with which openings with desired shapes can be formed is acceptable. The mask can have a columnar shape (e.g., a prism, a cylinder, or a triangular prism), a needle shape, or the like. Further, after the formation of the openings, the conductive layers exposed at the bottom of the openings may be removed by etching, using the insulating layer having the openings as a mask.

The projecting portions of the mask may be designed based on data of a circuit design pattern so that an insulating layer can be formed to have openings at predetermined positions. In addition, the positional relationship between the mask and the substrate over which an insulating layer is to be formed may be adjusted by forming alignment markers on the mask and the substrate in advance. Such alignment can be performed either before or after the mask and the substrate to be processed are placed in a deposition chamber.

After the formation of the insulating layer having openings, the mask may be physically removed or chemically removed by use of etching (dry etching or wet etching) under the condition of high etching selectivity with respect to the insulating layer having the openings. When there is weak adhesion strength between the insulating layer and the conductive layers, the mask is preferably removed by etching. Meanwhile, when the mask is removed from the insulating layer by a physical method without deformation of its original shape, the removing process can be simple and the mask can be repeatedly reused, which is advantageous in that cost can be reduced.

The mask can be formed by the steps of depositing a thin film by a vacuum evaporation method, a PVD (Physical Vapor Deposition) method such as a sputtering method, or a CVD (Chemical Vapor Deposition) method such as a low-pressure CVD (LPCVD) method or a plasma CVD method, and etching the thin film into a desired shape. It is also possible to use a droplet discharge method by which patterns can be selectively formed, a printing method by which patterns can be transferred or drawn (e.g., a pattern formation method such as screen printing or offset printing), a coating method such as a spin coating method, a dipping method, a dispensing method, and the like. Further, it is also possible to use an imprinting technique such as a nanoimprinting technique by which three-dimensional patterns with a size on the order of nanometers can be formed. Imprinting and nanoimprinting are techniques by which three-dimensional patterns with a small feature size can be formed without the use of a photolithography process.

The mask can be formed using an inorganic material, an organic material, or a material having a skeletal structure with the bond of silicon and oxygen. Since the mask has a function of blocking the deposition of an insulating film, it may also be formed using a conductive material such as metal or an insulating material such as resin. Further, fiber and the like can also be used. Considering that the mask is placed in a chamber, the mask is preferably formed from a material which is relatively lightweight and is easy to be processed. In the case of forming openings with a small size, nanotube materials such as a carbon nanotube can also be used. Superfine carbon fibers like a carbon nanotube include graphite nanofibers, carbon nanofibers, tubular graphite, carbon nanocones, conical graphite, and the like.

The mask can be formed using a material selected from among silicon oxide, silicon nitride, silicon oxynitride, aluminum oxide, aluminum nitride, aluminum oxynitride, diamond-like carbon (DLC), carbon containing nitrogen, polysilazane, and other inorganic insulating materials. Alternatively, a material containing siloxane can also be used. As a further alternative, the following materials can also be used: organic materials such as an epoxy resin, a phenol resin, a novolac resin, an acrylic resin, a melamine resin, a urethane resin, benzocyclobutene, parylene, fluorinated arylene ether, and polyimide.

After the formation of the openings, a conductive material or an insulating material which remains in the vicinity of the openings (residues produced upon removing the conductive layers or the insulating layer) may be washed away with liquid so that the residues can be removed. In that case, either a nonreactive substance such as water or a chemical solution that reacts with (dissolves) the insulating layer such as etchant can be used for washing. When etchant is used, the conductive layers below the openings are over-etched, whereby dust and the like are removed and the surface can be planarized. Further, the size of the openings can be increased.

In this manner, openings (contact holes) for enabling electrical connection between the conductive layers and the conductive films can be formed in the insulating layer without forming a resist mask layer by a complicated photolithography process.

Thus, fabricating a display device using the invention can simplify a process, whereby waste of materials can be reduced and cost reduction can be achieved. Therefore, a display device can be fabricated with high yield.

(Embodiment Mode 3)

Figure 3A:
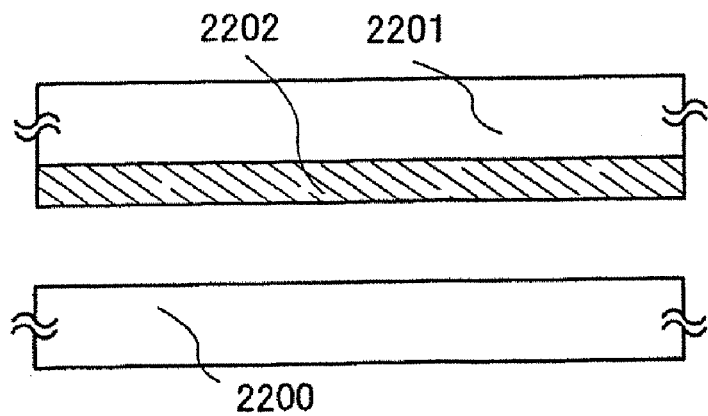
FIGS. 3A to 3C are schematic views illustrating the invention.
Figure 3B:
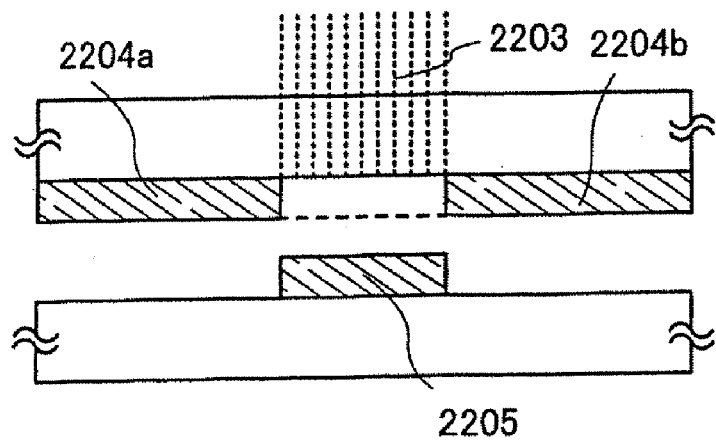
Figure 3C:
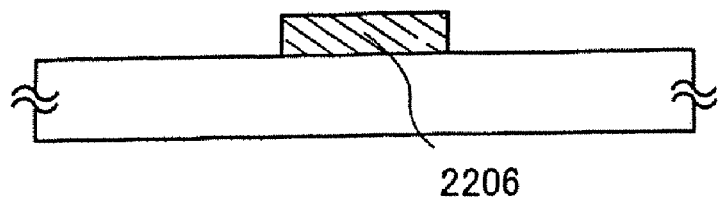

This embodiment mode will describe a method of forming a highly reliable display device at low cost through a simplified process, with reference to FIGS. 3A to 3C.

In this embodiment mode, structures (also referred to as patterns) such as a conductive layer and a semiconductor layer are selectively formed into desired shapes without using a photolithography process. In the invention, structures (also referred to as patterns) include all of component elements of a thin film transistor or a display device that are formed to have predetermined shapes such as conductive layers (e.g., wiring layers, gate electrode layers, source electrode layers, or drain electrode layers), semiconductor layers, mask layers, insulating layers, and the like.

In this embodiment mode, a light-absorbing film such as a conductive film or a semiconductor film is formed on a first substrate having a light-transmitting property, and then the light-absorbing film is irradiated with laser light from the side of the first substrate, so that a region of the light-absorbing film irradiated with the laser light is transferred to a second substrate. As a result, a conductive layer or a semiconductor layer which is a light-absorbing layer having a desired shape (pattern) is formed on the second substrate. In this specification, a substrate on which a conductive film or a semiconductor film which is a light-absorbing film is formed in the first step, which is followed by laser irradiation is referred to as a first substrate. Meanwhile, a substrate on which a conductive layer or a semiconductor layer which is a light-absorbing layer is selectively formed finally is referred to as a second substrate. Since a desired pattern can be selectively formed without using a photolithography process, it is possible to realize a simplified process, cost reduction, and the like.

A method of forming a thin film shown in this embodiment mode will be specifically described with reference to FIGS. 3A to 3C. Referring to FIG. 3A, a light-absorbing film 2202 is formed on a first substrate 2201. The first substrate 2201 and a second substrate 2200 are positioned to be opposite each other such that the light-absorbing film 2202 faces the inner side.

The light-absorbing film 2202 is selectively irradiated with laser light 2203 through the substrate 2201 from the side of the substrate 2201. The light-absorbing film 2202 irradiated with the laser light 2203 absorbs the laser light 2203. Then, a part of the light-absorbing film 2202 is transferred to the second substrate 2200 by energy such as heat of the laser light 2203, becoming a light-absorbing layer 2205. On the other hand, the other part of the light-absorbing film 2202 not irradiated with the laser light 2203 remains on the first substrate 2201 as light-absorbing films 2204a and 2204b. In this manner, in the process of patterning a thin film into a desired shape (to be a light-absorbing layer 2206), a structure (also referred to as a pattern) such as a conductive layer or a semiconductor layer is selectively formed into a desired shape without using a photolithography process.

After the pattern is transferred by laser light, thermal treatment or laser irradiation may be applied to the light-absorbing layer.

A light-absorbing material is used for the light-absorbing film 2202 that is an object to be transferred is formed. Meanwhile, a light-transmissive substrate is used for the first substrate 2201. With the invention, an object to be transferred can freely be transferred to various kinds of substrates; therefore, a wide range of materials can be selected for the substrate. Further, a since substrate can be formed using an inexpensive material, a display device having various functions can be formed according to intended use, and also a low-cost display device can be fabricated.

The method of forming a thin film in this embodiment mode can be used for formation of components of a thin film transistor or a display device such as conductive layers (e.g., wiring layers, gate electrode layers, source electrode layers, or drain electrode layers), semiconductor layers, mask layers, insulating layers, and the like. It is acceptable as long as a film made of a desired material is used as a light-absorbing film, light that can be absorbed into the film is selected, and the film is irradiated with the light.

For example, a conductive material can be used for the light-absorbing film. For example, one or more of chromium, tantalum, silver, molybdenum, nickel, titanium, cobalt, copper, and aluminum can be used. It is also possible to use the following conductive materials: indium tin oxide (ITO), ITO containing silicon oxide (ITSO), zinc oxide (ZnO), zinc oxide doped with gallium (Ga), and indium zinc oxide (IZO). Alternatively, a semiconductor material can also be used for the light-absorbing film. For example, the following inorganic semiconductor materials can be used: silicon, germanium, silicon germanium, gallium arsenide, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, strontium titanate, and the like. Further, the light-absorbing film may be doped with hydrogen or an inert gas (e.g., helium (He), argon (Ar), krypton (Kr), neon (Ne), or xenon (Xe)).

According to the invention, components of a display device such as wirings can be formed into desired shapes. Further, since a display device can be fabricated by a simplified process with a reduced number of complicated photolithography steps, waste of materials can be reduced and cost reduction can be achieved. Therefore, a display device with high performance and high reliability can be fabricated with high yield.

(Embodiment Mode 4)

This embodiment mode will be described with reference to FIGS. 8A to 13B. More specifically, a method of fabricating a display device which employs the invention and includes inversely staggered thin film transistors will be described. FIGS. 8A, 9A, 10A, 11A, and 12A are plan views of a pixel portion of a display device; FIGS. 8B, 9B, 10B, 11B, and 12B are cross-sectional views taken along lines A-C of FIGS. 8A, 9A, 10A, 11A, and 12A, respectively; and FIGS. 8C, 9C, 10C, 11C, and 12C are cross-sectional views taken along lines B-D of FIGS. 8A, 9A, 10A, 11A, and 12A, respectively. FIGS. 13A and 13B are also cross-sectional views of a display device.

A substrate 100 is formed using a glass substrate made of barium borosilicate glass, alumina borosilicate glass, or the like, a quartz substrate, a metal substrate, or a plastic substrate which can withstand the treatment temperature of this embodiment mode. In addition, the surface of the substrate 100 may be polished by a CMP (Chemical Mechanical Polishing) method so as to be planarized. Note that an insulating layer may also be formed over the substrate 100. Such an insulating layer is formed by depositing a silicon oxide material or a silicon nitride material to have either a single-layer structure or a stacked-layer structure by various methods such as a CVD method, a plasma CVD method, a sputtering method, and a spin coating method. The insulating layer is not necessarily provided, but when provided, it has an effect of blocking contaminants from the substrate 100.

Gate electrode layers 103 and 104 (104a and 104b) are formed over the substrate 100. The gate electrode layers 103 and 104 (104a and 104b) may be formed using an element selected from among silver, gold, nickel, platinum, lead, iridium, rhodium, tantalum, tungsten, titanium, molybdenum, aluminum, and copper, or an alloy material or a compound material containing such an element as a main component. Alternatively, it is also possible to use a semiconductor film typified by a polycrystalline silicon film doped with an impurity element such as phosphorus or an alloy of silver, lead, or copper. Further, either a single-layer structure or a stacked-layer structure may be employed. For example, a two-layer structure may be formed by sequentially depositing a tungsten nitride film and a molybdenum film or a three-layer structure may also be formed by sequentially depositing a tungsten film with a thickness of 50 nm, an aluminum-silicon alloy film with a thickness of 500 nm, and a titanium nitride film with a thickness of 30 nm. When the three-layer structure is employed, the tungsten film of the first conductive film may be replaced with a tungsten nitride film, the aluminum-silicon alloy film of the second conductive film may be replaced with an aluminum-titanium alloy film, and the titanium nitride film of the third conductive film may be replaced with a titanium film.

The gate electrode layers 103, 104a, and 104b can each be formed by depositing a conductive film by a PVD (Physical Vapor Deposition) method such as a sputtering method, a CVD (Chemical Vapor Deposition) method such as a low-pressure CVD (LPCVD) method or a plasma CVD method, or the like, and patterning the conductive film using a mask layer. It is also possible to use a method by which desired patterns can be transferred or drawn. For example, various printing methods (e.g., pattern formation methods such as screen printing (stencil printing), offset printing (planographic printing), relief printing, or gravure printing (intaglio printing)), a droplet discharge method, a dispensing method, and a selective coating method.

The patterning of the conductive film may be performed by dry etching or wet etching. For example, an ICP (Inductively Coupled Plasma) etching method may be used in conjunction with appropriate control of the etching conditions (e.g., the amount of electric power applied to a coiled electrode, the amount of electric power applied to an electrode on the substrate side, and the electrode temperature on the substrate side), whereby the electrode layers can be etched into tapered shapes. Note that an etching gas can be selected as appropriate from among a chlorine source gas typified by $Cl_2$, $BCl_3$, $SiCl_4$, or $CCl_4$; a fluorine source gas typified by $CF_4$, $SF_6$, or $NF_3$; and $O_2$.

Alternatively, the gate electrode layers can each be formed by the steps of depositing a light-absorbing conductive film on a first substrate and irradiating the light-absorbing conductive film with laser light, so that desired patterns can be selectively transferred to a second substrate. After the pattern is transferred by laser light, thermal treatment or laser irradiation may be applied to the light-absorbing layer.

The light-absorbing film that is an object to be transferred is formed using a light-absorbing material. Meanwhile, the first substrate is formed using a light-transmissive substrate. With the invention, an object to be transferred can freely be transferred to various kinds of substrates; therefore, a wide range of materials can be selected for the substrate. Further, since an inexpensive material can be selected as a substrate, a display device having various functions can be formed according to intended use, and also a low-cost display device can be fabricated.

Figure 8A:
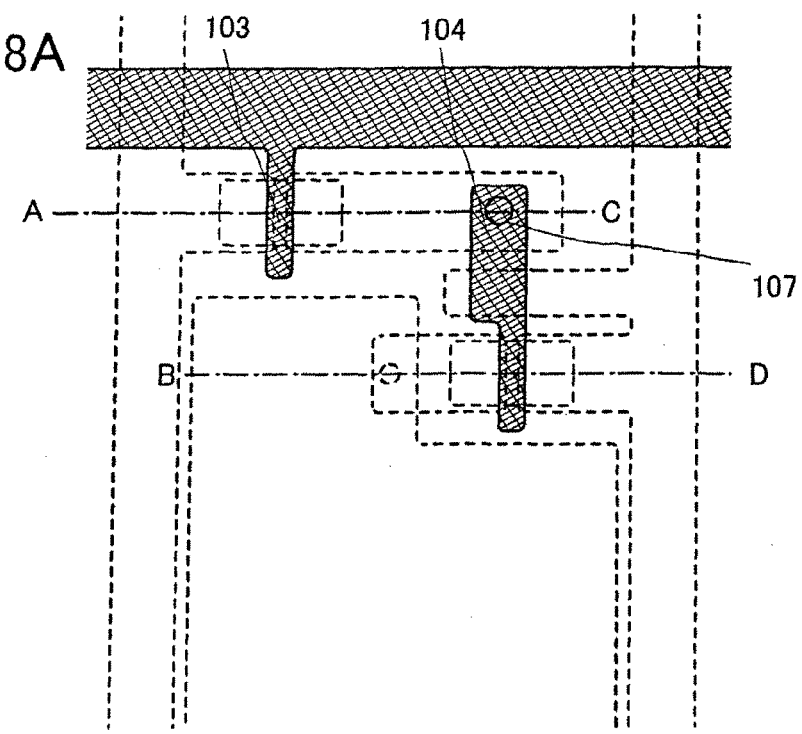
FIGS. 8A to 8C illustrate a method of fabricating a display device of the invention.
Figure 8B:
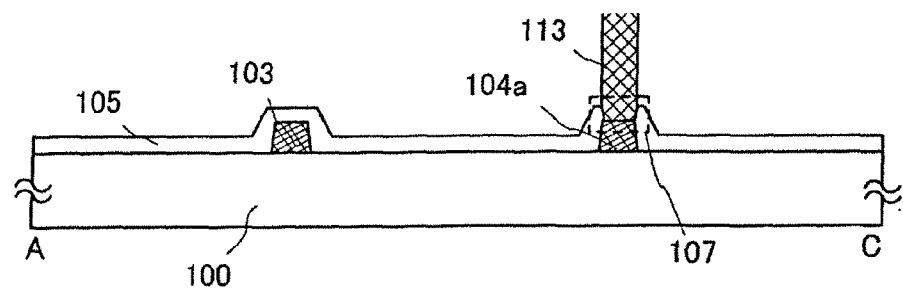
Figure 8C:
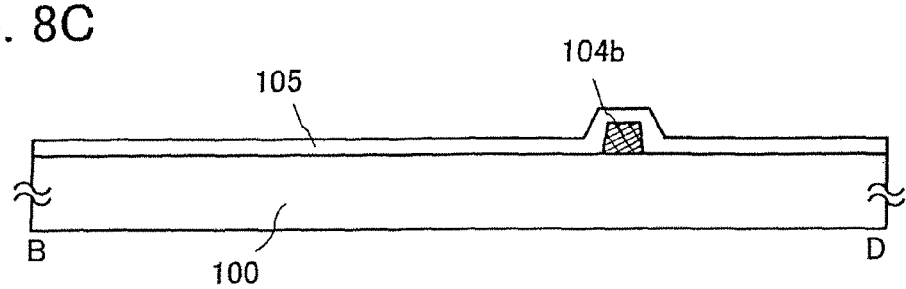

Next, a gate insulating layer 105 is formed over the gate electrode layers 103 and 104 (104a and 104b) (see FIGS. 8A to 8C). The gate insulating layer 105 can be formed using a material such as a silicon oxide material or a silicon nitride material. Further, either a single-layer structure or a stacked-layer structure may be employed. In this embodiment mode, a two-layer structure consisting of a silicon nitride film and a silicon oxide film is formed. Alternatively, a single-layer structure of such film, a single-layer structure of a silicon oxynitride film, or a three-layer structure may also be employed. Preferably, a silicon nitride film having a dense film quality is used. Further, in the case where a conductive layer is formed by a droplet discharge method using silver, copper, or the like, it is preferable to form a silicon nitride film or a NiB film as a barrier film over the conductive layer, whereby diffusion of impurities can be prevented and the surface of the conductive layer can be planarized. Note that in order to form a dense insulating film with little gate leakage current at a low deposition temperature, it is preferable to mix a rare gas element such as argon into a reactive gas so that the rare gas element can be mixed into the insulating film to be formed.

In this embodiment mode, the gate insulating layer 105 is formed so as to have an opening 107 which exposes the gate electrode layer 104a as shown in Embodiment Modes 1 and 2. A mask 113 is provided above a region of the gate electrode layer 104a where the opening 107 is to be formed, and an insulating film is formed in a region excluding the mask 113. After the formation of the insulating film, the mask is removed physically or chemically, so that the insulating layer 105 has an opening in a region where the mask 113 has been provided. Accordingly, the gate insulating layer 105 having the opening 107 above the gate electrode layer 104a is formed, and the gate electrode layer 104a below the gate insulating layer 105 is exposed at the bottom of the opening 107.

The shape of the opening reflects the shape of the mask. Therefore, any mask with which an opening with a desired shape can be formed is acceptable. The mask can have a columnar shape (e.g., a prism, a cylinder, or a triangular prism), a needle shape, or the like. In addition, the depth direction of the opening can be determined by the force generated upon providing the mask and by the film strength of the conductive layer that is provided with the mask. When a needle-shaped mask having a sharp end is provided in such a manner that a part of the sharp end sticks into the conductive layer, an opening with a recessed portion can be formed in the conductive layer. Further, after the formation of the opening, the conductive layer exposed at the bottom of the opening may be removed by etching, using the insulating layer having the opening as a mask.

The insulating layer can be formed by an evaporation method, a PVD (Physical Vapor Deposition) method such as a sputtering method, a CVD (Chemical Vapor Deposition) method such as a low-pressure CVD (LPCVD) method or a plasma CVD method, or the like. In the invention, a region above the conductive layer where the opening is to be formed is physically blocked with a mask so that the material for forming the insulating layer does not adhere to the conductive layer. Thus, a non-formation region of the insulating layer can be determined physically and, therefore, an insulating layer having an opening can be formed with high accuracy. Thus, using the invention can fabricate a highly reliable semiconductor device and display device with high yield.

This embodiment mode illustrates an example of forming an insulating layer by a plasma CVD method. Using a plasma CVD method is preferable because it has a reaction pressure of 1 Pa to several hundred Pa which is higher than the reaction pressure of a physical deposition method by two digits or more, and has a short mean free path of particles and particles can smoothly get around obstructions. Therefore, the insulating film can be deposited so as to fully cover the underlying layer except for the region blocked by the mask. In particular, when a plurality of openings are to be provided in close positions, a plurality of masks should also be provided in close positions. Therefore, when the plasma CVD method by which particles can smoothly get around obstructions is used, an insulating film with an excellent shape can be formed so as to fully cover the underlying layer excluding the region of the mask provided for formation of the openings. The resultant insulating layer having an opening can be a film that has an opening at an accurate and desired place and is free from damage, defects, or the like.

Figure 35:
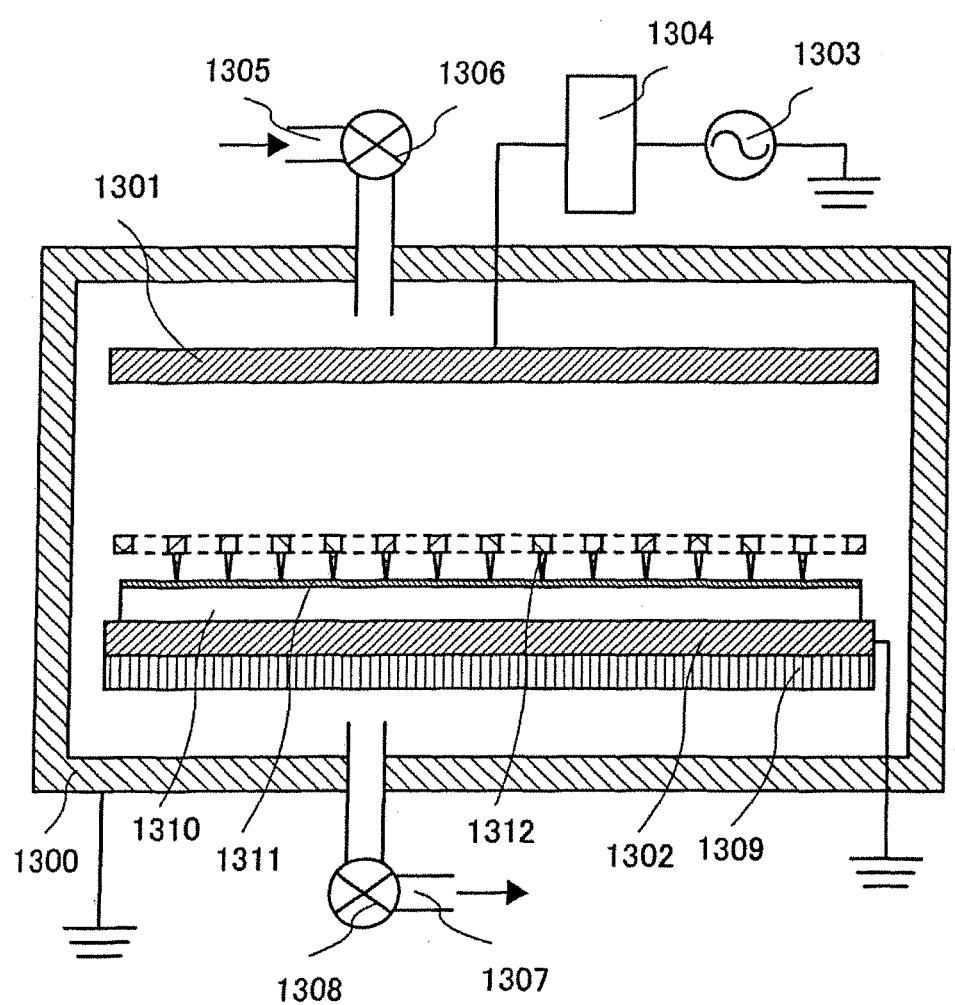
FIG. 35 illustrates a film deposition apparatus that can be applied to the invention.

FIG. 35 is a cross-sectional view of a chamber of a parallel-plate plasma CVD apparatus. In FIG. 35, a first electrode (an upper electrode, a shower electrode, or an RF electrode) 1301 connected to an RF power supply 1303 through a control circuit 1304 as well as a second electrode (a lower electrode or a ground electrode) 1302 that is grounded are provided in a chamber 1300 that is grounded. A substrate 1310 to be processed is placed on the second electrode 1302.

When RF power is supplied to first electrode 1301, plasma is discharged between the first electrode 1301 and the second electrode 1302, whereby reaction occurs and a film is deposited. A source gas is supplied from a supply pipe 1305. Although only one supply pipe is shown in FIG. 35, a plurality of gas supply pipes may be provided as needed.

In addition, the chamber 1300 is provided with an exhaust pipe 1307 so that an exhaust gas that has reacted is evacuated through the exhaust pipe 1307. Note that the electrode structure can also be a hollow structure (such that a plurality of shower plates overlap one another to disperse gas; a so-called shower head structure). In addition, the supply pipe 1305 and the exhaust pipe 1307 are provided with valves (1306 and 1308), respectively so that the pressure of the supplied gas and the pressure of the chamber can be controlled.

Although a heater 1309 is provided in contact with the second electrode 1302, the invention is not limited to this structure. In addition, another heater (not shown) may also be provided on the first electrode 1301. Further, a heater may be provided on the external wall of the chamber so that the chamber has a hot-wall structure.

A side surface of the chamber is provided with a window (not shown). By opening and closing the window, a substrate can be delivered to this chamber from a cassette chamber, using a transport mechanism such as a robot arm.

In the invention, when forming an insulating layer 1311 over the substrate 1310, a mask 1312 is placed above a region of the substrate 1310 where openings are to be formed, so that an insulating layer having openings is formed. As shown in FIG. 35, a source gas is supplied to the chamber with the mask 1312 placed above the substrate 1310, whereby the insulating layer 1311 is formed.

In this embodiment mode, the mask 1312 has a plurality of openings. A source gas that has reacted travels through the openings of the mask, thereby reaching the substrate 1310.

The projecting portions of the mask may be designed based on data of a circuit design pattern so that an insulating layer can be formed to have openings at predetermined positions. In addition, the positional relationship between the mask 1312 and the substrate 1310 over which an insulating layer is to be formed may be adjusted by forming alignment markers on the mask 1312 and the substrate 1310 in advance. The alignment of the mask 1312 with the substrate 1310 can be performed either before or after placing the mask 1312 and the substrate 1310 in the chamber.

According to the invention, an insulating layer having openings can be selectively formed without using a photolithography process. Therefore, the number of steps and materials can be reduced.

When using etching treatment, either plasma etching (dry etching) or wet etching may be used. However, plasma etching is more suitable for processing a large substrate. An etching gas can be selected from among a fluorine source gas such as $CF_4$ or $NF_3$ and a chlorine source gas such as $Cl_2$ or $BCl_3$. An inert gas such as He or Ar may also be added into the etching gas as appropriate. Further, when etching treatment is performed by atmospheric discharge plasma, local discharge processing is possible; therefore, there is no need to form a mask layer over the entire surface of the substrate.

Next, a semiconductor layer is formed. A semiconductor layer having one conductivity type may be formed as required. When an n-type semiconductor layer is formed, an n-channel TFT with an NMOS structure can be obtained; when a p-type semiconductor layer is formed, a p-channel TFT with a PMOS structure can be obtained. Further, it is also possible to form a CMOS structure having an n-channel TFT and a p-channel TFT. In addition, in order to impart a conductivity type to the semiconductor layer, the semiconductor layer may be doped with an element which imparts a conductivity type so that impurity regions are formed in the semiconductor layer, whereby and an n-channel TFT or a p-channel TFT can be formed. Instead of forming an n-type semiconductor layer, it is also possible to impart a conductivity type to the semiconductor layer by performing plasma treatment with a $PH_3$ gas.

A material for forming the semiconductor layer can be an amorphous semiconductor (hereinafter also referred to as "AS") formed by a sputtering method or a vacuum deposition method using a semiconductor material gas typified by silane or germane, a polycrystalline semiconductor formed by crystallizing the amorphous semiconductor by using optical energy or thermal energy, a semi-amorphous semiconductor (also referred to as microcrystal and hereinafter also referred to as "SAS"), or the like. The semiconductor layer can be deposited by various methods (e.g., a sputtering method, a LPCVD method, and a plasma CVD method).

SAS is a semiconductor having an intermediate structure between amorphous and crystalline (including single-crystalline and polycrystalline) structures and a third state which is stable in terms of free energy. Moreover, SAS includes a crystalline region with short-range order and lattice distortion. At least part of the film includes a crystalline region of 0.5 to 20 nm. When SAS contains silicon as a main component, Raman spectrum shifts to a wave number side lower than 520 cm$^{-1}$. Diffraction peaks of (111) and (220) which are thought to be derived from a silicon crystal lattice are observed by X-ray diffraction. At least 1 atomic % hydrogen or halogen is contained in SAS in order to terminate dangling bonds. SAS containing silicon as a main component is formed by glow discharge decomposition (plasma CVD) of a gas containing silicon. As the gas containing silicon, $SiH_4$, $Si_2H_6$, $SiH_2Cl_2$, $SiHCl_3$, $SiCl_4$, $SiF_4$, and the like can be used. Further, $F_2$ or $GeF_4$ may be mixed therein. The gas containing silicon may be diluted with $H_2$, or with $H_2$ and one of or rare gas elements selected from among He, Ar, Kr, and Ne.

The dilution ratio is in the range of 2 to 1000 times, pressure is in the range of 0.1 to 133 Pa, and power supply frequency is 1 to 120 MHz, preferably, 13 to 60 MHz. The substrate heating temperature is preferably lower than or equal to 300° C., and a substrate heating temperature of 100 to 200° C. is also possible. As impurity elements that are introduced during the film deposition, impurities which derive from atmospheric components such as oxygen, nitrogen, and carbon are preferably contained in the film at a concentration not higher than $1 \times 10^{20}$ cm$^{-3}$. In particular, the concentration of oxygen is preferably not higher than $5 \times 10^{19}$ cm$^{-3}$, more preferably, not higher than $1 \times 10^{19}$ cm$^{-3}$. In addition, when a rare gas element such as helium, argon, krypton, or neon is mixed into the film to promote lattice distortion, excellent SAS with increased stability can be obtained. Alternatively, a semiconductor layer can also be fabricated by sequentially stacking an SAS layer which is formed using a fluorine source gas and another SAS layer which is formed using a hydrogen source gas.

A typical example of an amorphous semiconductor is hydrogenated amorphous silicon, while a typical example of a crystalline semiconductor is polysilicon and the like. Examples of polysilicon (polycrystalline silicon) include so-called high-temperature polysilicon formed using polysilicon that is obtained by thermal treatment at a temperature of 800° C. or higher as a main material, so-called low-temperature polysilicon formed using polysilicon that is obtained by thermal treatment at a temperature of 600° C. or lower as a main material, and polysilicon crystallized by adding an element which promotes crystallization. Needless to say, as described above, it is also possible to use a semi-amorphous semiconductor or a semiconductor layer which partly includes a crystalline phase.

In the case of using a crystalline semiconductor layer for the semiconductor layer, it may be formed by various methods (e.g., a laser crystallization method, a thermal crystallization method, and a thermal crystallization method using an element which promotes crystallization such as nickel). Further, when a microcrystalline semiconductor that is SAS is crystallized by laser irradiation, crystallinity thereof can be enhanced. In the case where an element which promotes crystallization is not used, before an amorphous silicon film is irradiated with a laser light, the amorphous silicon film is heated at 500° C. for one hour in a nitrogen atmosphere so that the concentration of hydrogen contained in the amorphous silicon film becomes less than or equal to $1\times10^{20}$ atoms/cm$^3$. This is because, if the amorphous silicon film contains much hydrogen, the amorphous silicon film would be destroyed by laser irradiation.

As a method of introducing a metal element into an amorphous semiconductor layer, any method by which the metal element can be kept on the surface or inside of the amorphous semiconductor layer can be used. For example, a sputtering method, a CVD method, a plasma treatment method (including a plasma CVD method), an adsorption method, or a method of applying a metal-salt solution can be used. Among them, the method using a solution is simple and advantageous in that the concentration of the metal element can be easily controlled. Further, in order to improve the wettability of the surface of the amorphous semiconductor layer and spread an aqueous solution over the entire surface of the amorphous semiconductor layer, it is preferable to form an oxide film by UV irradiation under an oxygen atmosphere, a thermal oxidation method, treatment with ozone water containing a hydroxyl radical or with hydrogen peroxide, or the like.

The crystallization of the amorphous semiconductor layer may be performed by combination of thermal treatment and laser irradiation. Alternatively, one of thermal treatment and laser irradiation may be performed only once or a plurality of times.

Further, it is also possible to selectively form a crystalline semiconductor layer directly over a substrate by a plasma CVD method.

It is also possible to form a semiconductor by depositing an organic semiconductor material by a printing method, a dispensing method, a spray method, a spin coating method, a droplet discharge method, or the like. In that case, the etching step is not necessary and the number of steps can be reduced. As the organic semiconductor, a low-molecular material, a high-molecular material, or the like such as organic dye or a conductive high-molecular material can be used. As the organic semiconductor material used in the invention, a π-electron conjugated high-molecular material whose skeleton includes a conjugated double bond is preferably used. Typically, a soluble high-molecular material such as polythiophene, polyfluorene, poly(3-alkylthiophene), or polythiophene derivatives, or pentacene can be used.

Further, other organic semiconductor materials that can be used in the invention include a soluble precursor, which is to be deposited first and then processed into a semiconductor layer. Note that such organic semiconductor materials include polythienylenevinylene, poly(2,5-thienylenevinylene), polyacetyrene, polyacetyrene derivatives, polyallylenevinylene, and the like.

In converting the precursor into an organic semiconductor, not only thermal treatment buy also a reaction catalyst such as a hydrogen chloride gas is added. Typical solvents which can dissolve the above-described soluble organic semiconductor materials include toluene, xylene, chlorobenzene, dichlorobenzene, anisole, chloroform, dichloromethane, γ butyl lactone, butyl cellosolve, cyclohexane, NMP (N-methyl-2-pyrrolidone), cyclohexanone, 2-butanone, dioxane, dimethylformamide (DMF), THF (tetrahydrofuran), and the like.

Figure 9A:
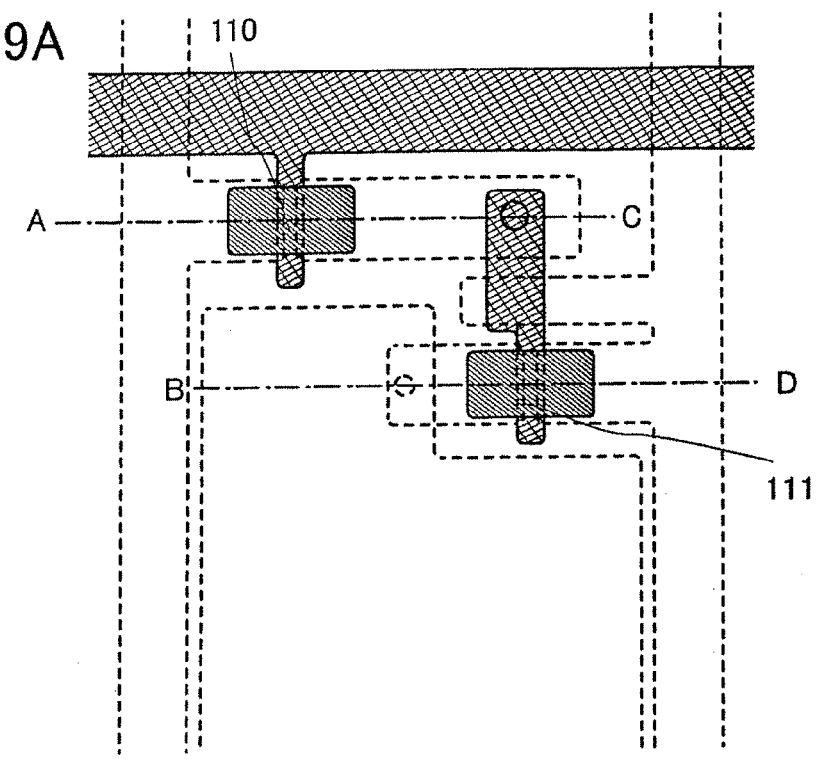
FIGS. 9A to 9C illustrate a method of fabricating a display device of the invention.
Figure 9B:
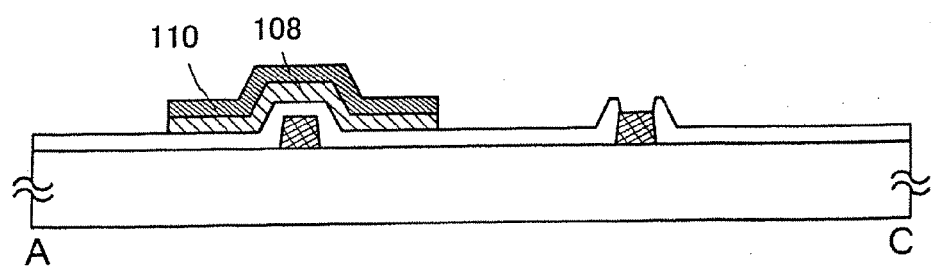
Figure 9C:
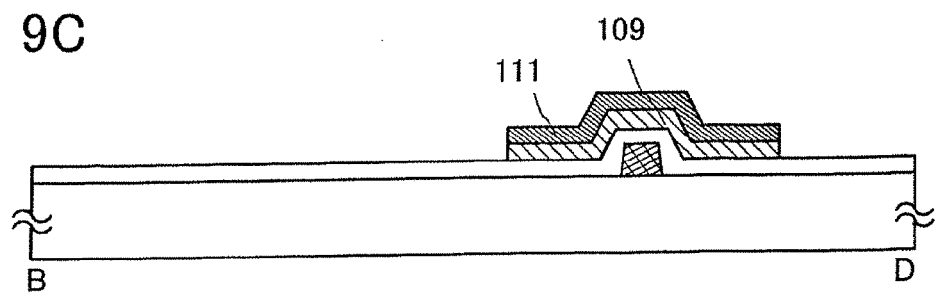

In this embodiment mode, semiconductor layers 108 and 109 are formed first, and amorphous semiconductor layers are formed thereover as semiconductor layers 110 and 111 having one conductivity type (see FIGS. 9A to 9C). In this embodiment mode, n-type semiconductor films containing phosphorus (P) that is an impurity element imparting n-type conductivity are formed as the semiconductor films having one conductivity type. The semiconductor films having one conductivity type function as source and drain regions. The semiconductor films having one conductivity type may be formed as needed. For example, it is possible to form an n-type semiconductor film containing an impurity element (P or As) which imparts n-type conductivity or a p-type semiconductor film containing an impurity element (B) which imparts p-type conductivity.

Next, source and drain electrode layers 116, 117, 118, and 119 are formed. The source and drain electrode layers 116, 117, 118, and 119 can be formed using an element selected from among Ag (silver), Au (gold), Cu (copper), W (tungsten), Al (aluminum), Mo (molybdenum), Ta (tantalum), and Ti (titanium), or an alloy material or a compound material containing such an element as a main component. Alternatively, it is also possible to use light-transmissive materials such as indium tin oxide (ITO), ITO containing silicon oxide (ITSO), organic indium, organotin, zinc oxide, and titanium nitride.

The source and drain electrode layers 116, 117, 118, and 119 can each be formed by depositing a conductive film by a PVD (Physical Vapor Deposition) method such as a sputtering method, a CVD (Chemical Vapor Deposition) method such as a low-pressure CVD (LPCVD) method or a plasma CVD method, or the like, and patterning the conductive film using a mask layer. It is also possible to use a method by which desired patterns can be transferred or drawn. For example, various printing methods (e.g., pattern formation methods such as screen printing (stencil printing), offset printing (planographic printing), relief printing, or gravure printing (intaglio printing)), a droplet discharge method, a dispending method, and a selective coating method.

The patterning of the conductive films may be performed by dry etching or wet etching. For example, an ICP (Inductively Coupled Plasma) etching method may be used in conjunction with appropriate control of the etching conditions (e.g., the amount of electric power applied to a coiled electrode, the amount of electric power applied to an electrode on the substrate side, and the electrode temperature on the substrate side), whereby the electrode layers can be etched into tapered shapes. Note that an etching gas can be selected as appropriate from among a chlorine source gas typified by $Cl_2$, $BCl_3$, $SiCl_4$, or $CCl_4$; a fluorine source gas typified by $CF_4$, $SF_6$, or $NF_3$; and $O_2$.

Alternatively, the source and drain electrode layers can each be formed by the steps of depositing a light-absorbing conductive film on a first substrate and irradiating the light-absorbing conductive film with laser light, so that desired patterns can be selectively transferred to a second substrate.

The source or drain electrode layer 116 also functions as a source or drain wiring layer, and the source or drain electrode layer 118 also functions as a power supply line.

The source or drain electrode layer 117 and the gate electrode layer 104 are electrically connected at the opening 107 of the gate insulating layer 105. A part of the source or drain electrode layer 118 forms a capacitor. After the formation of the source and drain electrode layers 116, 117, 118, and 119, the semiconductor layers 108 and 109 and the semiconductor layers 110 and 111 having one conductivity type are patterned into desired shapes. In this embodiment mode, the semiconductor layers 108 and 109 and the semiconductor layers 110 and 111 having one conductivity type are patterned by etching, using the source and drain electrode layers 116, 117, 118, and 119 as masks, whereby semiconductor layers 120a, 120b, 121a, and 121b are formed.

Figure 10A:
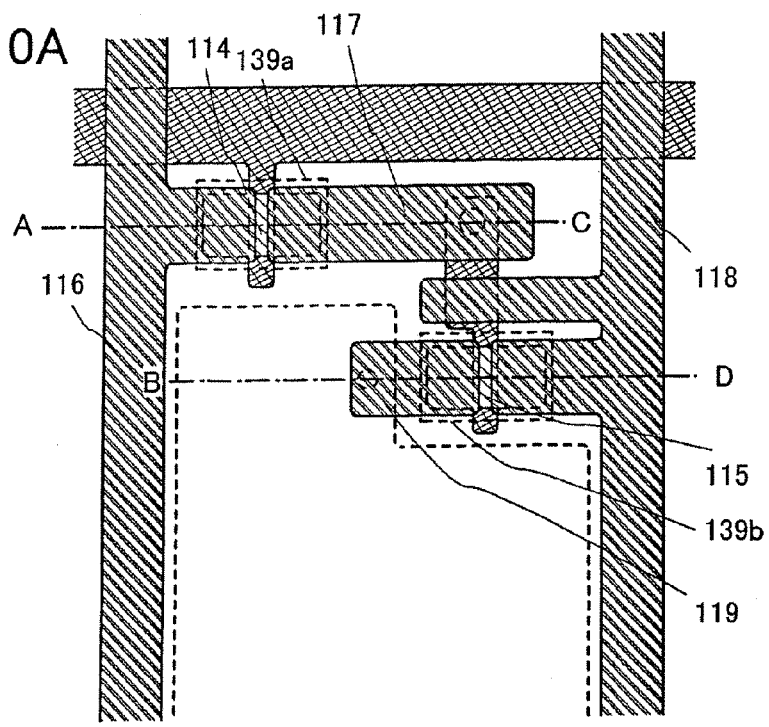
FIGS. 10A to 10C illustrate a method of fabricating a display device of the invention.
Figure 10B:
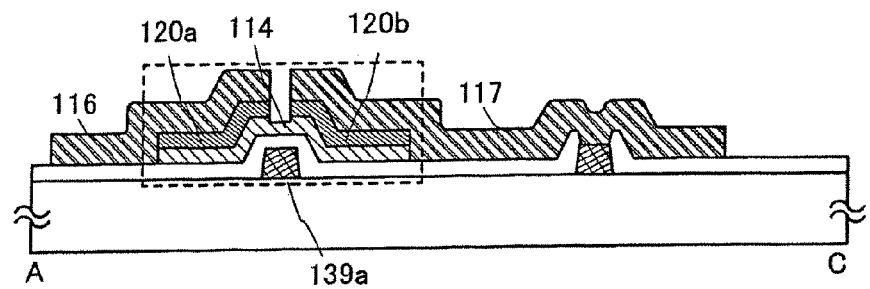
Figure 10C:
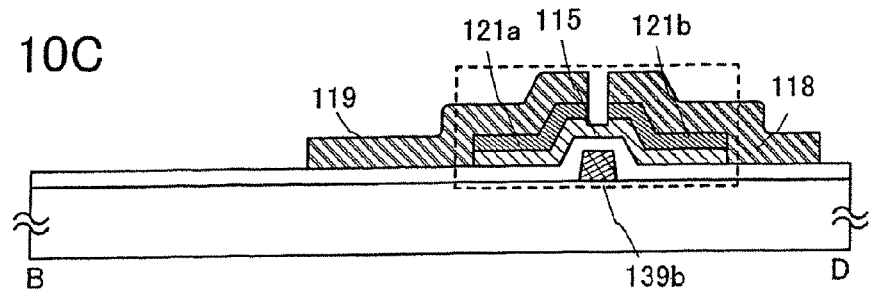

Through the above-described steps, transistors 139a and 139b that are inversely staggered thin film transistors are fabricated (see FIGS. 10A to 10C).

Figure 11A:
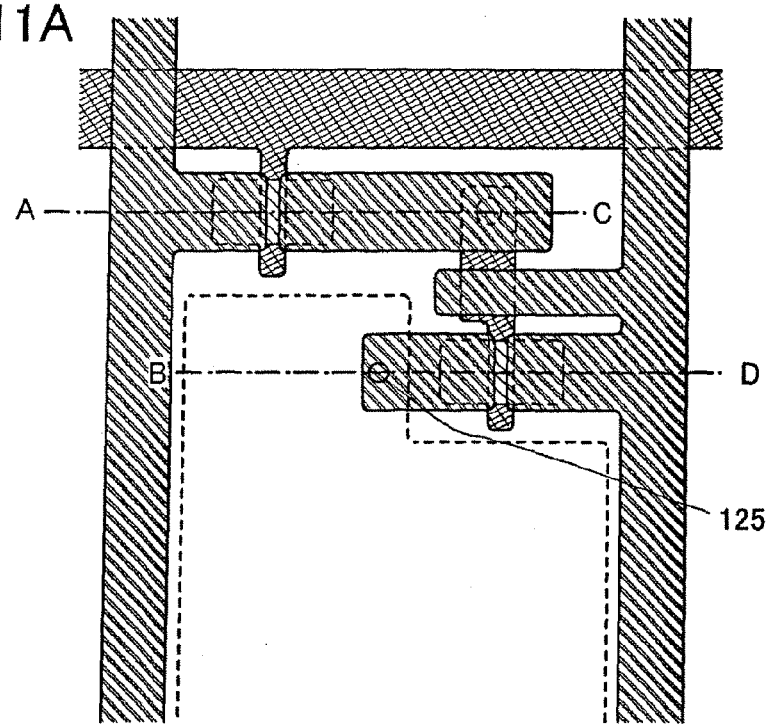
FIGS. 11A to 11C illustrate a method of fabricating a display device of the invention.
Figure 11B:
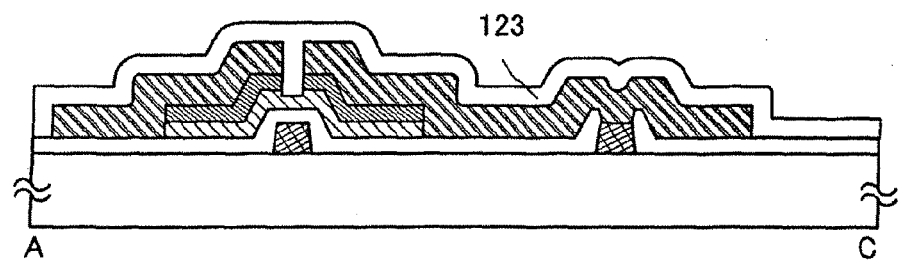
Figure 11C:
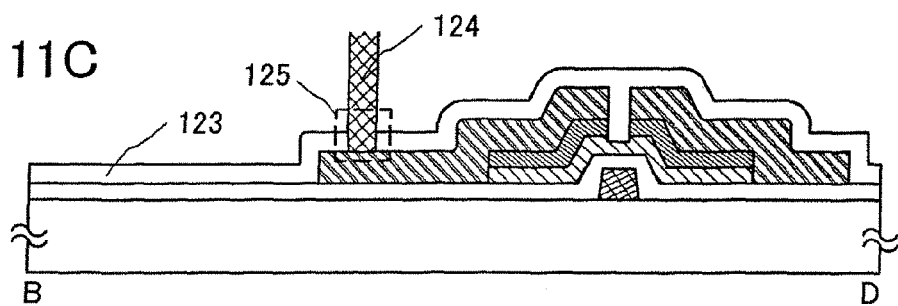

Then, an insulating layer 123 having an opening 125 is formed over the gate insulating layer 105 and the transistors 139a and 139b (see FIGS. 11A to 11C).

The insulating layer 123 can be formed by a PVD (Physical Vapor Deposition) method such as a sputtering method, a CVD (Chemical Vapor Deposition) method such as a low-pressure CVD (LPCVD) method or a plasma CVD method, or the like.

The insulating layer 123 can be formed using a material selected from among silicon oxide, silicon nitride, silicon oxynitride, aluminum oxide, aluminum nitride, aluminum oxynitride, diamond-like carbon (DLC), carbon containing nitrogen, polysilazane, and other inorganic insulating materials. Further, a material containing siloxane can also be used.

In this embodiment mode, the insulating layer 123 is formed to have the opening 125 which exposes the source or drain electrode layer 119 as shown in Embodiment Modes 1 and 2. A mask 124 is provided above a region of the source or drain electrode layer 119 where the opening 125 is to be formed. Then, an insulating film is formed in a region excluding the mask 124. After the formation of the insulating film, the mask 124 is physically or chemically removed, so that the insulating layer 123 has an opening in a region where the mask 124 has been provided. Thus, the insulating layer 123 having the opening 125 is formed over the source or drain electrode layer 119, whereby the source or drain electrode layer 119 below the insulating layer 123 is exposed at the bottom of the opening 125.

The shape of the opening reflects the shape of the mask. Therefore, any mask with which an opening with a desired shape can be formed is acceptable. The mask can have a columnar shape (e.g., a prism, a cylinder, or a triangular prism), a needle shape, or the like. In addition, the depth direction of the opening can be determined by the force generated upon providing the mask and by the film strength of the conductive layer that is provided with the mask. When a needle-shaped mask having a sharp end is provided in such a manner that a part of the sharp end sticks into the conductive layer, an opening with a recessed portion can be formed in the conductive layer. Further, after the formation of the opening, the conductive layer exposed at the bottom of the opening may be removed by etching, using the insulating layer having the opening as a mask.

The insulating layer can be formed by an evaporation method, a PVD (Physical Vapor Deposition) method such as a sputtering method, a CVD (Chemical Vapor Deposition) method such as a low-pressure CVD (LPCVD) method or a plasma CVD method, or the like. In the invention, a region above the conductive layer where the opening is to be formed is physically blocked with a mask so that the material for forming the insulating layer does not adhere to the conductive layer. Thus, a non-formation region of the insulating layer can be determined physically and, therefore, an insulating layer having an opening can be formed with high accuracy. Thus, using the invention can fabricate a highly reliable semiconductor device and display device with high yield.

According to the invention, an insulating layer having an opening can be selectively formed without using a photolithography process. Therefore, the number of steps and materials can be reduced.

Figure 12A:
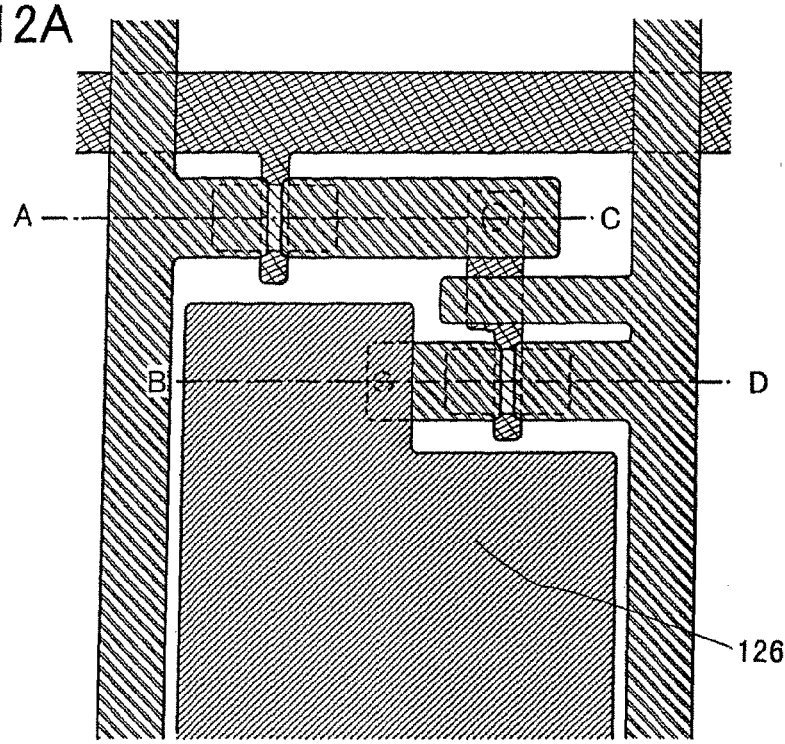
FIGS. 12A to 12C illustrate a method of fabricating a display device of the invention.
Figure 12B:
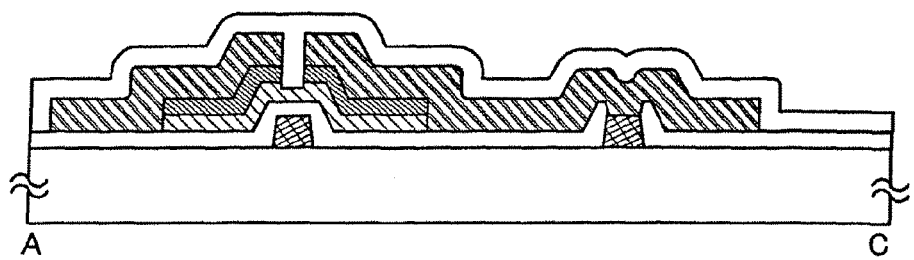
Figure 12C:
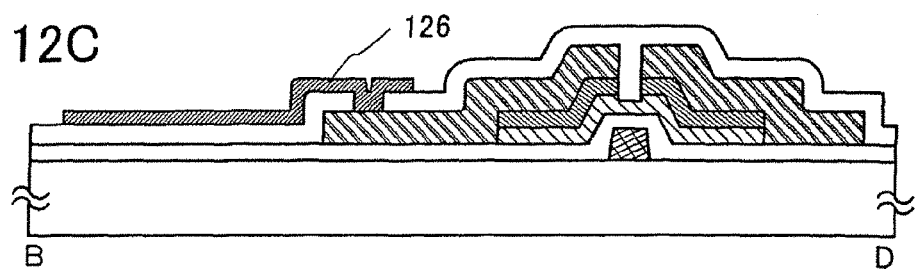
Figure 13A:
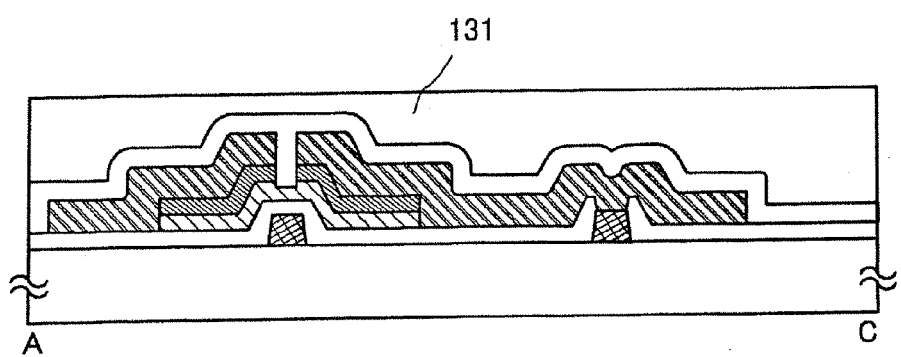
FIGS. 13A and 13B illustrate a method of fabricating a display device of the invention.
Figure 13B:
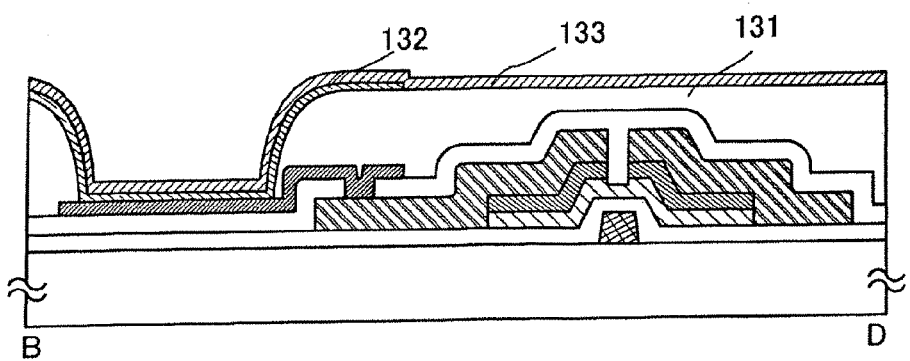

Next, a first electrode layer 126 of a light-emitting element which functions as a pixel electrode is formed in the opening 125 where the source or drain electrode 119 is exposed, whereby the source or drain electrode layer 119 and the first electrode layer 126 can be electrically connected (see FIGS. 12A to 12C).

The first electrode layer 126 can be formed by the method shown in Embodiment Mode 3 which includes the steps of depositing a light-absorbing conductive film on a first substrate and irradiating the light-absorbing conductive film with laser light, so that desired patterns can be selectively transferred to a second substrate.

In this embodiment mode, the first electrode layer is formed by the steps of depositing a conductive film and patterned the film into a desired shape using a mask layer.

The first electrode layer 126 can be formed by a PVD (Physical Vapor Deposition) method such as a sputtering method, a CVD (Chemical Vapor Deposition) method such as a low-pressure CVD (LPCVD) method or a plasma CVD method, or the like. As a conductive material for forming the first electrode layer 126, indium tin oxide (ITO), ITO containing silicon oxide (ITSO), zinc oxide (ZnO), or the like can be used. Preferably, ITO containing silicon oxide is deposited by a sputtering method using a target of ITO which contains 2 to 10 wt % silicon oxide. Further, it is also possible to deposit a conductive material in which ZnO is doped with gallium (Ga) or deposit indium zinc oxide (IZO) which is a conductive oxide material, using a target which contains silicon oxide and indium oxide mixed with 2 to 20 wt % zinc oxide (ZnO).

The mask layer is formed using a resin material such as an epoxy resin, a phenol resin, a novolac resin, an acrylic resin, a melamine resin, or a urethane resin. Further, it is also possible to deposit an organic material such as benzocyclobutene, parylene, fluorinated arylene ether, or light-transmissive polyimide, a compound material formed by polymerization of siloxane polymers and the like, a composition material containing water-soluble homopolymers and water-soluble copolymers, and the like by a droplet discharge method. Alternatively, a commercial resist material including a photosensitive agent can be used. For example, a positive resist or a negative resist can be used. In using any of the above-described materials, the surface tension and viscosity of the materials are appropriately controlled by adjusting the concentration of a solvent or by adding a surfactant or the like.

The patterning of the first electrode layer 126 may be performed by dry etching or wet etching. For example, an ICP (Inductively Coupled Plasma) etching method may be used in conjunction with appropriate control of the etching conditions (e.g., the amount of electric power applied to a coiled electrode, the amount of electric power applied to an electrode on the substrate side, and the electrode temperature on the substrate side), whereby the electrode layer can be etched into a tapered shape. Note that an etching gas can be selected as appropriate from among a chlorine source gas typified by $Cl_2$, $BCl_3$, $SiCl_4$, or $CCl_4$; a fluorine source gas typified by $CF_4$, $SF_6$, or $NF_3$; and $O_2$.

The first electrode layer 126 may be wiped and polished by a CMP method using a porous body such as polyvinyl alcohol so as to have a flat surface. Further, after polishing the first electrode layer 126 by the CMP method, it is also possible to apply ultraviolet irradiation, oxygen plasma treatment, or the like to the surface of the first electrode layer 126.

Through the above-described steps, a TFT substrate of a display panel is completed, in which a bottom-gate TFT and the first electrode layer 126 are connected over the substrate 100. A TFT in this embodiment mode is an inversely staggered TFT.

Next, an insulating layer (also called a partition) 131 is selectively formed. The insulating layer 131 is formed so as to have an opening above the first electrode layer 126. In this embodiment mode, the insulating layer 131 is formed over the entire surface and then patterned by etching using a resist mask or the like. When the insulating layer 131 is directly formed by using a droplet discharge method, a printing method, a dispensing method, or the like which is capable of selective deposition, the etching process is not necessary.

The insulating layer 131 can be formed using the following materials: silicon oxide, silicon nitride, silicon oxynitride, aluminum oxide, aluminum nitride, aluminum oxynitride, and other inorganic insulating materials. Alternatively, the following insulating materials can also be used: acrylic acid, methacrylic acid, derivatives thereof, thermally stable polymers such as polyimide, aromatic polyamide, and polybenzimidazole, inorganic siloxane (a compound of silicon, oxygen, and hydrogen, which is formed using a siloxane material as a starting material and has a Si—O—Si bond), and organic siloxane whose hydrogen combined with silicon is substituted by an organic group such as methyl or phenyl. Further, it is also possible to use a photosensitive or non-photosensitive material such as acrylic or polyimide. The insulating layer 131 preferably has a continuously variable radius of curvature, whereby the insulating layer 131 can be fully covered with an electroluminescent layer 132 and a second electrode layer 133 that will be deposited over the insulating layer 131.

Further, after the formation of the insulating layer 131 by depositing a composition by a droplet discharge method, pressure may be applied to the surface of the insulating layer 131 so that the insulating layer 131 can have a flat surface. As a method of applying pressure, a method of scanning the surface with a roller, a method of perpendicularly applying pressure to the surface with a flat plate, or the like can be used, whereby irregularities of the surface can be reduced. Alternatively, it is also possible to remove irregularities of the surface using an air knife after softening or melting the surface with a solvent or the like. Further, the surface can also be polished by a CMP method. Such steps can be applied in order to planarize the surface of the insulating layer 131 in the case where irregularities are produced on the surface of the insulating layer 131 by a droplet discharge method. Improvement in flatness by such steps can prevent display unevenness of the display panel and the like, whereby high-definition images can be displayed.

A light-emitting element is formed over the substrate 100 that is the TFT substrate of the display panel (see FIGS. 13A and 13B).

Before the formation of the electroluminescent layer 132, thermal treatment is applied at 200° C. at atmospheric pressure, so that moisture which has been adsorbed in the first electrode layer 126 and the insulating layer 131 or on the surfaces thereof is dissipated. In addition, it is preferable to apply thermal treatment at 200 to 400° C., or more preferably 250 to 350° C. at reduced pressure and consecutively form the electroluminescent layer 132 without exposure to the air by a vacuum evaporation method or a droplet discharge method at reduced pressure.

In order to form the electroluminescent layer 132, materials which exhibit light emission of red (R), green (G), and blue (B) colors are selectively formed by a vacuum evaporation method using an evaporation mask or the like. The materials which exhibit light emission of red (R), green (G), and blue (B) colors can also be formed by a droplet discharge method like color filters, which is advantageous in that selective patterning of RGB can be performed without using a mask. Next, the second electrode layer 133 is stacked over the electroluminescent layer 132, whereby a display device which includes light-emitting elements and has a display function can be completed.

Although not shown, it is effective to provide a passivation film so as to cover the second electrode layer 133. The passivation (protective) film provided in constructing a display device can have either a single-layer structure or a multi-layer structure. The passivation film is formed with an insulating film containing silicon nitride, silicon oxide ($SiO_2$), silicon oxynitride (SiON), silicon nitride oxide (SiNO), aluminum nitride (AlN), aluminum oxynitride (AlON) which contains more oxygen than nitrogen, aluminum nitride oxide (AlNO) which contains more nitrogen than oxygen, aluminum oxide, diamond-like carbon (DLC), or carbon containing nitrogen. Such an insulating film can be either a single layer or stacked layers. For example, stacked layers of carbon containing nitrogen and silicon nitride may be used, or stacked layers having an organic material or a high-molecular material such as styrene polymers may also be used. Further, a siloxane material can also be used.

As a passivation film, it is preferable to use a film that can continuously cover the underlying region. For example, a carbon film such as a DLC film is particularly effective. A DLC film can be deposited at temperatures ranging from the room temperature to 100° C.; therefore, it can be easily deposited even above the electroluminescent layer with low heat resistance. A DLC film can be formed by a plasma CVD method (typically, an RF plasma CVD method, a microwave CVD method, an electron cyclotron resonance (ECR) CVD method, a hot-filament CVD method, or the like), combustion flame method, a sputtering method, an ion beam deposition method, a laser deposition method, or the like. As a reactive gas used for deposition of the film, a hydrogen gas and a hydrocarbon source gas (e.g., $CH_4$, $C_2H_2$, or $C_6H_6$) are used, and the reactive gas is ionised by glow discharge so that the ions are accelerated to collide against a negatively self-biased cathode and thus a film can be deposited. In the case of depositing a carbon film containing nitrogen, a $C_2H_4$ gas and a $N_2$ gas may be used as a reactive gas. A DLC film has a high blocking effect against oxygen and can suppress oxidation of the electroluminescent layer. Therefore, the DLC film can prevent a problem that the electroluminescent layer might be oxidized during a subsequent sealing step.

Next, a sealant is formed and a sealing step is performed using a sealing substrate. After that, a flexible wiring board may be connected to a gate wiring layer which is formed to be electrically connected to the gate electrode layer 103 so that the TFT is connected to an external device. The same can be said for source and drain wiring layers which are formed to be electrically connected to the source and drain electrode layers 116, respectively.

The sealing step is performed by filling a space between the element substrate 100 and the sealing substrate with fillet A one drop filling method can be used for introducing filler. The filler may be replaced with an inert gas such as nitrogen. Further, providing a drying agent in the display device can prevent deterioration of the light-emitting elements by moisture. The drying agent may be provided either on the sealing substrate side or the element substrate 100 side. Alternatively, a region where the sealant is formed may be provided with a recessed portion so that the drying agent is placed in the recessed portion. Further, when the drying agent is provided in a place which does not contribute to display such as a driver circuit region or a wiring region of the sealing substrate, the aperture ratio is not decreased even when the drying agent is an opaque substance. It is also possible to form a filler so as to contain a hydroscopic substance so that a function of a drying agent can be attained. As described above, a display device which includes light-emitting elements and has a display function is completed.

Although a switching TFT shown in this embodiment mode has a single-gate structure, it may also have a multi-gate structure such as a double-gate structure. Further, when a semiconductor layer is formed using SAS or a crystalline semiconductor, impurity regions can be formed by doping the semiconductor layer with an impurity which imparts one conductivity type. In that case, impurity regions with different concentrations may be formed in the semiconductor layer. For example, low-concentration impurity regions may be formed in a region in the vicinity of a channel region which overlaps with a gate electrode layer, while high-concentration impurity regions may be formed on the outer sides thereof.

This embodiment mode can be combined with any of Embodiment Modes 1 to 3 as appropriate.

According to the invention, a display device can be fabricated by a simplified process with a reduced number of complicated photolithography steps. Therefore, waste of materials can be reduced and cost reduction can be achieved. Thus, a display device with high performance and high reliability can be fabricated with high yield.

(Embodiment Mode 5)

This embodiment mode will describe an example of a highly reliable display device that is fabricated at low cost through a simplified process. Specifically, a light-emitting display device that uses light-emitting elements as display elements will be described. A method of fabricating a display device in this embodiment mode will be specifically described with reference to FIGS. 15A and 15B.

As base films formed over a substrate 150 having an insulating surface, a silicon nitride oxide film with a thickness of 10 to 200 nm (preferably, 50 to 150 nm) and a silicon oxynitride film with a thickness of 50 to 200 nm (preferably, 100 to 150 nm) are sequentially stacked as base films 151a and 151b, by a PVD (Physical Vapor Deposition) method such as a sputtering method, a CVD (Chemical Vapor Deposition) method such as a low-pressure CVD (LPCVD) method or a plasma CVD method, or the like. Alternatively, it is also possible to use acrylic acid, methacrylic acid, derivatives thereof, thermally stable polymers such as polyimide, aromatic polyamide, or polybenzimidazole, or a siloxane resin. Further, the following resin materials can be also be used: vinyl resins such as polyvinyl alcohol and polyvinyl butyral, an epoxy rein, a phenol resin, a novolac resin, an acrylic rein, a melamine resin, and a urethane resin. In addition, it is also possible to use organic materials such as benzocyclobutene, parylene, fluorinated arylene ether, and polyimide, or a composition material containing water-soluble homopolymers and water-soluble copolymers. Further, an oxazole resin such as photo-curing polybenzoxazole can also be used.

The base films can also be formed by a droplet discharge method, a printing method (e.g., a pattern formation method such as screen printing or offset printing), a coating method such as a spin coating method, a dipping method, a dispensing method, or the like. In this embodiment mode, the base films 151a and 151b are formed by a plasma CVD method. The substrate 150 can be a glass substrate, a quartz substrate, a silicon substrate, or a metal substrate such as a stainless steel substrate having an insulating film formed over its surface.

Alternatively, a plastic substrate which can withstand the processing temperature in this embodiment mode, or a flexible substrate such as a film can also be used. As a plastic substrate, the following can be used: a substrate made of PET (polyethylene terephthalate), PEN (polyethylene naphthalate), PES (polyethersulfone), and the like. As a flexible substrate, a synthetic resin such as acrylic can be used. In the display device fabricated in this embodiment mode, light emitted from light-emitting elements is extracted through the substrate 150. Therefore, the substrate 150 should have a light-transmitting property.

The base films can be formed using silicon oxide, silicon nitride, silicon oxynitride, silicon nitride oxide, or the like, and can have either a single-layer structure or a stacked structure of two or three layers.

Next, a semiconductor film is formed over the base films. The semiconductor film may be formed to a thickness of 25 to 200 nm (preferably, 30 to 150 nm) by various methods (e.g., a sputtering method, an LPCVD method, and a plasma CVD method). In this embodiment mode, it is preferable to use a crystalline semiconductor film which is obtained by crystallizing an amorphous semiconductor film by laser irradiation.

The thusly obtained semiconductor film may be doped with a small amount of an impurity element (e.g., boron or phosphorus) in order to control the threshold voltage of thin film transistors. Alternatively, such doping with the impurity element may be performed before the crystallization step of the amorphous semiconductor film. When the amorphous semiconductor film is doped with the impurity element and subjected to thermal treatment for crystallization, activation of the impurity element can also be performed. In addition, defects and the like caused in doping can be cured.

Next, the crystalline semiconductor film is patterned into a desired shape by etching, whereby semiconductor layers are formed.

An etching process may be performed by using either plasma etching (dry etching) or wet etching. However, plasma etching is more suitable for processing a large substrate. An etching gas can be selected from among a fluorine source gas such as $CF_4$ or $NF_3$ and a chlorine source gas such as $O_2$ or $BCl_3$. An inert gas such as He or Ar may also be added into the etching gas as appropriate. Further, when etching treatment is performed by atmospheric discharge plasma, local discharge processing is possible; therefore, there is no need to form a mask layer over the entire surface of the substrate.

In the invention, conductive layers for forming wiring layers or electrode layers and mask layers for forming predetermined patterns may also be formed by a method by which patterns can be selectively formed like a droplet discharge method. A droplet discharge (ejection) method (which is also called an ink-jet method depending on methods) is a method capable forming a predetermined pattern (e.g., a conductive layer or an insulating layer) by selectively discharging (ejecting) droplets of a composition that has been premixed for a specific purpose. In this case, treatment for controlling the wettability or adhesiveness may also be applied to a region in which the object layer is to be formed. In addition, another method by which patterns can be transferred or drawn can be used. For example, a printing method (e.g., a pattern formation method such as screen printing or offset printing), a dispensing method, or the like can be used.

Then, a gate insulating layer which covers the semiconductor layers is formed. The gate insulating layer is formed by depositing an insulating film containing silicon to a thickness of 10 to 150 nm by a plasma CVD method or a sputtering method. The gate insulating layer may be formed with a material such as a silicon oxide material or a silicon nitride material typified by silicon nitride, silicon oxide, silicon oxynitride, or silicon nitride oxide. Further, the gate insulating layer may be formed to have either a stacked-layer structure or a single-layer structure. Alternatively, the gate insulating layer may be formed to have a three-layer structure of a silicon nitride film a silicon oxide film, and a silicon nitride film, a single-layer structure of a silicon oxynitride film, or a two-layer structure of the above-described materials.

Next, gate electrode layers are formed over the gate insulating layer. The gate electrode layers can be formed by a sputtering method, an evaporation method, a CVD method, or the like. The gate electrode layers can be formed using an element selected from among tantalum (Ta), tungsten (W), titanium (Ti), molybdenum (Mo), aluminum (Al), copper (Cu), chromium (Cr), and neodymium (Nd), or an alloy material or a compound material containing such an element as a main component. Alternatively, the gate electrode layers may each be formed using a semiconductor film typified by a polycrystalline silicon film doped with an impurity element such as phosphorus or an AgPdCu alloy. Further, the gate electrode layers may each have either a single-layer structure or a stacked-layer structure.

Although each gate electrode layer in this embodiment mode is formed to have a tapered shape, the invention is not limited to this structure. For example, a gate electrode layer may be formed to have a stacked-layer structure such that one layer thereof has a tapered shape, while the other layer has a perpendicular side surface by anisotropic etching. The taper angle of each gate electrode layer may be either the same or different as in this embodiment mode. With the tapered shape, the gate electrode layer can be adequately covered with an upper layer. Therefore, defects can be reduced and reliability is improved.

The gate insulating layer may be slightly etched by the etching step for formation of the gate electrode layers. In that case, the gate insulating layer has a reduced thickness.

The semiconductor layers are doped with an impurity element so that impurity regions are formed. The impurity regions can be formed as either high-concentration impurity regions or low-concentration impurity regions by controlling the concentration of the impurity element. A thin film transistor having low-concentration impurity regions is referred to as an LDD (Lightly Doped Drain) structure. Further, the low-concentration impurity regions may be formed to overlap with a gate electrode. A thin film transistor having such a structure is referred to as a GOLD (Gate Overlapped LDD) structure. Thin film transistors in this embodiment mode are formed to be an n-channel type by using phosphorus (P) for the impurity regions. When forming p-channel thin film transistors, boron (B) or the like may be used.

Figure 15A:
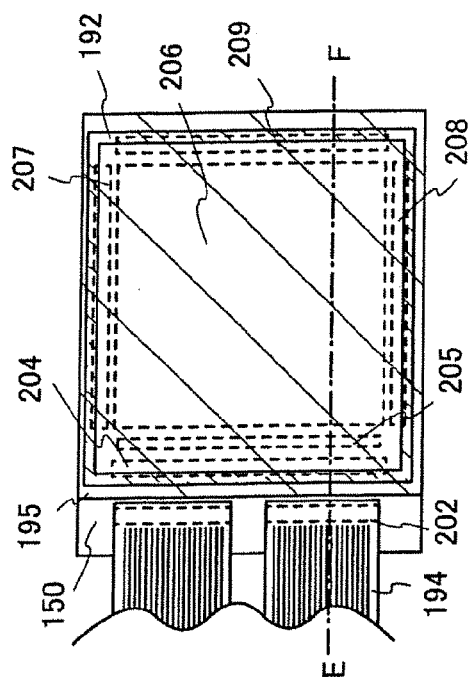
FIGS. 15A and 15B illustrate a display device of the invention.
Figure 15B:
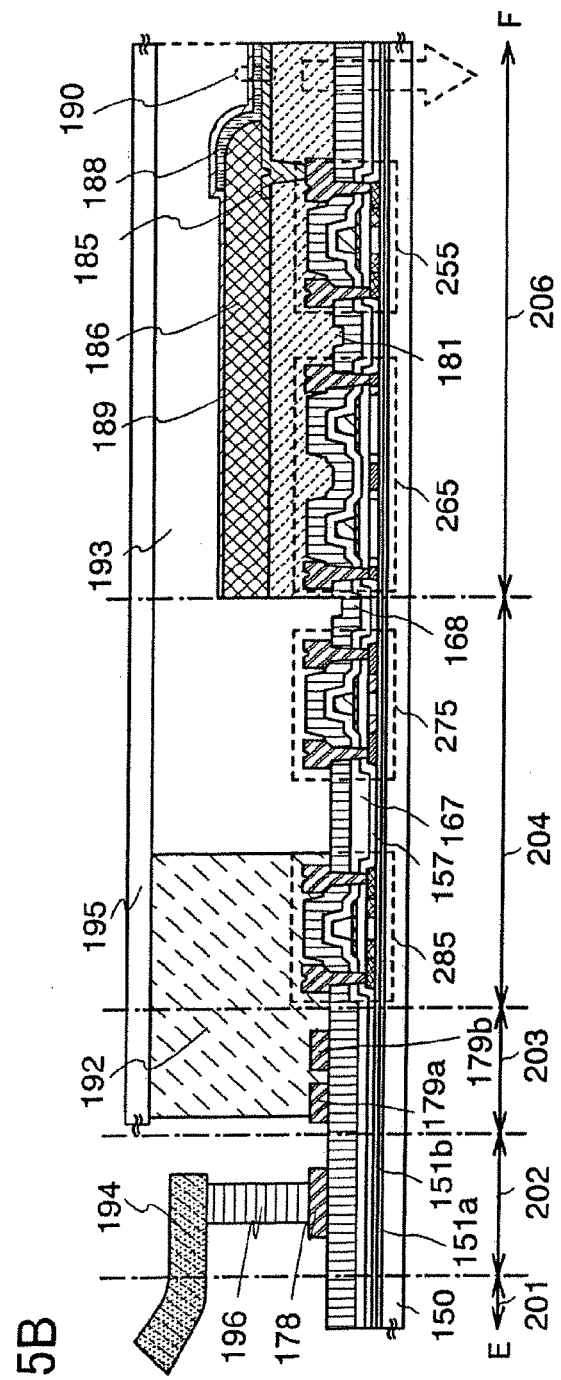

In this embodiment mode, an impurity region which overlaps with the gate electrode layer with the gate insulating layer interposed therebetween is called a Lov region, while an impurity region which does not overlap with the gate electrode layer with the gate insulating layer interposed therebetween is called a Loff region. In FIGS. 15A and 15B, the impurity regions are indicated by hatching on a white background. This does not mean that the white background portion is not doped with an impurity element, but is shown so that it will be intuitively understood that the concentration distribution of the impurity element in the region reflects mask or doping conditions. Note that the same can be said for the other drawings in this specification.

In order to activate the impurity element, thermal treatment, intense light irradiation, or laser irradiation may be applied. In that case, the impurity element can be activated, while at the same time plasma damage to the gate insulating layer and plasma damage to the interface between the gate insulating layer and the semiconductor layers can be recovered.

Next, a first interlayer insulating film which covers the gate electrode layers and the gate insulating layer is formed. In this embodiment mode, an insulating film 167 having openings and an insulating film 168 having openings are stacked. The insulating films 167 and 168 can each be formed by depositing a silicon nitride film, a silicon nitride oxide film, a silicon oxynitride film, a silicon oxide film, or the like by a sputtering method or a plasma CVD method. Alternatively, it is also possible to form a single-layer structure of another insulating film containing silicon or a stacked structure of three or more layers.

Further, thermal treatment is applied at 300 to 500° C. for one to 12 hours in a nitrogen atmosphere, whereby the semiconductor layers is hydrogenated. Preferably, the thermal treatment is applied at 400 to 500° C. This step is a step of saturating dangling bonds in the semiconductor layers by hydrogen contained in the insulating film 167 which is the interlayer insulating layer. In this embodiment mode, thermal treatment is applied at 410° C.

The insulating films 167 and 168 can be formed using a material selected from among aluminum nitride (AlN), aluminum oxynitride (AlON) which contains more oxygen than nitrogen, aluminum nitride oxide (AlNO) which contains more nitrogen than oxygen, aluminum oxide, diamond-like carbon (DLC), carbon containing nitrogen, polysilazane, and other inorganic insulating materials. Alternatively, a material containing siloxane can also be used. As a further alternative, organic insulating materials such as polyimide, acrylic, polyamide, polyimide amide, resist, and benzocyclobutene can also be used. Besides, an oxazole resin such as photocuring polybenzoxazole can also be used.

In this embodiment mode, each of a gate insulating layer 157, the insulating film 167, and the insulating film 168 is formed to have openings which expose source and drain regions of the semiconductor layers as shown in Embodiment modes 1 and 2. Specifically, in the step of forming each of the gate insulating layer 157, the insulating film 167, and the insulating film 168, masks are provided in regions where the openings are to be formed, so that the insulating film is formed in regions excluding the masks. After the formation of the insulating film, the masks are removed physically or chemically, so that an insulating layer having openings in the regions where the masks have been provided is formed. Thus, the gate insulating layer 157, the insulating film 167, and the insulating film 168 each of which has openings above the source and drain regions of the semiconductor layers are formed, so that the source and drain regions of the semiconductor layers that are located below the gate insulating layer 157, the insulating film 167, and the insulating film 168 are exposed at the bottom of the openings.

Either of the following steps can be performed: (1) forming openings which expose the source and drain regions of the semiconductor layers in each formation step of the gate insulating layer 157, the insulating film 167, and the insulating film 168 by using the invention, or (2) forming the upper insulating film 168 to have openings above the source and drain regions of the semiconductor layers, and then etching the insulating film 167 and the gate insulating layer 157 by using the insulating film 168 having the openings as masks, thereby forming openings which expose the source and drain regions of the semiconductor layers.

The shape of the opening reflects the shape of the mask. Therefore, any mask with which an opening with a desired shape can be formed is acceptable. The mask can have a columnar shape (e.g., a prism, a cylinder, or a triangular prism), a needle shape, or the like. In addition, the depth direction of the opening can be determined by the force generated upon providing the mask and by the film strength of the conductive layer that is provided with the mask. When a needle-shaped mask having a sharp end is provided in such a manner that a part of the sharp end sticks into the conductive layer, an opening with a recessed portion can be formed in the conductive layer. Further, after the formation of the opening, the conductive layer exposed at the bottom of the opening may be removed by etching, using the insulating layer having the opening as a mask.

The insulating layer can be formed by an evaporation method, a PVD (Physical Vapor Deposition) method such as a sputtering method, a CVD (Chemical Vapor Deposition) method such as a low-pressure CVD (LPCVD) method or a plasma CVD method, or the like. In the invention, a region above the conductive layer where the opening is to be formed is physically blocked with a mask so that the material for forming the insulating layer does not adhere to the conductive layer. Thus, a non-formation region of the insulating layer can be determined physically and, therefore, an insulating layer having an opening can be formed with high accuracy. Thus, using the invention can fabricate a highly reliable semiconductor device and display device with high yield.

According to the invention, an insulating layer having an opening can be selectively formed without using a photolithography process. Therefore, the number of steps and materials can be reduced.

Next, source and drain electrode layers are formed in the openings where the source and drain regions of the semiconductor layers are exposed, whereby the source and drain regions of the semiconductor layers can be electrically connected to the source and drain electrode layers, respectively.

The source and drain electrode layers can be formed by the steps of depositing a conductive film by a PVD method, a CVD method, an evaporation method, or the like and patterning the film into desired shapes. Further, a droplet discharge method, a printing method, a dispensing method, an electroplating method, or the like can also be used to selectively form conductive layers at predetermined positions. Furthermore, a reflow method or a damascene method can also be used. As a material for forming the source and drain electrode layers, the following can be used: metals such as Ag, Au, Cu, Ni, Pt, Pd, Ir, Rh, W, Al, Ta, Mo, Cd, Zn, Fe, Ti, Si, Ge, Zr, and Ba, or an alloy or nitride of such metals. In addition, a stacked-layer structure of such materials may also be used.

Each of the gate electrode layers, the semiconductor layers, the source electrode layers, and the drain electrode layers which constitute the display device shown in this embodiment mode can also be formed by the method shown in Embodiment Mode 3 which includes the steps of depositing a light-absorbing film of a conductive material or a semiconductor material on a first substrate and irradiating the light-absorbing film with laser light, so that desired patterns can be selectively transferred to a second substrate. Therefore, a photolithography process is not necessary and a process can be simplified. Further, since waste of materials can be prevented, cost reduction can be achieved.

Through the above-described steps, an active matrix substrate can be fabricated in which a p-channel thin film transistor 285 having a p-type impurity region in a Lov region and an n-channel thin film transistor 275 having an n-type impurity region in a Lov region are formed in a peripheral driver circuit region 204; and an n-channel thin film transistor 265 with a multi-channel structure which has an n-type impurity region in a Loff region and a p-channel thin film transistor 255 having a p-type impurity region in a Lov region are formed in a pixel region 206.

The structures of thin film transistors are not limited to those shown in this embodiment mode. For example, any of the following structures may be used: a single-gate structure in which one channel formation region is formed, a double-gate structure in which two channel formation regions are formed, and a triple-gate structure in which three channel formation regions are formed. Further, thin film transistors in the peripheral driver circuit region may also have any of a single-gate structure, a double-gate structure, and a triple-gate structure.

Next, an insulating film 181 is formed as a second interlayer insulating layer. In FIGS. 15A and 15B, the display device includes a cut-off region 201 which is to be cut off by scribing, an external terminal connection region 202 which is a portion to which an FPC is attached, a wiring region 203 which is a lead wiring region of a peripheral portion, the peripheral driver circuit region 204, and the pixel region 206. Wirings 179a and 179b are provided in the wiring region 203, and a terminal electrode layer 178 connected to an external terminal is provided in the external terminal connection region 202.

The insulating film 181 can be formed using a material selected from among silicon oxide, silicon nitride, silicon oxynitride, silicon nitride oxide, aluminum nitride (AlN), aluminum oxide containing nitrogen (also referred to as aluminum oxynitride; AlON), aluminum nitride containing oxygen (also referred to as aluminum nitride oxide; AlNO), aluminum oxide, diamond-like carbon (DLC), carbon containing nitrogen, PSG (phosphosilicate glass), BPSG (borophosphosilicate glass), alumina, and other inorganic insulating materials. Further, a siloxane resin or an organic insulating material can also be used. The organic material can be either photosensitive or non-photosensitive. For example, polyimide, acrylic, polyamide, polyimide amide, resist, benzocyclobutene, polysilazane, or a low-dielectric constant (low-k) material can be used. Besides, an oxazole resin such as photo-curing polybenzoxazole can also be used. An interlayer insulating layer provided for planarization is required to have high heat resistance, high insulating property, and high planarization factor; therefore, the insulating film 181 is preferably formed by a coating method typified by a spin coating method.

The insulating film 181 can also be formed by using a dipping method, spray coating, a doctor knife, a roll coater, a curtain coater, a knife coater, a CVD method, an evaporation method, or the like. Alternatively, the insulating film 181 can be formed by a droplet discharge method. When a droplet discharge method is used, a liquid material can be saved. As a further alternative, a method by which patterns can be transferred or drawn like a droplet discharge method can be used. For example, a printing method (e.g., a pattern formation method such as screen printing or offset printing), a dispensing method, or the like can be used.

Next, a minute opening, i.e., a contact hole is formed in the insulating film 181 of the pixel region 206. The source or drain electrode layer is electrically connected to a first electrode layer 185 at the opening of the insulating film 181. It is also possible to form the insulating film 181 to have an opening which exposes the source or drain electrode layer as shown in Embodiment Modes 1 and 2. Specifically, in the step of forming the insulating film 181, a mask is provided in a region where the opening is to be formed, so that an insulating film is formed in a region excluding the mask. After the formation of the insulating film, the mask is removed physically or chemically, so that an insulating layer having an opening in the region where the mask has been provided is formed. Thus, the insulating film 181 having an opening above the source or drain electrode layer can be formed.

The first electrode layer 185 is formed in the opening where the source or drain electrode layer is exposed, whereby the source or drain electrode layer can be electrically connected to the first electrode layer 185.

The first electrode layer 185 functions as an anode or a cathode, and may be formed to a total thickness of 100 to 800 nm, using an element selected from among titanium, nickel, tungsten, chromium, platinum, zinc, tin, indium, and molybdenum; an alloy material or a compound material containing such an element as a main component such as titanium nitride, titanium silicide nitride, tungsten silicide, tungsten nitride, tungsten silicide nitride, and niobium nitride; or a stacked film of such materials.

In this embodiment mode, light-emitting elements are used as the display elements and light emitted from the light-emitting elements is extracted through the first electrode layer 185. Therefore, the first electrode layer 185 has a light-transmitting property. The first electrode layer 185 is formed by the steps of depositing a transparent conductive film and etching it into a desired shape.

In the invention, the first electrode layer 185 which is a light-transmissive electrode layer may be formed using a transparent conductive film made of a light-transmissive conductive material. Specifically, indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), ITO doped with silicon oxide (ITSO), or the like can also be used.

Further, even a metal film which does not have a light-transmitting property can be used for the first electrode layer 185 on the condition that the film is formed to be thin (preferably, a thickness of about 5 to 30 nm) so as to transmit light. Examples of the thin metal film that can be used for the first electrode layer 185 include a conductive film made of titanium, tungsten, nickel, gold, platinum, silver, aluminum, magnesium, calcium, lithium, or an alloy of such metals.

The first electrode layer 185 can be formed by an evaporation method, a sputtering method, a CVD method, a printing method, a dispensing method, a droplet discharge method, or the like. In this embodiment mode, the first electrode layer 185 is formed by a sputtering method, using indium zinc oxide containing tungsten oxide. The first electrode layer 185 is preferably formed to a total thickness of 100 to 800 nm. The first electrode layer 185 can also be formed by the method shown in Embodiment Mode 3 which includes the steps of depositing a light-absorbing conductive film on a first substrate and irradiating the light-absorbing conductive film with laser light, so that desired patterns can be selectively transferred to a second substrate.

The first electrode layer 185 may be wiped and polished by a CMP method using a porous body such as polyvinyl alcohol so as to have a flat surface. Further, after polishing the first electrode layer 185 by the CMP method, it is also possible to apply ultraviolet irradiation, oxygen plasma treatment, or the like to the surface of the first electrode layer 185.

After the formation of the first electrode layer 185, thermal treatment may be applied. Since this thermal treatment can dissipate moisture contained in the first electrode layer 185, the first electrode layer 185 can be free from degasification. Thus, even when a light-emitting material which will easily deteriorate by moisture is formed over the first electrode layer 185, the light-emitting material does not deteriorate, whereby a highly reliable display device can be fabricated.

Next, an insulating layer 186 (also referred to as a partition, partition wall, or the like) which covers an end portion of the first electrode layer 185 and the source or drain electrode layer is formed.

The insulating layer 186 can be formed using silicon oxide, silicon nitride, silicon oxynitride, silicon nitride oxide, or the like, and can have either a single-layer structure or a stacked structure of two or three layers. Alternatively, the insulating layer 186 can be formed using a material selected from among aluminum nitride, aluminum oxynitride which contains more oxygen than nitrogen, aluminum nitride oxide which contains more nitrogen than oxygen, aluminum oxide, diamond-like carbon (DLC), carbon containing nitrogen, polysilazane, and other inorganic insulating materials. As a further alternative, a material containing siloxane or an organic insulating material can also be used. The organic material can be either photosensitive or non-photosensitive. For example, polyimide, acrylic, polyamide, polyimide amide, resist, benzocyclobutene, or polysilazane can be used. Besides, an oxazole resin such as photo-curing polybenzoxazole can also be used.

The insulating layer 186 can be formed by a PVD (Physical Vapor Deposition) method such as a sputtering method or a CVD (Chemical Vapor Deposition) method such as a low-pressure CVD (LPCVD) method or a plasma CVD method. It is also possible to use a droplet discharge method by which patterns can be selectively formed, a printing method by which patterns can be transferred or drawn (e.g., a pattern formation method such as screen printing or offset printing), a coating method such as a spin coating method, a dipping method, and the like.

An etching process may be performed by using either plasma etching (dry etching) or wet etching. However, plasma etching is more suitable for processing a large substrate. An etching gas can be selected from among a fluorine source gas such as $CF_4$ or $NF_3$ and a chlorine source gas such as $Cl_2$ or $BCl_3$. An inert gas such as He or Ar may also be added into the etching gas as appropriate. Further, when etching treatment is performed by atmospheric discharge plasma, local discharge processing is possible; therefore, there is no need to form a mask layer over the entire surface of the substrate.

In a connection region 205 shown in FIG. 15A, a wiring layer that is formed through the same steps and with the same material as a second electrode layer is electrically connected to a wiring layer that is formed through the same steps and with the same material as the gate electrode layer.

A light-emitting layer 188 is formed over the first electrode layer 185. Although only one pixel is shown in FIG. 15B, electroluminescent layers corresponding to R (Red), G (Green), and B (Blue) colors are selectively formed in this embodiment mode.

Next, a second electrode layer 189 made of a conductive film is provided over the light-emitting layer 188. The second electrode layer 189 can be formed using Al, Ag, Li, or Ca; an alloy or compound thereof such as MgAg, MgIn, AlLi, or $CaF_2$; or calcium nitride. Thus, a light-emitting element 190 having the first electrode layer 185, the light-emitting layer 188, and the second electrode layer 189 is formed (see FIG. 15B).

In the display device of this embodiment mode shown in FIGS. 15A and 15B, light emitted from the light-emitting element 190 travels in the direction of the arrow in FIG. 15B from the side of the first electrode layer 185.

In this embodiment mode, an insulating layer may be provided as a passivation film (a protective film) over the second electrode layer 189. It is effective to provide a passivation film so as to cover the second electrode layer 189. The passivation film is formed of an insulating film containing silicon nitride, silicon oxide, silicon oxynitride, silicon nitride oxide, aluminum nitride, aluminum oxynitride which contains more oxygen than nitrogen, aluminum nitride oxide which contains more nitrogen than oxygen, aluminum oxide, diamond-like carbon (DLC), or carbon containing nitrogen. Such an insulating film can be either a single layer or stacked layers. Further, a siloxane resin can also be used.

As a passivation film, it is preferable to use a film that can continuously cover the underlying region. For example, a carbon film such as a DLC film is particularly effective. A DLC film can be deposited at temperatures ranging from the room temperature to 100° C.; therefore, it can be easily deposited even above the light-emitting layer 188 with low heat resistance. A DLC film can be formed by a plasma CVD method (typically, an RF plasma CVD method, a microwave CVD method, an electron cyclotron resonance (ECR) CVD method, a hot-filament CVD method, or the like), combustion flame method, a sputtering method, an ion beam deposition method, a laser deposition method, or the like. As a reactive gas used for deposition of the film, a hydrogen gas and a hydrocarbon source gas (e.g., $CH_4$, $C_2H_2$, or $C_6H_6$) are used, and the reactive gas is ionized by glow discharge so that the ions are accelerated to collide against a negatively self-biased cathode and thus a film can be deposited. In the case of depositing a carbon film containing nitrogen, a $C_2H_4$ gas and a $N_2$ gas may be used as a reactive gas. A DLC film has a high blocking effect against oxygen and can suppress oxidation of the light-emitting layer 188. Therefore, the DLC film can prevent a problem that the light-emitting layer 188 might be oxidized during a subsequent sealing step.

The substrate 150 having the light-emitting element 190 and a sealing substrate 195 are bonded with a sealant 192, so that the light-emitting element is sealed (see FIGS. 15A and 15B). The sealant 192 is preferably a visible-light curing resin, an ultraviolet curing resin, or a thermosetting resin. For example, the following epoxy resins can be used: a bisphenol A liquid resin, a bisphenol A solid resin, a bromine-containing epoxy rein, a bisphenol F resin, a bisphenol AD resin, a phenol resin, a cresol resin, a novolac resin, a cycloaliphatic epoxy resin, an Epi-Bis type epoxy resin, a glycidyl ester resin, a glycidyl amine resin, a heterocyclic epoxy resin, a modified epoxy resin, and the like. Note that a region surrounded by the sealant may be filled with a filler 193, or with a nitrogen gas or the like by performing a sealing step under a nitrogen atmosphere. In this embodiment mode, a bottom-emission display device is fabricated; therefore, the filler 193 is not required to have a light-transmitting property. However, when a structure in which light is extracted through the filler 193 is employed, the filler 193 should have a light-transmitting property. Typically, a visible-light curing resin, an ultraviolet curing resin, or a thermosetting resin can be used. By the above-described steps, a display device which includes light-emitting elements and has a display function is completed. The filler can be introduced into the display device by being dropped in a liquid state. When a hydroscopic substance such as a drying agent is used as a filler, a water-absorbing effect can be increased, whereby deterioration of the element can be prevented.

In order to prevent deterioration of the element by moisture, a drying agent is provided in the EL display panel. In this embodiment mode, the drying agent is provided in a recessed portion that is formed in the sealing substrate so as to surround the pixel region, so that a thin display panel can be fabricated. Further, when a drying agent is also provided in a region corresponding to a gate wiring layer to increase the water-absorbing area, a higher water-absorbing effect can be obtained. In addition, even when a drying agent is provided above the gate wiring layer which does not directly emit light, light extraction efficiency is not lowered.

Although this embodiment mode illustrates the case where the light-emitting element is sealed with a glass substrate, any of the following sealing treatment which can protect the light-emitting element against moisture can be used: a mechanical sealing method with a covering material, a sealing method with a thermosetting resin or an ultraviolet curing resin, and a sealing method with a thin film having a high barrier property such as metal oxide or metal nitride. For a covering material, glass, ceramics, plastic, or metal can be used. However, when light is emitted to the side of the covering material, the covering material should have a light-transmitting property. In addition, the covering material and the substrate having the light-emitting element are bonded with a sealant such as a thermosetting resin or an ultraviolet curing resin, followed by thermal treatment or ultraviolet irradiation for hardening the resin so that a hermetically sealed space is formed. It is also effective to provide a hydroscopic material typified by barium oxide in the hermetically sealed space. This hydroscopic material may be provided to be in contact with the sealant or provided above the partition or in the peripheral portion so as not to block light emitted from the light-emitting element. Further, a space between the covering material and the substrate having the light-emitting element can also be filled with a thermosetting resin or an ultraviolet curing resin. In that case, it is effective to add a hydroscopic material typified by barium oxide into the thermosetting resin or the ultraviolet curing resin.

The source or drain electrode layer does not have to be directly connected to the first electrode layer, but may be electrically connected to the first eledrode layer through a wiring layer.

In this embodiment mode, an FPC 194 is connected to the terminal electrode layer 178 through an anisotropic conductive layer 196 in the external terminal connection region 202, so that TFTs are electrically connected to an external device. In addition, as shown in FIG. 15A which is a plan view of the display device, the display device fabricated in this embodiment mode is provided with peripheral driver circuit regions 204 and 209 having signal line driver circuits as well as peripheral driver circuit regions 207 and 208 having scan line driver circuits.

Although the display device in this embodiment mode is constructed from the above-described circuits, the invention is not limited to this. For example, IC chips may be mounted as the peripheral driver circuits by a COG method or a TAB method. Further, the numbers of the gate line driver circuits and the source line driver circuits can be either one or more.

Furthermore, a driving method for image display of the display device in this embodiment mode is not specifically limited. For example, a dot sequential driving method, a line sequential driving method, a frame sequential driving method, or the like can be used. Typically, a line sequential driving method is used, and a time ratio gray scale driving method or an area ratio gray scale driving method may be combined as appropriate. In addition, video signals input to the source lines of the display device may be either analog signals or digital signals, and driver circuits and the like may be appropriately designed in conformity with the video signals.

This embodiment mode can be combined with any of Embodiment Modes 1 to 3 as appropriate.

According to the invention, a display device can be fabricated by a simplified process with a reduced number of complicated photolithography steps. Therefore, waste of materials can be reduced and cost reduction can be achieved. Thus, a display device with high performance and high reliability can be fabricated with high yield.

(Embodiment Mode 6)

Thin film transistors can be formed by using the invention, and a display device can be formed by using such thin film transistors. When light-emitting elements are used and n-channel transistors are used as transistors for driving the light-emitting elements, light emitted from the light-emitting elements is emitted to the bottom side, the top side, or both the top and bottom sides. Here, a stacked structure of a light-emitting element for each case will be described with reference to FIGS. 17A to 17C.

In this embodiment mode, channel-protective thin film transistors 461, 471, and 481 which apply the invention are used. The thin film transistor 481 is provided over a light-transmissive substrate 480, and includes a gate electrode layer 493, a gate insulating film 497, a semiconductor layer 494, n-type semiconductor layers 495a and 495b, a source or drain electrode layer 487a, a source or drain electrode layer 487b, a channel-protective layer 496, an insulating layer 499, a wiring layer 498, and an insulating layer 482. Each of the gate electrode layer, the semiconductor layer, and the source or drain electrode layer can be formed by the method shown in Embodiment Mode 3 which includes the steps of depositing a light-absorbing conductive film on a first substrate and irradiating the light-absorbing conductive film with laser light, so that desired patterns can be selectively transferred to a second substrate. In that case, a process can be simplified and waste of materials can be prevented; therefore, cost reduction can be achieved.

Figure 17A:
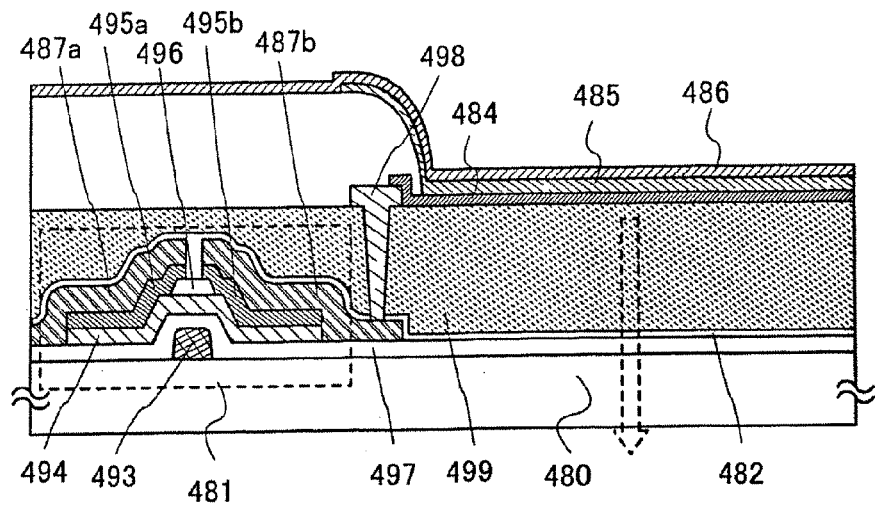
FIGS. 17A to 17C illustrate display devices of the invention.
Figure 17B:
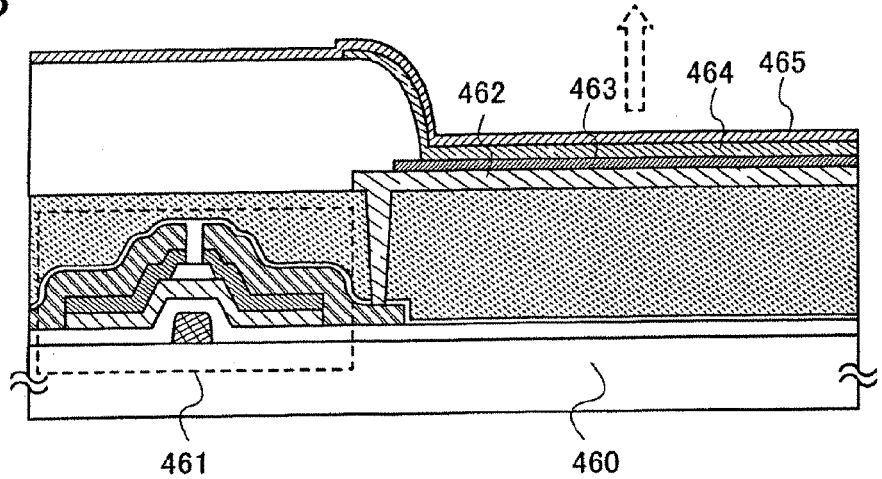
Figure 17C:
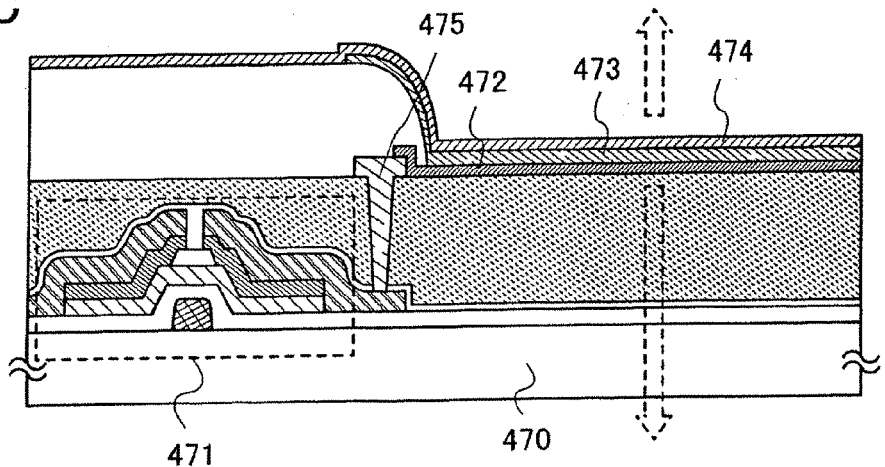

In FIGS. 17A to 17C shown in this embodiment mode, the insulating layer 482 is formed so as to have a contact hole (an opening) which exposes the source or drain electrode layer 487b.

In this embodiment mode, the insulating layer 482 is formed so as to have an opening which exposes the source or drain electrode layer 487b as shown in Embodiment Modes 1 and 2. Specifically, in the step of forming the insulating layer 482, a mask is provided in a region where the opening is to be formed, so that an insulating film is formed in a region excluding the mask. After the formation of the insulating film, the mask is removed physically or chemically, so that an insulating layer having an opening in the region where the mask has been provided is formed. Thus, the insulating layer 482 having an opening above the source or drain electrode layer 487b can be formed.

The shape of the opening reflects the shape of the mask. Therefore, any mask with which an opening with a desired shape can be formed is acceptable. The mask can have a columnar shape (e.g., a prism, a cylinder, or a triangular prism), a needle shape, or the like. In addition, the depth direction of the opening can be determined by the force generated upon providing the mask and by the film strength of the conductive layer that is provided with the mask. When a needle-shaped mask having a sharp end is provided in such a manner that a part of the sharp end sticks into the conductive layer, an opening with a recessed portion can be formed in the conductive layer. Further, after the formation of the opening, the conductive layer exposed at the bottom of the opening may be removed by etching, using the insulating layer having the opening as a mask.

The insulating layer can be formed by an evaporation method, a PVD (Physical Vapor Deposition) method such as a sputtering method, a CVD (Chemical Vapor Deposition) method such as a low-pressure CVD (LPCVD) method or a plasma CVD method, or the like. In the invention, a region above the conductive layer where the opening is to be formed is physically blocked with a mask so that the material for forming the insulating layer does not adhere to the conductive layer. Thus, a non-formation region of the insulating layer can be determined physically and, therefore, an insulating layer having an opening can be formed with high accuracy. Thus, using the invention can fabricate a highly reliable semiconductor device and display device with high yield.

According to the invention, an insulating layer having an opening can be selectively formed without using a photolithography process. Therefore, the number of steps and materials can be reduced.

Next, a wiring layer 498 is formed in the opening where the source or drain electrode layer 487b is exposed, so that the source or drain electrode layer 487b can be electrically connected to the wiring layer 498. The wiring layer 498 is formed in contact with a first electrode layer 484; therefore, the thin film transistor 481 and the light-emitting element are electrically connected.

In this embodiment mode, an amorphous semiconductor layer is used as a semiconductor layer. However, the semiconductor layer is not limited to this. A crystalline semiconductor layer may be used as a semiconductor layer and an n-type semiconductor layer may be used as a semiconductor layer having one conductivity type. Instead of forming the n-type semiconductor layer, a conductivity type may be provided to the semiconductor layer by performing plasma treatment with a $PH_3$ gas. In the case of using a crystalline semiconductor layer such as polysilicon, an impurity region having one conductivity type may be formed by doping the crystalline semiconductor layer with an impurity instead of forming a semiconductor layer having one conductivity type. In addition, it is also possible to use an organic semiconductor such as pentacene. When such an organic semiconductor is selectively formed by a droplet discharge method, a process can be simplified.

The case of using a crystalline semiconductor layer as a semiconductor layer will be described. First, an amorphous semiconductor layer is crystallized to form a crystalline semiconductor layer. In the crystallization step, an amorphous semiconductor layer is doped with an element which promotes crystallization (also referred to as a catalytic element or a metal element) and thermal treatment (550 to 750° C. for three minutes to 24 hours) is applied thereto for crystallization. As a metal element which promotes crystallization, one or more elements selected from iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

In order to remove or reduce the element which promotes crystallization from/in the crystalline semiconductor layer, a semiconductor layer containing an impurity element is formed in contact with the crystalline semiconductor layer so that the semiconductor layer functions as a gettering sink. As the impurity element, an impurity element which imparts n-type conductivity, an impurity element which imparts p-type conductivity, a rare gas element, or the like can be used. For example, one or more elements selected form among phosphorus (P), nitrogen (N), arsenic (As), antimony (Sb), bismuth (Bi), boron (B), helium (He), neon (Ne), argon (Ar), krypton (Kr), and xenon (Xe) can be used. An n-type semiconductor layer is formed on the crystalline semiconductor layer containing an element which promotes crystallization, and thermal treatment (550 to 750° C. for three minutes to 24 hours) is applied thereto. Then, the element which promotes crystallization and is in contained in the crystalline semiconductor layer moves toward the n-type semiconductor layer, so that the element which promotes crystallization and is in contained in the crystalline semiconductor layer is removed or reduced. On the other hand, the n-type semiconductor layer becomes an n-type semiconductor layer containing a metal element which promotes crystallization, and is patterned into a desired shape in a subsequent step. In this manner, the n-type semiconductor layer functions as a gettering sink of the semiconductor layer and also functions as source and drain regions.

The crystallization step and the gettering step of the semiconductor layer may be performed by thermal treatment either a plurality of times or only once. In the latter case, the following steps may be performed: forming an amorphous semiconductor layer, doping the amorphous semiconductor layer with an element which promotes crystallization, forming a semiconductor layer to function as a gettering sink, and applying thermal treatment thereto.

In this embodiment mode, the gate insulating layer is formed to have a plurality of stacked layers. Specifically, the gate insulating film 497 having a two-layer structure is formed by sequentially depositing a silicon nitride oxide film and a silicon oxynitride film over the gate electrode layer 493. The stacked insulating layers are preferably formed consecutively in the same chamber at the same temperature by switching reactive gases without breaking a vacuum. When the insulating layers are consecutively formed without breaking a vacuum, an interface between the stacked films can be prevented from contamination.

The channel-protective layer 496 may be formed by dropping polyimide, polyvinyl alcohol, or the like by using a droplet discharge method. As a result, an exposure step can be omitted. The channel-protective layer can be formed using a film made of one or more of an inorganic material (e.g., silicon oxide, silicon nitride, silicon oxynitride, or silicon nitride oxide), a photosensitive or non-photosensitive organic material (an organic resin material such as polyimide, acrylic, polyamide, polyimide amide, resist, or benzocyclobutene), and a low-dielectric constant material, or stacked layers of such films. Alternatively, a siloxane material can also be used. As a method for forming the channel-protective layer 496, a vapor deposition method such as a plasma CVD method or a thermal CVD method or a sputtering method can be used. Further, a droplet discharge method, a dispensing method, or a printing method (e.g., a pattern formation method such as screen printing or offset printing) can also be used. It is also possible to use a SOG film obtained by a coating method or the like.

First, a case where light is emitted to the substrate 480 side, i.e., a bottom-emission structure will be described with reference to FIG. 17A. In this case, the wiring layer 498 is formed in contact with the source or drain electrode layer 487b so as to be electrically connected to the thin film transistor 481. The first electrode layer 484, an electroluminescent layer 485, and a second electrode layer 486 are sequentially stacked. The substrate 480 through which light passes should have a light-transmitting property with respect to light at least in the visible range.

Next, a case where light is emitted to the side opposite to the substrate 460, i.e., a top-emission structure will be described with reference to FIG. 17B. The thin film transistor 461 can be formed in a similar way to the above-described thin film transistor 481. A source or drain electrode layer 462 electrically connected to the thin film transistor 461 is in contact with and electrically connected to a first electrode layer 463. The first electrode layer 463, an electroluminescent layer 464, and a second electrode layer 465 are sequentially stacked. The source or drain electrode layer 462 is a reflective metal layer and reflects light emitted from the light-emitting element to the top side as shown by the arrow. Since the source or drain electrode layer 462 and the first electrode layer 463 are stacked, even when the first electrode layer 463 is formed of a light-transmissive material and light passes therethrough, the light is reflected by the source or drain electrode layer 462 and travels toward the side opposite to the substrate 460. Needless to say, the first electrode layer 463 may be formed using a reflective metal film. Since light emitted from the light-emitting element is emitted through the second electrode layer 465, the second electrode layer 465 is formed using a material which transmits light at least in the visible range.

Finally, a case where light is emitted to both the substrate 470 side and the side opposite to the substrate 470, i.e., a dual-emission structure will be described with reference to FIG. 17C. The thin film transistor 471 is also a channel-protective thin film transistor. A wiring layer 475 and a first electrode layer 472 are electrically connected to the source or drain electrode layer which is electrically connected to the semiconductor layer of the thin film transistor 471. The first electrode layer 472, an electroluminescent layer 473, and a second electrode layer 474 are sequentially stacked. Each of the first electrode layer 472 and the second electrode layer 474 are formed to be thin enough to transmit light, using a material which transmits light at least in the visible range, whereby a dual-emission structure is realized. In this case, the insulating layers and the substrate 470 through which light passes should also have a light-transmitting property with respect to light at least in the visible range.

This embodiment mode can be combined with any of Embodiment Modes 1 to 5 as appropriate.

According to the invention, components of a display device such as wirings can be formed into desired shapes. Further, a display device can be fabricated by a simplified process with a reduced number of complicated photolithography steps. Therefore, waste of materials can be reduced and cost reduction can be achieved. Thus, a display device with high performance and high reliability can be fabricated with high yield.

(Embodiment Mode 7)

This embodiment mode will describe an example of a highly reliable display device that is fabricated at low cost through a simplified process. Specifically, a light-emitting display device that uses light-emitting elements as display elements will be described.

In this embodiment mode, structures of light-emitting elements that can be applied to the display elements of the display device of the invention will be described with reference to FIGS. 22A to 22D.

FIGS. 22A to 22D each illustrate a structure of a light-emitting element in which an electroluminescent layer 860 containing a mixture of an organic compound and an inorganic compound is sandwiched between a first electrode layer 870 and a second electrode layer 850. The electroluminescent layers 860 includes first layer 840, a second layer 803, and a third layer 802 as shown in the drawings.

The first layer 804 is a layer having a function of transporting holes to the second layer 803, and contains at least a first organic compound and a first inorganic compound which exhibits an electron accepting property with respect to the first organic compound. What is important is that the first organic compound and the first inorganic compound are not simply mixed but the first inorganic compound exhibits an electron accepting property with respect to the first organic compound. With such a structure, many hole carriers are generated in the first organic compound which inherently has few carriers, whereby excellent hole injection/transport properties can be obtained.

Therefore, the first layer 804 can provide not only effects (e.g., provement in heat resistance) that are considered to be obtained by mixture with an inorganic compound, but also excellent conductivity (in particular, the hole injection/transport properties with regard to the first layer 804). Such effects cannot be obtained by a conventional hole transport layer in which an organic compound and an inorganic compound that have no mutual electronic interaction are simply mixed. By such effects, driving voltage can be lowered than that in the conventional structure. Further, since the first layer 804 can be formed to be thick without causing an increase in driving voltage, short circuit of the light-emitting element by dust or the like can be suppressed.

As described above, since hole carriers are generated in the first organic compound, the first organic compound is preferably an organic compound having a hole transport property. Examples of the organic compound having a hole transport property include, but not limited to, phthalocyanine (abbreviation: $H_2Pc$), copper phthalocyanine (abbreviation: CuPc), vanadyl phthalocyanine (abbreviation: VOPc), 4,4',4"-tris(N, N-diphenylamino)triphenylamine (abbreviation: TDATA), 4,4',4"-tris[N-(3-methylphenyl)-N-phenylamino]triphenylamine (abbreviation: MTDATA), 1,3,5-tris[N,N-di(m-tolyl) amino]benzene (abbreviation: m-MTDAB), N,N'-bis(3-methylphenyl)-N,N'-diphenyl-[1,1'-biphenyl]-4,4'-diamine (abbreviation: TPD), 4,4'-bis[N-(1-naphthyl)-N-phenylamino]biphenyl (abbreviation: NPB), 4,4'-bis{N-[4-(N,N-di-m-tolylamino)phenyl]-N-phenylamino}biphenyl (abbreviation: DNTPD), and 4,4',4"-tris(N-carbazolyl) tripheylamine (abbreviation: TCTA). Among the above-described compounds, aromatic amine compounds typified by TDATA, MTDATA, m-MTDAB, TPD, NPB, DNTPD, TCTA, and the like can easily generate hole carriers and thus are suitable for the'first organic compound.

On the other hand, the first inorganic compound can be any material as long as it can easily receive electrons from the first organic compound, and various metal oxides or metal nitrides can be used. For example, oxides of transition metals of Group 4 to Group 12 in the periodic table, which can easily exhibit an electron accepting property, are suitable. Specifically, titanium oxide, zirconium oxide, vanadium oxide, molybdenum oxide, tungsten oxide, rhenium oxide, ruthenium oxide, zinc oxide, and the like can be given as examples. Among the above-described metal oxides, oxides of transition metals of Group 4 to Group 8 in the periodic table, which exhibit a high electron accepting property, are preferable. In particular, vanadium oxide, molybdenum oxide, tungsten oxide, and rhenium oxide are preferable because they can be deposited in vacuum and are easy to be handled.

Note that the first layer 804 can also be formed by stacking a plurality of layers each having a combination of the above-described organic compound and inorganic compound. Further, the first layer 804 can also contain another or anic compound or inorganic compound.

Next, the third layer 802 will be described. The third layer 802 is a layer having a function of transporting electrons to the second layer 803, and contains at least a third organic compound and a third inorganic compound which exhibits an electron donating property with respect to the third organic compound. What is important is that the third organic compound and the third inorganic compound are not simply mixed but the third inorganic compound exhibits an electron donating property with respect to the third organic compound. With such a structure, many electron carriers are generated in the third organic compound which inherently has few carriers, whereby excellent electron injection/transport properties can be obtained.

Therefore, the third layer 802 can provide not only effects (e.g., improvement in heat resistance) that are considered to be obtained by mixture with an inorganic compound, but also excellent conductivity (in particular, the electron injection/transport properties with regard to the third layer 802). Such effects cannot be obtained by a conventional electron transport layer in which an organic compound and an inorganic compound that have no mutual electronic interaction are simply mixed. By such effects, driving voltage can be lowered than that in the conventional structure. Further, since the third layer 802 can be formed to be thick without causing an increase in driving voltage, short circuit of the light-emitting element by dust or the like can be suppressed.

As described above, since electron carriers are generated in the third organic compound, the third organic compound is preferably an organic compound having an electron transport property. Examples of the organic compound having an electron transport property include, but not limited to, tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), bis(2-methyl-8-quinolinolato)-4-phenylphenolato-aluminum (abbreviation: BAlq), bis[2-(2-hydroxyphenyl) benzoxazolato]zinc (abbreviation: $Zn(BOX)_2$), bis[2-(2'-hydroxyphenyl)benzothiazolato]zinc (abbreviation: $Zn(BTZ)_2$), bathophenanthroline (abbreviation: BPhen), bathocuproin (abbreviation: BCP), 2-(4-biphenylyl)-5-(4-tert-butylphenyl)-1,3,4-oxadiazole (abbreviation: PBD), 1,3-bis[5-(4-tert-buthylphenyl)-1,3,4-oxadiazol-2-yl]benzene (abbreviation: OXD-7), 2,2',2"-(1,3,5-benzenetriyl)-tris(1-phenyl-1H-benzimidazole) (abbreviation: TPBI), 3-(4-biphenylyl)-4-phenyl-5-(4-tert-butylphenyl)-1,2,4-triazole (abbreviation: TAZ), and 3-(4-biphenylyl)-4-(4-ethylphenyl)-5-(4-tert-butylphenyl)-1,2,4-triazole (abbreviation: p-EtTAZ). Among the above-described compounds, chelate metal complexes having a chelate ligand including an aromatic ring typified by $Alq_3$, $Almq_3$, $BeBq_2$, BAlq, $Zn(BOX)_2$, and $Zn(BTZ)_2$, organic compounds having a phenanthroline skeleton typified by BPhen and BCP, and organic compounds having an oxadiazole skeleton typified by PBD and OXD-7 can easily generate electron carriers and thus are suitable for the third organic compound.

On the other hand, the third inorganic compound can be any material as long as it can easily donate electrons to the third organic compound, and various metal oxides or metal nitrides can be used. For example, alkali metal oxide, alkaline-earth metal oxide, rare-earth metal oxide, alkali metal nitride, alkaline-earth metal nitride, and rare-earth metal nitride, which can easily exhibit an electron donating property, are suitable. Specifically, lithium oxide, strontium oxide, barium oxide, erbium oxide, lithium nitride, magnesium nitride, calcium nitride, yttrium nitride, lanthanum nitride, and the like can be given as examples. In particular, lithium oxide, barium oxide, lithium nitride, magnesium nitride, and calcium nitride are preferable because they can be deposited in vacuum and are easy to be handled.

Note that the third layer 802 can also be formed by stacking a plurality of layers each having a combination of the above-described organic compound and inorganic compound. Further, the third layer 802 can also contain another organic compound or inorganic compound.

Next, the second layer 803 will be described. The second layer 803 is a layer having a light-emitting function and contains a second organic compound having a light-transmitting property. The second layer 803 may also contain a second inorganic compound. The second layer 803 can be formed using various light-emitting organic compounds and inorganic compounds. Note that the second layer 803 is preferably formed to a thickness of about 10 to 100 nm because it is considered that current can less easily flow through the second layer 803 in comparison with the first layer 804 and the second layer 802.

The second organic compound can be any material as long as it is a light-emitting organic compound. Examples of the second organic compound include, but not limited to, 9,10-di(2-naphthyl)anthracene (abbreviation: DNA), 9,10-di(2-naphthyl)-2-tert-butylanthracene (abbreviation: t-BuDNA), 4,4'-bis(2,2-diphenylvinyl)biphenyl (abbreviation: DPVBi), Coumarin 30, Coumarin 6, Coumarin 545, Coumarin 545T, perylene, rubrene, periflanthene, 2,5,8,11-tetra(tert-butyl)perylene (abbreviation: TBP), 9,10-diphenylanthracene (abbreviation: DPA), 5,12-diphenyltetracene, 4-(dicyanomethylene)-2-methyl-[p-(dimethylamino)styryl]-4H-pyran (abbreviation: DCM1), 4-(dicyanomethylene)-2-methyl-6-[2-(julolidin-9-yl)pethenyl]-4H-pyran (abbreviation: DCM2), and 4-(dicyanomethylene)-2,6-bis[p-(dimethylamino)styryl]-4H-pyran (abbreviation: BisDCM). In addition, it is also possible to use a compound capable of generating phosphorescence such as bis[2-(4',6'-difluorophenyl)pyridinato-N,$C^{2'}$]iridium(picolinate) (abbreviation: FIrpic), bis{2-[3',5'-bis(trifluoromethyl)phenyl]pyridinato-N,$C^{2'}$}iridium(picolinate) (abbreviation: Ir($CF_3$ ppy)$_2$(pic)), tris(2-phenylpyridinato-N,$C^{2'}$)iridium (abbreviation: Ir(ppy)$_3$), bis(2-phenylpyridinato-N,$C^{2'}$)iridium(acetylacetonate) (abbreviation: Ir(ppy)$_2$(acac)), bis[2-(2'-thienyl)pyridinato-N,$C^{3'}$]iridium(acetylacetonate) (abbreviation: Ir(thp)$_2$(acac)), bis(2-phenylquinolinato-N,$C^{2'}$)iridium(acetylacetonate) (abbreviation: Ir(pq)$_2$(acac)), or bis[2-(2'-benzothienyl)pyridinato-N,$C^{3'}$]iridium(acetylacetonate) (abbreviation: Ir(btp)$_2$(acac)).

The second layer 803 can also be formed using a triplet excitation light-emitting material containing a metal complex or the like in addition to a singlet excitation light-emitting material. For example, among pixels which emit read light, green light, and blue light, red pixels whose luminance half-decay lifetime is relatively short are formed by using a triplet excitation light-emitting material, while the other pixels are formed by using a singlet excitation light-emitting material. The feature of a triplet excitation light-emitting material is exemplified by high luminous efficiency; therefore, low power consumption is required to obtain the same luminance. That is, when a triplet excitation light-emitting material is applied to red pixels, the amount of current supplied to the light-emitting elements can be suppressed, whereby reliability can be improved. In order to achieve low power consumption, it is also possible to form red pixels and green pixels by using a triplet excitation light-emitting material and form blue pixels by using a singlet excitation light-emitting material. When light-emitting elements of a green color which is highly visible to human eyes are also formed with a triplet excitation light-emitting material, further reduction in power consumption can be achieved.

Further, the second layer 803 can contain another organic compound in addition to the above-described second organic compound which exhibits light emission. Examples of another organic compound that can be added to the second organic compound include, but not limited to, TDATA, MTDATA, m-MTDAB, TPD, NPB, DNTPD, TCTA, Alq$_3$, Almq$_3$, BeBq$_2$, BAlq, Zn(BOX)$_2$, Zn(BTZ)$_2$, BPhen, BCP, PBD, OXD-7, TPBI, TAZ, p-EtTAZ, DNA, t-BuDNA, and DPVBi, which are previously described. Further, 4,4'-bis(N-carbazolyl)biphenyl (abbreviation: CBP), 1,3,5-tris[4-(N-carbazolyl)phenyl]benzene (abbreviation: TCPB), and the like can also be used. It is preferable that the organic compound, which is added in addition to the second organic compound, have higher excitation energy than the second organic compound and be added in larger quantities than the second organic compound in order that the second organic compound can emit light efficiently (which makes it possible to prevent concentration quenching of the second organic compound). Alternatively, as another function, the organic compound may emit light together with the second organic compound (which makes it possible to emit white light or the like).

The second layer 803 may be formed to have a structure to perform color display by forming light-emitting layers having different emission wavelength ranges in the respective pixels. Typically, light-emitting layers corresponding to R (Red), G (Green), and B (Blue) are formed. Further, by providing the light-emission side of the pixels with a filter which transmit light of the emission wavelength range, color purity can be improved and a pixel portion can be prevented from having a mirror surface (glares). By provision of such filter, a circularly polarizing plate and the like that have conventionally been required can be omitted. Further, the loss of light emitted from the light-emitting layer can be eliminated. Furthermore, changes in color tone, which occur when a pixel portion (a display screen) is viewed obliquely, can be reduced.

Either a low-molecular organic light-emitting material or a high-molecular organic light-emitting material can be used as a material of the second layer 803. A high-molecular organic light-emitting material has higher physical strength than a low-molecular organic light-emitting material and is superior in durability of the element. In addition, since a high-molecular organic light-emitting material can be deposited by coating, fabrication of the element is relatively easy.

The emission color is determined by a material that forms the light-emitting layer; therefore, a light-emitting element which exhibits desired light emission can be formed by selecting an appropriate material for the light-emitting layer. Examples of high-molecular electroluminescent materials that can be used for formation of the light-emitting layer include a polyparaphenylene-vinylene-based material, a polyparaphenylene-based material, a polythiophene-based material, and a polyfluorene-based material.

Examples of the polyparaphenylene-vinylene-based material include derivatives of poly(paraphenylenevinylene) [PPV] such as poly(2,5-dialkoxy-1,4-phenylenevinylene) [RO—PPV], poly(2-(2'-ethyl-hexoxy)-5-methoxy-1,4-phenylenevinylene) [MEH-PPV], and poly(2-(dialkoxyphenyl)-1,4-phenylenevinylene) [ROPh-PPV]. Examples of the polyparaphenylene-based material include derivatives of polyparaphenylene [PPP] such as poly(2,5-dialkoxy-1,4-phenylene) [RO—PPP] and poly(2,5-dihexoxy-1,4-phenylene). Examples of the polythiophene-based material include derivatives of polythiophene [PT] such as poly(3-alkylthiophene) [PAT], poly(3-hexylthiophen) [PHT], poly(3-cyclohexylthiophen) [PCHT], poly(3-cyclohexyl-4-methylthiophene) [PCHMT], poly(3,4-dicyclohexylthiophene) [PDCHT], poly[3-(4-octylphenyl)-thiophene] [POPT], and poly[3-(4-octylphenyl)-2,2bithiophene] [PTOPT]. Examples of the polyfluorene-based material include derivatives of polyfluorene [PF] such as poly(9,9-dialkylfluorene) [PDAF] and poly(9,9-dioctylfluorene) [PDOF].

The second inorganic compound can be any inorganic compound as long as it does not easily quench the light emission of the second organic compound, and various metal oxides or metal nitrides can be used. In particular, oxides of metals of Group 13 or 14 in the periodic table, which do not easily quench the light emission of the second organic compound, are suitable. Specifically, aluminum oxide, gallium oxide, silicon oxide, or germanium oxide can be preferably used. However, the second inorganic compound is not limited to these.

Note that the second layer 803 can also be formed by stacking a plurality of layers each having a combination of the above-described organic compound and inorganic compound. Further, the second layer 803 can also contain another organic compound or inorganic compound. The structure of the light-emitting layer can be changed, and modification thereof is possible without departing the spirit and scope of the invention. For example, instead of providing a specific electron injecting region or light-emitting region, an electrode layer for injecting electrons may be provided or a light-emitting material may be dispersed in the layer.

The light-emitting element formed using the above-described materials emits light when it is forward biased. Pixels of a display device formed using light-emitting elements can be driven by a passive matrix driving method or an active matrix driving method. In either case, each pixel is controlled to emit light upon application of a forward bias at specific timing, whereas the pixel does not emit light during a given period of time. By applying a reverse bias to the light-emitting element in the non-emission period, reliability of the light-emitting element can be improved. Deterioration modes of a light-emitting element include deterioration in which the emission intensity becomes lower under given driving conditions and deterioration in which a non-emission region of a pixel increases and the apparent luminance decreases. However, the deterioration speed can be retarded by performing AC drive in which a forward bias and a reverse bias are alternately applied, whereby reliability of the light-emitting display device can be improved. Further, either digital driving or analog driving can be applied.

In addition, a sealing substrate may be provided with color filters (colored layers). Color filters (colored layers) can be formed by an evaporation method or a droplet discharge method. Using color filters (colored layers) can achieve high-definition display because broad peaks of the RGB emission spectra can be corrected to be sharp.

When a material which exhibits monochromatic light is formed and combined with color filters or color conversion layers, full color display can be performed. The color filters (the colored layers) or the color conversion layers can be formed on, for example, a sealing substrate, and the sealing substrate may be attached to the element substrate.

Needless to say, display of monochromatic light can also be performed. For example, an area-color display device using monochromatic light may be formed. Such an area-color display is suitable for a passive matrix display portion, and can mainly display characters and symbols.

Figure 22A:
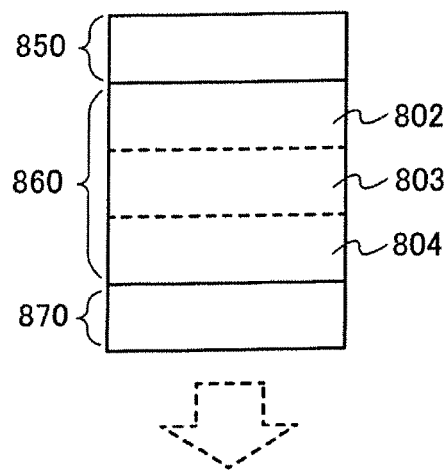
FIGS. 22A to 22D illustrate the structures of light-emitting elements that can be applied to the invention.
Figure 22B:
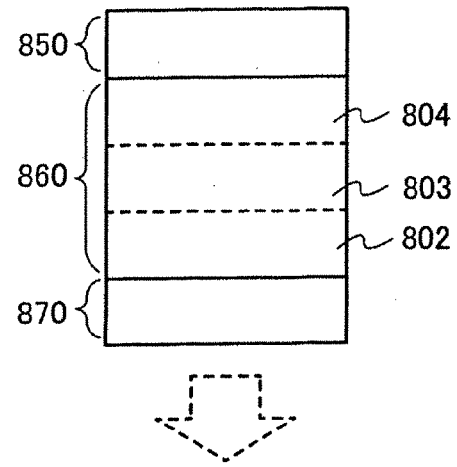

Materials of the first electrode layer 870 and the second electrode layer 850 should be selected in consideration of work functions. Each of the first electrode layer 870 and the second electrode layer 850 can be an anode or a cathode depending on the pixel structure. When a p-channel thin film transistor is used as a driving transistor, it is preferable that the first electrode layer 870 be an anode and the second electrode layer 850 be a cathode as shown in FIG. 22A. Meanwhile, when an n-channel thin film transistor is used as a driving transistor, it is preferable that the first electrode layer 870 be a cathode and the second electrode layer 850 be an anode as shown in FIG. 22B. Materials that can be used for the first electrode layer 870 and the second electrode layer 850 will now be described. When the first electrode layer 870 or the second electrode layer 850 functions as an anode, it is preferably formed with a material having a high work function (specifically, a work function not lower than 4.5 eV). On the other hand, when the first electrode layer 870 or the second electrode layer 850 functions as a cathode, it is preferably formed with a material having a low work function (specifically, a work function not higher than 3.5 eV). However, since the first layer 804 has excellent hole injection/transport properties and the third layer 802 has excellent electron injection/transport properties, the first electrode layer 870 and the second electrode layer 850 can be formed with various materials with few restrictions of work functions.

In the light-emitting elements shown in FIGS. 22A and 22B, light is extracted through the first electrode layer 870. Therefore, the second electrode layer 850 does not necessarily have a light-transmitting property. The second electrode layer 850 may be formed to a total thickness of 100 to 800 nm, using an element selected from among titanium, nickel, tungsten, chromium, platinum, zinc, tin, indium, tantalum, aluminum, copper, gold, silver, magnesium, calcium, lithium, and molybdenum; an alloy material or a compound material containing such an element as a main component such as titanium nitride, titanium silicide nitride, tungsten silicide, tungsten nitride, tungsten silicide nitride, niobium nitride; or a stacked film of such materials.

The second electrode layer 850 can be formed by an evaporation method, a sputtering method, a CVD method, a printing method, a dispensing method, a droplet discharge method, or the like.

When the second electrode layer 850 is formed using a light-transmissive conductive material like a material used for the first electrode layer 870, light is also extracted through the second electrode layer 850, whereby a dual-emission structure can be constructed. In that case, light emitted from the light-emitting element is extracted from both the first electrode layer 870 and the second electrode layer 850.

Note that the light-emitting element of the invention can have various forms by changing the kinds of the first electrode layer 870 and the second electrode layer 850.

FIG. 22B shows an example where the electroluminescent layer 860 has a structure in which the third layer 802, the second layer 803, and the first layer 804 are sequentially stacked over the first electrode layer 870.

As described above, in the light-emitting element of the invention, the electroluminescent layer 860 having a composite layer of an organic compound and an inorganic compound is sandwiched between the first electrode layer 870 and the second electrode layer 850. In addition, the light-emitting element of the invention is an organic-inorganic-composite type light-emitting element which includes layers (i.e., the first layer 804 and the third layer 802) having a carrier injection property and a carrier transport property that are formed by mixing an organic compound and an inorganic compound. Such a carrier injection property and carrier transport property could not be obtained in the case where only one of the organic compound and the inorganic compound is used. When the first layer 804 or the third layer 802 is provided on the side of the first electrode layer 870, it should particularly be a composite layer of an organic compound and an inorganic compound. On the other hand, when the first layer 804 or the third layer 802 is provided on the side of the second electrode layer 850, it may contain only an organic compound or an inorganic compound.

Note that the electroluminescent layer 860 which is a layer having a mixture of an organic compound and an inorganic compound can be formed by various methods. For example, it is possible to use a method of evaporating both an organic compound and an inorganic compound by resistance heating so that the organic compound and the inorganic compound can be co-deposited. Alternatively, it is also possible to use a method of evaporating an organic compound by resistance heating, while at the same time evaporating an inorganic compound by electron beams so that the organic compound and the inorganic compound can be co-deposited. Further, it is also possible to use a method of evaporating an organic compound by resistance heating, while at the same time depositing an inorganic compound by sputtering so that the organic compound and the inorganic compound can be co-deposited. As a further alternative, a wet method can also be used.

Likewise, the first electrode layer 870 and the second electrode layer 850 can also be formed by a resistance beating evaporation method, an EB evaporation method, a sputtering method, a wet method, or the like. Further, each of the first electrode layer 870 and the second electrode layer 850 can also be formed by the method shown in Embodiment Mode 3 which includes the steps of depositing a light-absorbing conductive film on a first substrate and irradiating the light-absorbing conductive film with laser light, so that desired patterns can be selectively transferred to a second substrate.

Figure 22C:
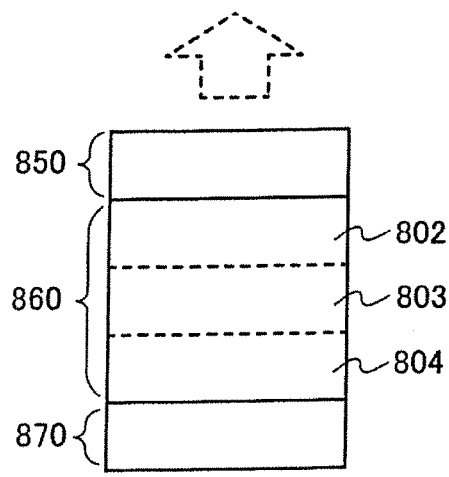
Figure 22D:
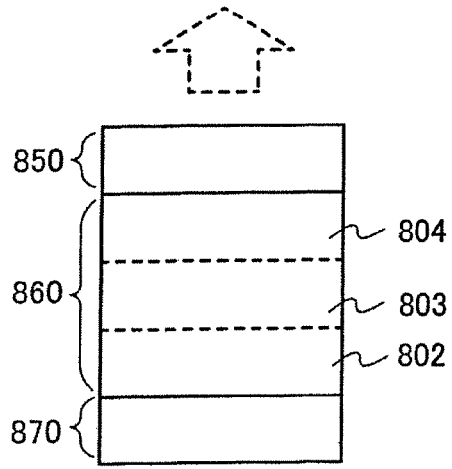

FIG. 22C illustrates a structure in which a reflective electrode layer is used for the first electrode layer 870 and a light-transmissive electrode layer is used for the second electrode layer 850 in FIG. 22A. Light emitted from the light-emitting element is reflected by the first electrode layer 870 so that it passes through the second electrode layer 850. Similarly, FIG. 22D illustrates a structure in which a reflective electrode layer is used for the first electrode layer 870 and a light-transmissive electrode layer is used for the second electrode layer 850 in FIG. 22B. Light emitted from the light-emitting element is reflected by the first electrode layer 870 so that it passes through the second electrode layer 850.

This embodiment mode can be freely combined with another embodiment mode which illustrates a display device having the above-described light-emitting elements. In addition, this embodiment mode can be combined with any of Embodiment Modes 1 to 5 as appropriate.

According to the invention, a display device can be fabricated by a simplified process with a reduced number of complicated photolithography steps. Therefore, waste of materials can be reduced and cost reduction can be achieved. Thus, a display device with high performance and high reliability can be fabricated with high yield.

(Embodiment Mode 8)

This embodiment mode will describe an example of a highly reliable display device that is fabricated at low cost through a simplified process. Specifically, a light-emitting display device that uses light-emitting elements as display elements will be described. The structures of light-emitting elements that can be applied to the display elements of the display device of the invention will be described with reference to FIGS. 23A to 23C and 24A to 24C.

Light-emitting elements using electroluminescence can be roughly classified into light-emitting elements that use an organic compound as a light-emitting material and light-emitting elements that use an inorganic compound as a light-emitting material. Generally, the former light-emitting element is referred to as an organic EL element, while the latter light-emitting element is referred to as an inorganic EL element.

Inorganic EL elements are divided into a dispersion-type inorganic EL element and a thin-film-type inorganic EL element according to their element structures. The difference between the two EL elements lies in that the former dispersion-type inorganic EL element includes an electroluminescent layer in which a particulate light-emitting material is dispersed in a binder, while the latter thin-film-type inorganic EL element includes an electroluminescent layer made of a thin film of a light-emitting material. Although the two light-emitting elements are different in the above points, they have a common characteristic in that both require electrons that are accelerated by a high electric field. As types of light-emission mechanisms, there are luminescence obtained by donor-acceptor recombination which utilizes a donor level and an acceptor level, and local luminescence which utilizes inner-shell electron transition of metal ions. Generally, a dispersion-type inorganic EL element exhibits luminescence through donor-acceptor recombination, while a thin-film-type inorganic EL element exhibits local luminescence in many cases.

A light-emitting material that can be used in the invention contains a base material and an impurity element which serves as a luminescence center. By changing the impurity element to be contained in the light-emitting material, light emission of various colors can be obtained. As a method of forming a light-emitting material, various methods such as a solid-phase method and a liquid-phase method (a coprecipitation method) can be used. Further, an evaporative decomposition method, a double decomposition method, a method utilizing thermal decomposition reaction of a precursor, a reversed micelle method, a method which combines the foregoing method with high-temperature baking, a liquid-phase method such as a freeze-drying method, or the like can also be used.

A solid-phase method is a method which includes the steps of weighing a base material and an impurity element or a compound containing an impurity element, mixing them a mortar, and heating and baking them in an electric furnace, so that reaction occurs and the impurity element is mixed in the base material. The baking temperature is preferably 700 to 1500° C. This is because the solid-phase reaction will not proceed at a too low temperature, whereas the base material will be decomposed at a too high temperature. The baking may be performed in a powder state; however, it is preferably performed in a pellet state. Although the solid-phase method requires baking at a relatively high temperature, the solid-phase method is easy to perform and has high productivity. Thus, it is suitable for mass production.

A liquid-phase method (a coprecipitation method) is a method which includes the steps of reacting a base material or a compound containing a base material with an impurity element or a compound containing an impurity element a solution, drying them, and baking them. Particles of a light-emitting material are uniformly diffused, whereby reaction can proceed even when the particle size is small and the baking temperature is low.

As a base material of a light-emitting material, sulfide, oxide, or nitride can be used. Examples of sulfide include zinc sulfide (ZnS), cadmium sulfide (CdS), calcium sulfide (CaS), yttrium sulfide ($Y_2S_3$), gallium sulfide ($Ga_2S_3$), strontium sulfide (SrS), and barium sulfide (BaS). Examples of oxide include zinc oxide (ZnO) and yttrium oxide ($Y_2O_3$). Examples of nitride include aluminum nitride (AlN), gallium nitride (GaN), and indium nitride (InN). Further, it is also possible to use zinc selenide (ZnSe), zinc telluride (ZnTe), or ternary mixed crystals such as calcium gallium sulfide (CaGa$_2$S$_4$), strontium gallium sulfide (SrGa$_2$S$_4$), and barium gallium sulfide (BaGa$_2$S$_4$), and the like.

For a luminescence center of an EL element which exhibits local luminescence, the following can be used: manganese (Mn), copper (Cu), samarium (Sm), terbium (Tb), erbium (Er), thulium (Tm), europium (Eu), cerium (Ce), praseodymium (Pr), and the like. Note that a halogen element such as fluorine (F) or chlorine (Cl) may also be added. A halogen element can function to compensating charges.

Meanwhile, for a luminescence center of an EL element which exhibits luminescence through donor-acceptor recombination, a light-emitting material containing a first impurity element which forms a donor level and a second impurity element which forms an acceptor level can be used. Examples of the first impurity element include fluorine (F), chlorine (Cl), and aluminum (Al). Meanwhile, examples of the second impurity element include copper (Cu) and silver (Ag).

In the case of synthesizing a light-emitting material of an EL element which exhibits luminescence through donor-acceptor recombination by using a solid-phase method, the following steps are performed: weighing a base material, weighing a first impurity element or a compound containing the first impurity element, weighing a second impurity element or a compound containing the second impurity element, mixing them in a mortar, heating and baking them in an electric furnace. As a base material, the above-described base materials can be used. As a first impurity element or a compound containing the first impurity element, fluorine (F), chlorine (Cl), aluminum sulfide (Al$_2$S$_3$), or the like can be used, for example. As a second impurity element or a compound containing the second impurity element, copper (Cu), silver (Ag), copper sulfide (Cu$_2$S), silver sulfide (Ag$_2$S), or the like can be used, for example. The baking temperature is preferably 700 to 1500° C. This is because the solid-phase reaction will not proceed at a too low temperature, whereas the base material will be decomposed at a too high temperature. The baking may be performed in a powder state; however, it is preferably performed in a pellet state.

In the case of performing solid-phase reaction, it is also possible to use a compound containing the first impurity element and the second impurity element. In that case, the impurity elements can be easily diffused, and solid-phase reaction can easily proceed; therefore, a uniform light-emitting material can be obtained. Further, since unnecessary impurity elements are not be mixed, a light-emitting material with high purity can be obtained. Examples of the compound containing the first impurity element and the second impurity element include chloride (CuCl) and silver chloride (AgCl).

Note that the concentration of the impurity elements with respect to the base material may be 0.01 to 10 atomic %, preferably 0.05 to 5 atomic %.

With regard to a thin-film-type inorganic EL element, an electroluminescent layer is a layer containing the above-described light-emitting materials, which can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as a metal organic CVD method or a low-pressure hydride transport CVD method, an atomic layer epitaxy (ALE) method, or the like.

Figure 23A:
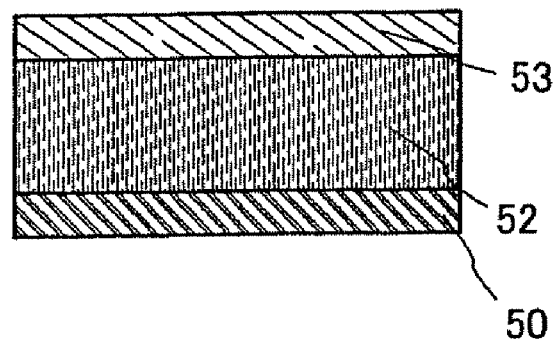
FIGS. 23A to 23C illustrate the structures of light-emitting elements that can be applied to the invention.
Figure 23B:
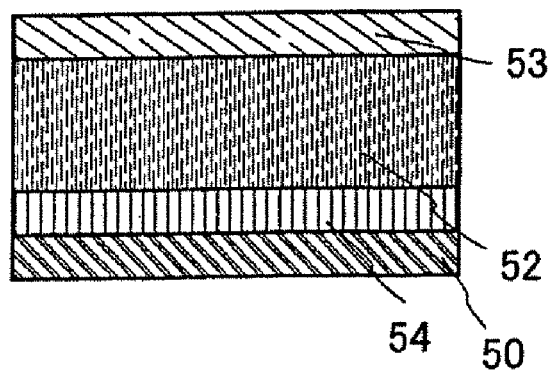
Figure 23C:
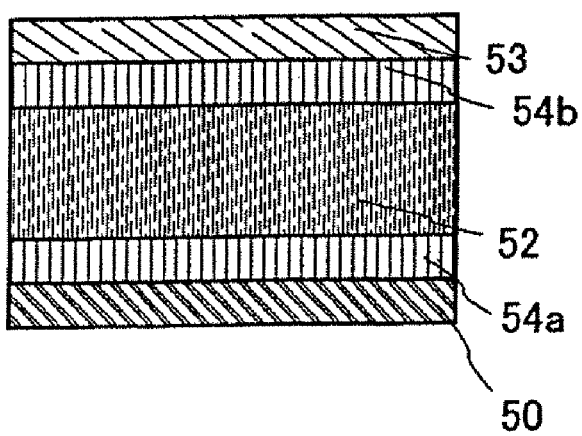

FIGS. 23A to 23C each show an example of a thin-film-type inorganic EL element that can be used as a light-emitting element. Each of the light-emitting elements shown in FIGS. 23A to 23C includes a first electrode layer 50, an electroluminescent layer 52, and a second electrode layer 53.

The light-emitting elements shown in FIGS. 23B and 23C each have a structure in which an insulating layer is provided between the electrode layer and the electroluminescent layer of the light-emitting element shown in FIG. 23A. The light-emitting element shown in FIG. 23B has an insulating layer 54 between the first electrode layer 50 and the electroluminescent layer 52. The light-emitting element shown in FIG. 23C has an insulating layer 54a between the first electrode layer 50 and the electroluminescent layer 52, and an insulating layer 54b between the second electrode layer 53 and the electroluminescent layer 52. As described above, the insulating layer may be provided between one or each of the pair of electrode layers and the electroluminescent layer. In addition, the insulating layer can be either a single layer or a plurality of stacked layers.

Although the insulating layer 54 in FIG. 23B is provided to be in contact with the first electrode layer 50, the insulating layer 54 may also be provided to be in contact with the second electrode layer 53 by reversing the order of the insulating layer and the electroluminescent layer.

In the case of forming a dispersion-type inorganic EL element, a film-form electroluminescent layer is formed by dispersing a particulate light-emitting material in a binder. When particles with a desired size cannot be obtained depending on a method of forming a light-emitting material, the material may be processed into particulate forms by being ground in a mortar or the like. A binder is a substance for fixing a particulate light-emitting material to be in a dispersed state in order to keep the shape of the electroluminescent layer. A light-emitting material is uniformly dispersed and fixed in the electroluminescent layer by the binder.

The electroluminescent layer of the dispersion-type inorganic EL element can be also formed by a droplet discharging method by which an electroluminescent layer can be selectively formed, a printing method (e.g., screen printing or offset printing), a coating method such as a spin coating method, a dipping method, a dispensing method, or the like. The thickness of the electroluminescent layer is not limited to a specific value; however, it is preferably in the range of 10 to 1000 nm. In the electroluminescent layer which contains a light-emitting material and a binder, the percentage of the light-emitting material is preferably 50 to 80 w %.

Figure 24A:
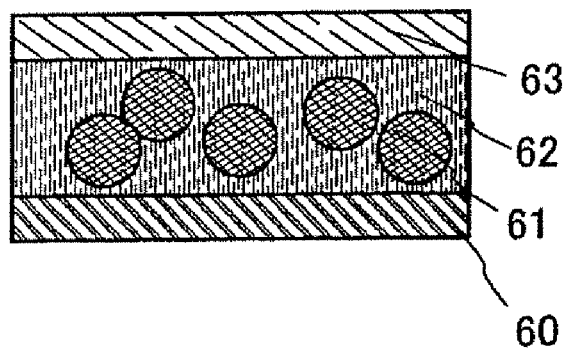
FIGS. 24A to 24C illustrate the structures of light-emitting elements that can be applied to the invention.
Figure 24B:
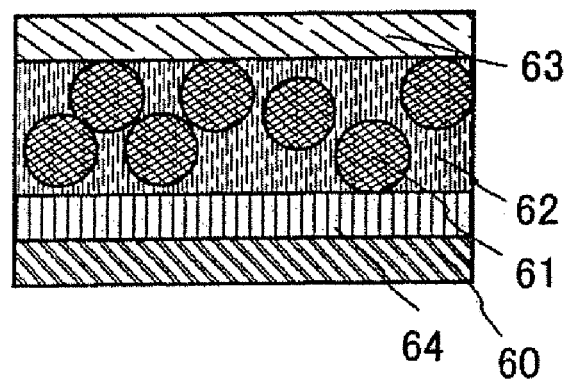
Figure 24C:
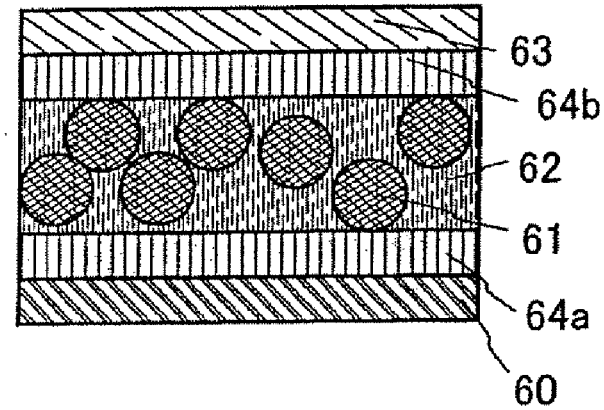

FIGS. 24A to 24C each show an example of a dispersion-type inorganic EL element that can be used as a light-emitting element. The light-emitting element shown in FIG. 24A has a structure in which a first electrode layer 60, an electroluminescent layer 62, and a second electrode layer 63 are stacked, and the electroluminescent layer 62 contains a light-emitting material 61 fixed by a binder.

Each of the first electrode layers 50 and 60 and the second electrode layers 53 and 63 can be formed by the method shown in Embodiment Mode 3 which includes the steps of depositing a light-absorbing conductive film on a first substrate and irradiating the light-absorbing conductive film with laser light, so that desired patterns can be selectively transferred to a second substrate.

In this embodiment mode, an insulating material can be used as a binder. Either an organic material or an inorganic material can be used, or even a mixed material of an organic material and an inorganic material can be used. As an organic insulating material, the following resins can be used: a polymer having a relatively high dielectric constant such as a cyanoethyl cellulose resin, a polyethylene resin, a polypropylene resin, a polystyrene resin, a silicone resin, an epoxy resin, and vinylidene fluoride. Further, it is also possible to use thermally stable polymers such as aromatic polyamide and polybenzimidazole, or a siloxane resin. Note that a siloxane resin is a resin having the bond of Si—O—Si. Siloxane has a skeletal structure with the bond of silicon (Si) and oxygen (O). As a substituent of siloxane, an organic group containing at least hydrogen (e.g., an alkyl group or aromatic hydrocarbon) is used. Alternatively, a fluoro group may be used as the substituent, or both a fluoro group and an organic group containing at least hydrogen may be used as the substituent. Further, it is also possible to use resin materials such as a vinyl resin (e.g. polyvinyl alcohol or polyvinyl butyral), a phenol resin, a novolac resin, an acrylic resin, a melamine resin, a urethane resin, or an oxazole resin (e.g., polybenzoxazole). When high-dielectric-constant microparticles such as barium titanate ($BaTiO_3$), strontium titanate ($SrTiO_3$), and the like are mixed as appropriate into the above-described resin, the dielectric constant of the material can be controlled.

As an inorganic insulating material contained in the binder, the following materials can be used: silicon oxide ($SiO_x$), silicon nitride, silicon containing oxygen and nitrogen, aluminum nitride (AlN), aluminum containing oxygen and nitrogen, aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), and other inorganic insulating materials. When a high-dielectric-constant inorganic material is mixed into an organic material (by doping or the like), it becomes possible to control the dielectric constant of the electroluminescent layer which contains a light-emitting material and a binder more efficiently, whereby the dielectric constant can be further increased. When a mixed layer of an inorganic material and an organic material is used as a binder to obtain a high dielectric constant, larger charge can be induced by a light-emitting material.

In the fabrication process, a light-emitting material is dispersed in a solution containing a binder. As a solvent of the solution containing a binder that can be used in this embodiment mode, it is preferable to select a solvent in which a binder material can be dissolved and with which a solution having a viscosity suitable for a method of forming the electroluminescent layer (various wet processes) and a desired film thickness can be formed. An organic solvent or the like can be used. For example, when a siloxane resin is used as a binder, organic solvents such as propylene glycolmonomethyl ether, propylene glycolmonomethyl ether acetate (also referred to as PGMEA), and 3-methoxy-3-methyl-1-butanol (also referred to as MMB) can be used.

The light-emitting elements shown in FIGS. 24B and 24C each have a structure in which an insulating layer is provided between the electrode layer and the electroluminescent layer of the light-emitting element shown in FIG. 24A. The light-emitting element shown in FIG. 24B has an insulating layer 64 between the first electrode layer 60 and the electroluminescent layer 62. The light-emitting element shown in FIG. 24C has an insulating layer 64a between the first electrode layer 60 and the electroluminescent layer 62, and an insulating layer 64b between the second electrode layer 63 and the electroluminescent layer 62. As described above, the insulating layer may be provided between one or each of the pair of electrode layers and the electroluminescent layer. In addition, the insulating layer can be either a single layer or a plurality of stacked layers.

In addition, although the insulating layer 64 is provided to be in contact with the first electrode layer 60 in FIG. 24B, the insulating layer 64 may also be provided to be in contact with the second electrode layer 63 by reversing the order of the insulating layer and the electroluminescent layer.

Although the insulating layers 54 and 64 shown in FIGS. 23B, 23C, 24B and 24C are not particularly limited to certain types, such insulating layers preferably have a high dielectric strength voltage and dense film quality. Further, such insulating layers preferably have a high dielectric constant. For example, the following materials can be used: silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), and the like. Alternatively, a mixed film of such materials or a stacked film containing two or more of such materials can also be used. Such insulating layers can be formed by sputtering, evaporation, CVD, or the like. Alternatively, it is also possible to form an insulating layer by dispersing a particulate insulating material in a binder. The binder material may be formed using a material and method similar to those of the binder contained in the electroluminescent layer. Although the thickness of such an insulating layer is not particularly limited, it is preferably in the range of 10 to 1000 nm.

The light-emitting element shown in this embodiment mode emits light when a voltage is applied across the pair of electrode layers which sandwich the electroluminescent layer, and can be operated by either DC driving or AC driving.

According to the invention, a display device can be fabricated by a simplified process with a reduced number of complicated photolithography steps. Therefore, waste of materials can be reduced and cost reduction can be achieved. Thus, a display device with high performance and high reliability can be fabricated with high yield.

This embodiment mode can be combined with any of Embodiment Modes 1 to 5 as appropriate.

(Embodiment Mode 9)

This embodiment mode will describe an example of a highly reliable display device that is fabricated at low cost through a simplified process. Specifically, a liquid crystal display device that uses liquid crystal display elements as display elements will be described.

Figure 19A:
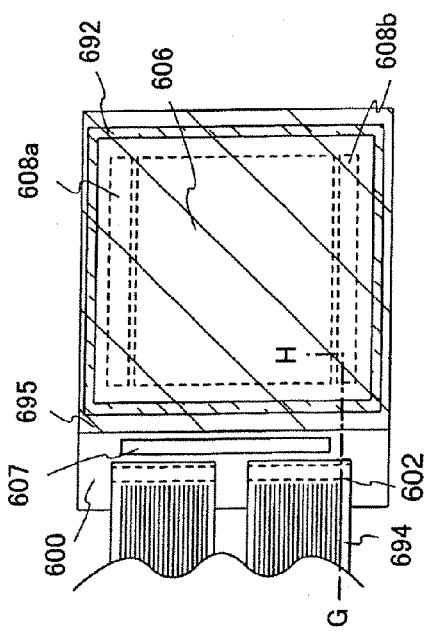
FIGS. 19A and 19B illustrate a display device of the invention.
Figure 19B:
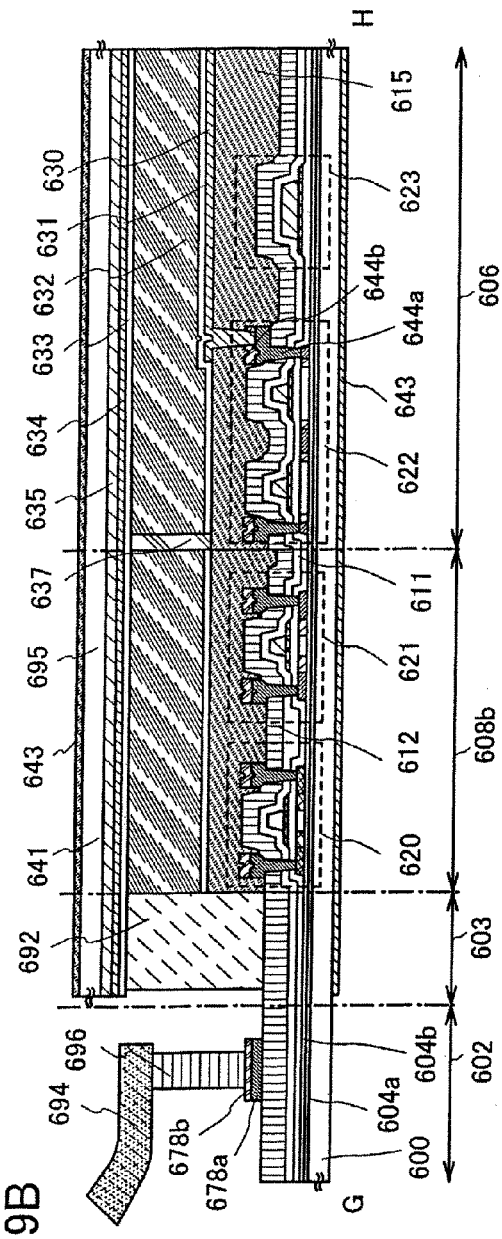

FIG. 19A is a plan view of a liquid crystal display device, and FIG. 19B is a cross-sectional view taken along line G-H of FIG. 19A.

As shown in FIG. 19A, a pixel region 606 and driver circuit regions 608a and 608b which are scan line driver circuits are sealed between a substrate 600 and a counter substrate 695 with a sealant 692. In addition, a driver circuit region 607 which is a signal line driver circuit constructed from IC drivers is provided on the substrate 600. A transistor 622 and a capacitor 623 are provided in the pixel region 606. A driver circuit having transistors 620 and 621 is provided in the driver circuit region 608b. An insulating substrate similar to those described in the preceding embodiment modes can be used for the substrate 600. Although it is concerned that a substrate made of a synthetic resin may have a low temperature limit in general when compared with other substrates, the synthetic resin substrate can be used when the following steps are performed: forming circuit components on a highly heat-resistant substrate and then transferring them to a synthetic resin substrate. Note that reference numerals 602 and 603 in FIG. 19B denote an external terminal connection region and a sealing region, respectively.

In the pixel region 606, the transistor 622 to serve as a switching element is provided over the base films 604a and 604b. In this embodiment mode, a multi-gate thin film transistor (TFT) is used for the transistor 622, which includes a semiconductor layer having impurity regions functioning as source and drain regions, a gate insulting layer, a gate electrode layer having a two-layer structure, and source and drain electrode layers. The source or drain electrode layer is in contact with and electrically connected to the impurity region of the semiconductor layer and a pixel electrode layer 630.

The source or drain electrode layer has a stacked-layer structure. Source or drain electrode layers 644a and 644b are electrically connected to the pixel electrode layer 630 at an opening formed in an insulating layer 615.

In this embodiment mode, each of a gate insulating layer, an insulating film 611, and an insulating film 612 is formed to have openings which expose source and drain regions of the semiconductor layer as shown in Embodiment modes 1 and 2. Specifically, in the step of forming each of the gate insulating layer, the insulating film 611, and the insulating film 612, masks are provided in regions where the openings are to be formed, so that the insulating film is formed in regions excluding the masks. After the formation of the insulating film, the masks are removed physically or chemically, so that an insulating layer having openings in the regions where the masks have been provided is formed. Thus, the gate insulating layer, the insulating film 611, and the insulating film 612 each of which has openings above the source and drain regions of the semiconductor layer are formed, so that the source and drain regions of the semiconductor layer that are located below the gate insulating layer, the insulating film 611, and the insulating film 612 are exposed at the bottom of the openings.

Either of the following steps can be performed: (1) forming openings which expose the source and drain regions of the semiconductor layer in each formation step of the gate insulating layer, the insulating film 611, and the insulating film 612 by using the invention, or (2) forming the upper insulating film 612 to have openings above the source and drain regions of the semiconductor layer, and then etching the insulating film 611 and the gate insulating layer by using the insulating film 612 having the openings as masks, thereby forming openings which expose the source and drain regions of the semiconductor layer.

The shape of the opening reflects the shape of the mask. Therefore, any mask with which an opening with a desired shape can be formed is acceptable. The mask can have a columnar shape (e.g., a prism, a cylinder, or a triangular prism), a needle shape, or the like. Further, after the formation of the opening, the conductive layer exposed at the bottom of the opening may be removed by etching, using the insulating layer having the opening as a mask.

In FIG. 19B, the invention can also be applied to the formation of an opening for electrical connection between the pixel electrode layer 630 and the source or drain electrode layers 644a and 644b. In addition, the depth direction of the opening can be determined by the force generated upon providing the mask and by the film strength of the conductive layer (in FIG. 19B, the source or drain electrode layers 644a and 644b) that is provided with the mask. When a needle-shaped mask having a sharp end is provided in such a manner that a part of the sharp end sticks into the conductive layer, an opening with a recessed portion can be formed in the conductive layer. The display device shown in FIG. 19B is an example where the source or drain electrode layer 644a is exposed at the bottom of the opening.

The insulating layers (such as the gate insulating layer, the insulating film 611, and the insulating film 612) can be formed by an evaporation method, a PVD (Physical Vapor Deposition) method such as a sputtering method, a CVD (Chemical Vapor Deposition) method such as a low-pressure CVD (LPCVD) method or a plasma CVD method, or the like. In the invention, a region above the conductive layer where the opening is to be formed is physically blocked with a mask so that the material for forming the insulating layer does not adhere to the conductive layer. Thus, a non-formation region of the insulating layer can be determined physically and, therefore, an insulating layer having an opening can be formed with high accuracy. Thus, using the invention can fabricate a highly reliable semiconductor device and display device with high yield.

According to the invention, an insulating layer having an opening can be selectively formed without using a photolithography process. Therefore, the number of steps and materials can be reduced.

A source or drain electrode layer is formed in the opening where the source or drain region of the semiconductor layer is exposed, whereby the source or drain region of the semiconductor layer can be electrically connected to the source or drain electrode layer.

Thin film transistors can be formed by various methods. For example, a crystalline semiconductor film is used as an active layer. A gate electrode is provided over the crystalline semiconductor film with a gate insulating film interposed therebetween. Then, the active layer can be doped with an impurity element, using the gate electrode as a mask. In this manner, when the active layer is doped with an impurity element using the gate electrode, a doping mask is not required. A gate electrode can have either a single-layer structure or a stacked-layer structure. Impurity regions can be formed as either high-concentration impurity regions or low-concentration impurity regions by controlling the concentration of the impurity element. A thin film transistor having low-concentration impurity regions is referred to as an LDD (Lightly Doped Drain) structure. Further, the low-concentration impurity regions may be formed to overlap with the gate electrode. A thin film transistor having such a structure is referred to as a GOLD (Gate Overlapped LDD) structure. Thin film transistors in this embodiment mode are formed to be an n-channel type by using phosphorus (P) for the impurity regions. When forming p-channel thin film transistors, boron (B) or the like may be used. After that, the insulating films 611 and 612 are formed. Dangling bonds of the crystalline semiconductor film can be terminated by a hydrogen element mixed in the insulating film 611 (and the insulating film 612).

Further, in order to increase planarity, an insulating layer 615 may be formed as an interlayer insulating layer. The insulating layer 615 can be formed using an organic material, an inorganic material, or a stacked structure of them. For example, the insulating layer 615 can be formed using a material selected from among silicon oxide, silicon nitride, silicon oxynitride, silicon nitride oxide, aluminum nitride, aluminum oxynitride which contains more oxygen than nitrogen, aluminum nitride oxide which contains more nitrogen than oxygen, aluminum oxide, diamond-like carbon (DLC), polysilazane, carbon containing nitrogen, PSG (phosphosilicate glass), BPSG (borophosphosilicate glass), alumina, and other inorganic insulating materials. Further, an organic insulating material can also be used. The organic material can be either photosensitive or non-photosensitive. For example, polyimide, acrylic, polyamide, polyimide amide, resist, benzocyclobutene, a siloxane resin, or the like can be used. Note that a siloxane resin is a resin having the bond of Si—O—Si. Siloxane has a skeletal structure with the bond of silicon (Si) and oxygen (O). As a substituent of siloxane, an organic group containing at least hydrogen (e.g., an alkyl group or aromatic hydrocarbon) is used. Alternatively, a fluoro group may be used as the substituent, or both a fluoro group and an organic group containing at least hydrogen may be used as the substituent.

When a crystalline semiconductor film is used, a pixel region and a driver circuit region can be formed over the same substrate. In that case, transistors in the pixel portion and transistors in the driver circuit region 608b are formed at the same time. Transistors used for the driver circuit region 608b constitute a CMOS circuit. Although the thin film transistors that constitute the CMOS circuit have a GOLD structure, an LDD structure like the transistor 622 can also be used.

The structures of thin film transistors are not limited to those shown in this embodiment mode. For example, thin film transistors in the pixel region may have any of a single-gate structure in which one channel formation region is formed, a double-gate structure in which two channel formation regions are formed, and a triple-gate structure in which three channel formation regions are formed. Further, thin film transistors in the peripheral driver circuit region may also have any of a single-gate structure, a double-gate structure, and a triple-gate structure.

Note that the invention can be applied not only to the structures of the thin film transistors shown in this embodiment mode but also to a top-gate structure (e.g., a staggered thin film transistor), a bottom-gate structure (e.g., an inversely staggered thin film transistor), or a dual-gate structure in which two gate electrode layers are provided above and below a channel region with gate insulating films interposed therebetween, and another structure.

Next, an insulating layer 631 called an alignment film is formed so as to cover the pixel electrode layer 630 by a printing method or a droplet discharge method. Note that when a screen printing method or an offset printing method is used, the insulating layer 631 can be formed selectively. After that, rubbing treatment is applied. This rubbing treatment may not be performed depending on modes of liquid crystals, e.g., a VA mode. The same can be said for an insulating layer 633 functioning as an alignment film. Next, a sealant 692 is formed in a peripheral region of pixels by a droplet discharge method.

Then, a counter substrate 695, which has the insulating layer 633 functioning as the alignment film, a conductive layer 634 functioning as a counter electrode, a colored layer 635 functioning as a color filter, and a polarizer 641 (also referred to as a polarizing plate), is attached to the substrate 600 that is a TFT substrate with a spacer 637 interposed therebetween. A gap between the two substrates is provided with a liquid crystal layer 632. The liquid crystal display device in this embodiment mode is a transmission type. Therefore, a polarizer (a polarizing plate) 643 is also provided on the side opposite to the surface of the substrate 600 having elements. The polarizer can be provided on the substrate with an adhesive layer. In addition, a filler may be mixed in the sealant and further, a light-shielding film (black matrix) or the like may be formed on the counter substrate 695. When the liquid crystal display device is formed to be a color display device, color filters and the like may be formed using materials which exhibit red (R), green (G), and blue (B) colors. On the other hand, when the liquid crystal display device is formed to be a monochrome display device, colored layers are not required. Alternatively, a colored layer which exhibits at least one color may be formed.

Note that when a successive additive color mixture method (a field sequential method) is employed in which RGB light-emitting diodes (LEDs) and the like are used as a backlight and color display is performed by a time division method, color filters may not be provided. The black matrix, which can reduce reflection of external light by wirings of transistors or CMOS circuits, is preferably provided so as to overlap with the transistors or the CMOS circuits. Note that the black matrix may also be provided so as to overlap with a capacitor, in which case reflection of light by metal films of the capacitor can be prevented.

The liquid crystal layer can be formed by a dispensing method (a dropping method) or an injection method in which the substrate 600 having elements and the counter substrate 695 are bonded first and then liquid crystals are injected into a space therebetween by using a capillary phenomenon. When handling a large substrate to which the injection method is difficult to be applied, the dropping method is preferably used.

The spacer can be provided by dispersing particles with a size of several μm. In this embodiment mode, however, a method of forming a resin film over the entire surface of the substrate, followed by etching is employed. After applying such a spacer material by a spinner, the material is subjected to exposure and developing treatment, so that a desired pattern is formed. Further, the material is heated at 150 to 200° C. in a clean oven or the like so as to be hardened. Although the shape of the spacer formed in the above manner can vary depending on the conditions of exposure and developing treatment, the shape of the spacer is preferably a columnar shape with a flat top. This is because mechanical strength that is high enough as a liquid crystal display device can be secured upon attaching the counter substrate to the TFT substrate. The shape of the spacer can also be conic or pyramidal, but the invention is not limited thereto.

Next, an FPC 694 which is a connection wiring board is connected to terminal electrode layers 678a and 678b that are electrically connected to the pixel region, with an anisotropic conductive layer 696 interposed therebetween. The FPC 694 functions to transmit signals and potentials from outside. Through the above-described steps, a liquid crystal display device having a display function can be fabricated.

The wirings and the gate electrode layers of the transistors, the pixel electrode layer 630, and the conductive layer 634 functioning as the counter electrode layer can be formed using the following materials: indium tin oxide (ITO), indium zinc oxide (IZO) in which zinc oxide (ZnO) is mixed with indium oxide, a conductive material in which silicon oxide ($SiO_2$) is mixed with indium oxide, organic indium, organo-tin, indium oxide containing tungsten oxide, indium zinc oxide containing tungsten oxide, indium oxide containing titanium oxide, indium tin oxide containing titanium oxide, or the like. Alternatively, it is also possible to use metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag), or an alloy or nitride of such metals.

A retardation plate may also be provided between the polarizing plate and the liquid crystal layer.

Although a TN liquid crystal panel is shown in this embodiment mode, the above-described process can be similarly applied to liquid crystal panels of other modes. For example, this embodiment mode can be applied to an IPS (In-Plane-Switching) mode liquid crystal panel in which liquid crystals are aligned parallel with the glass substrate by application of an electric filed. Further, this embodiment mode can also be applied to a VA (Vertical Alignment) mode liquid crystal panel.

Figure 5:
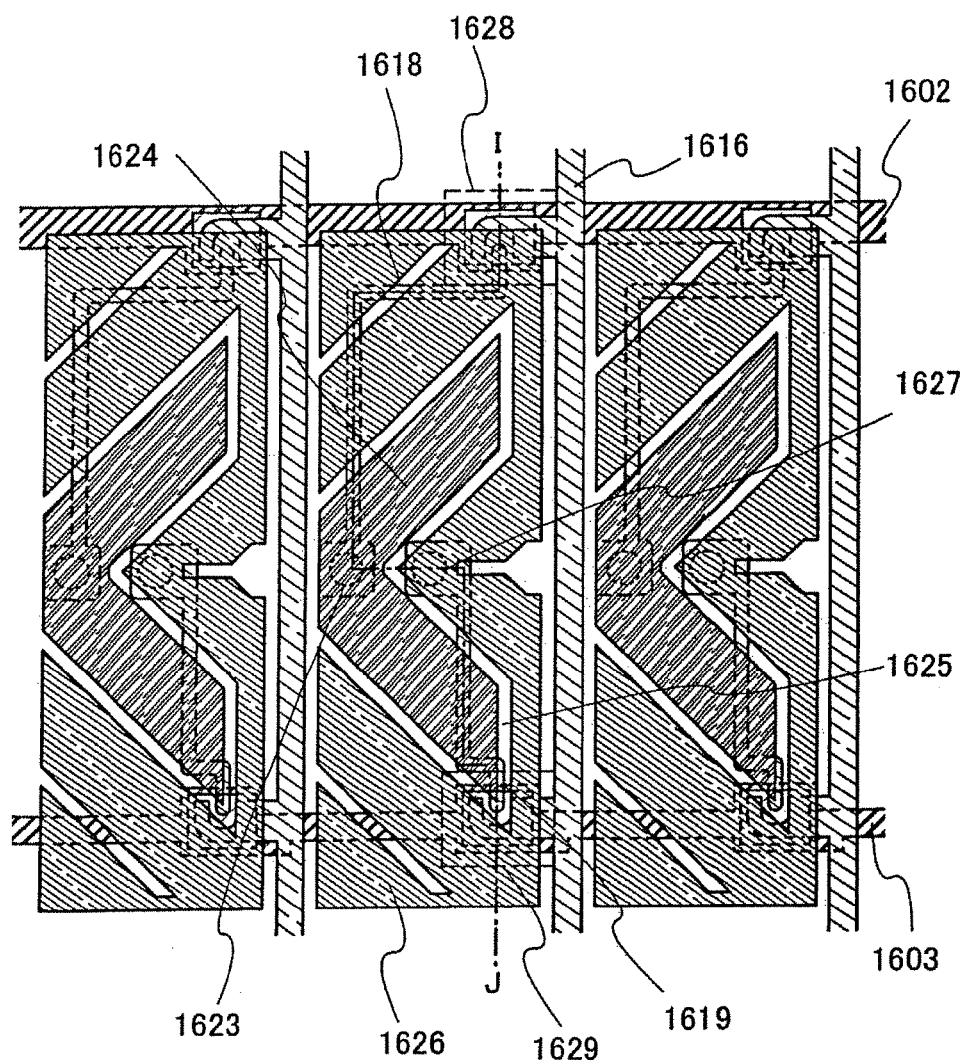
FIG. 5 illustrates a display device of the invention.
Figure 6:
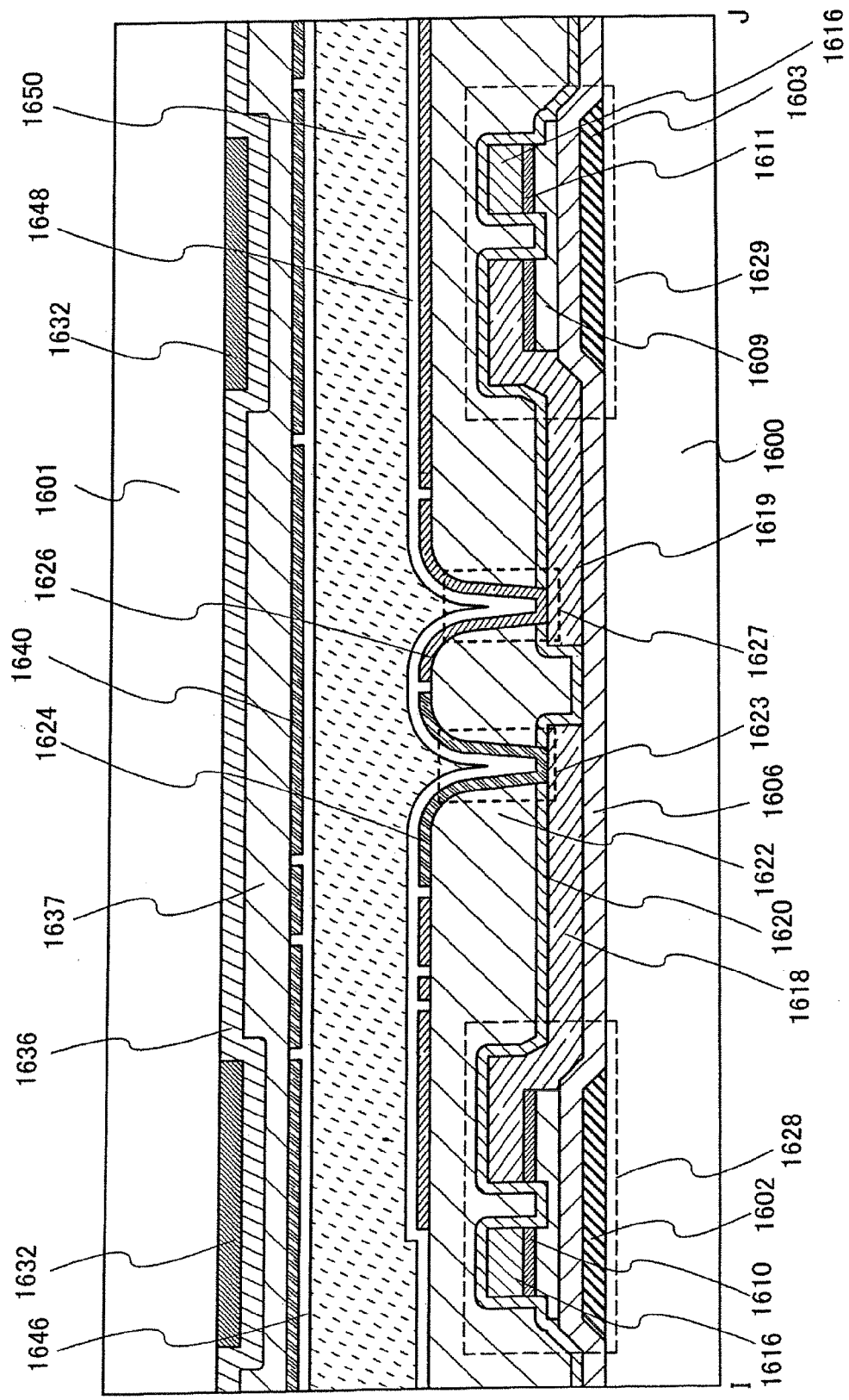
FIG. 6 illustrates a display device of the invention.

FIGS. 5 and 6 each show the pixel structure of a VA mode liquid crystal panel. FIG. 5 is a plan view and FIG. 6 shows a cross-sectional structure taken along line I-J of FIG. 5. Description below will be given with reference to both the drawings.

In this pixel structure, a plurality of pixel electrodes are provided in one pixel, and a TFT is connected to each pixel electrode. The plurality of TFTs are constructed so as to be driven by different gate signals. That is, signals that are applied to individual pixel electrodes in a multi-domain pixel are controlled independently of each other.

A pixel electrode layer 1624 is connected to a TFT 1628 through a wiring layer 1618 at an opening (a contact hole) 1623. In addition, a pixel electrode layer 1626 is connected to a TFT 1629 through a wiring layer 1619 at an opening (a contact hole) 1627. A gate wiring layer 1602 of the TFT 1628 and a gate electrode layer 1603 of the TFT 1629 are separated so as to be supplied with different gate signals. On the other hand, a wiring layer 1616 functioning as a data line is used in common by both the TFTs 1628 and 1629.

Each of the pixel electrode layers 1624 and 1626 can be formed by the method shown in Embodiment Mode 3 which includes the steps, of depositing a light-absorbing conductive film on a first substrate and irradiating the light-absorbing conductive film with laser light, so that desired patterns can be selectively transferred to a second substrate. In this manner, the use of the invention can simplify a process and prevent waste of materials; therefore, a display device can be fabricated at low cost with high productivity.

The pixel electrode layers 1624 and 1626 have different shapes, and they are separated by a slit 1625. The pixel electrode layer 1626 is formed so as to surround the pixel electrode layer 1624 that expands into a V-shape. Application timing of voltages to the pixel electrode layers 1624 and 1626 is varied by the TFTs 1628 and 1629, whereby the orientation of liquid crystals 1650 is controlled. A counter substrate 1601 is provided with a light-shielding film 1632, a colored layer 1636, and a counter electrode layer 1640. In addition, a planarization film 1637 is formed between the colored layer 1636 and the counter electrode layer 1640 so as to prevent disorder of orientation of the liquid crystals 1650.

Note that in FIG. 6, reference numeral 1600 denotes a substrate, reference numeral 1606 denotes a gate insulating layer, reference numerals 1610 and 1611 denote semiconductor layers having one conductivity type, reference numerals 1620 and 1622 denote insulating layers, and reference numerals 1646 and 1648 denote alignment films.

Figure 7:
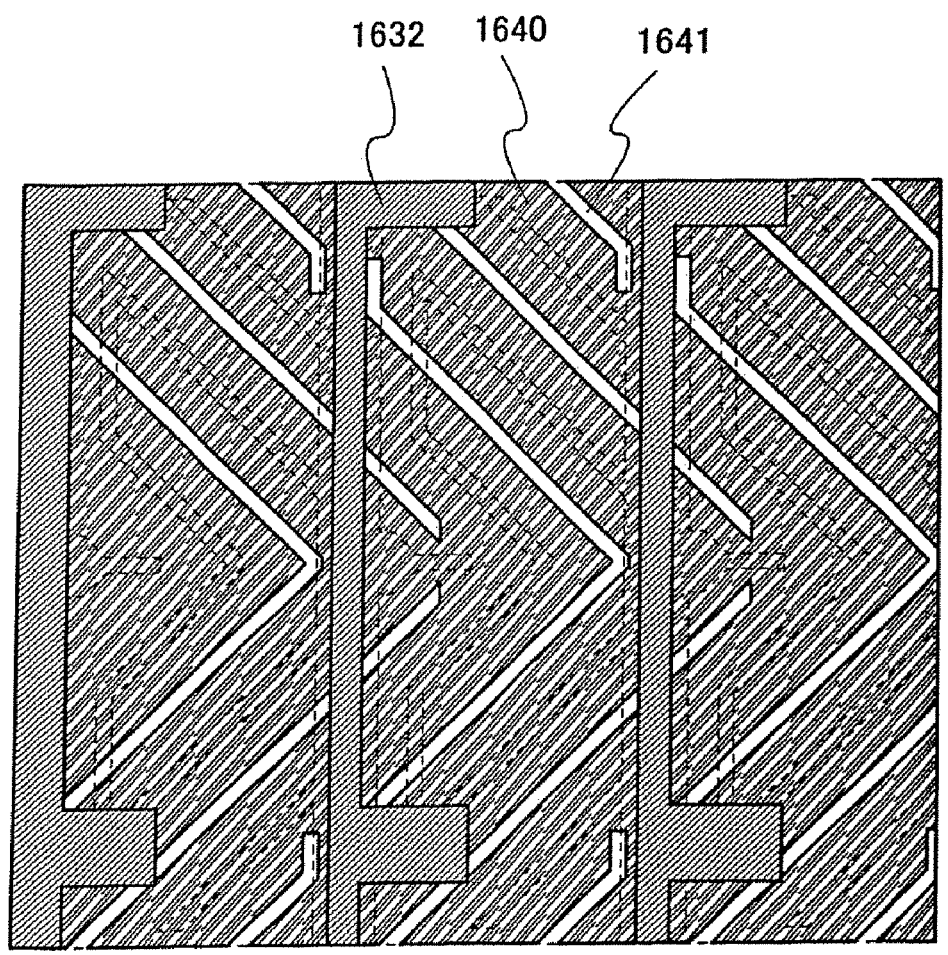
FIG. 7 illustrates a display device of the invention.

FIG. 7 shows the structure of the counter substrate side. The counter electrode layer 1640 is used in common by different pixels and has a slit 1641. The slit 1641 and the slit 1625 on the side of the pixel electrode layers 1624 and 1626 are arranged so as to alternately engage with each other, whereby an oblique electric field can be effectively generated to control the orientation of liquid crystals. Accordingly, the orientation of the liquid crystals can be varied in different places, so that the viewing angle is widened.

As described above, a liquid crystal panel can be fabricated by using a composite material of an organic compound and an inorganic compound for a pixel electrode layer. When such a pixel electrode layer is used, it is not necessary to use a transparent conductive film containing indium as a main component, and bottleneck of materials can be overcome.

This embodiment mode can be combined with any of Embodiment Modes 1 to 3 as appropriate.

According to the invention, a display device can be fabricated by a simplified process with a reduced number of complicated photolithography steps. Therefore, waste of materials can be reduced and cost reduction can be achieved. Thus, a display device with high performance and high reliability can be fabricated with high yield.

(Embodiment Mode 10)

This embodiment mode will describe an example of a highly reliable display device that is fabricated at low cost through a simplified process. Specifically, a liquid crystal display device that uses liquid crystal display elements as display elements will be described.

Figure 18:
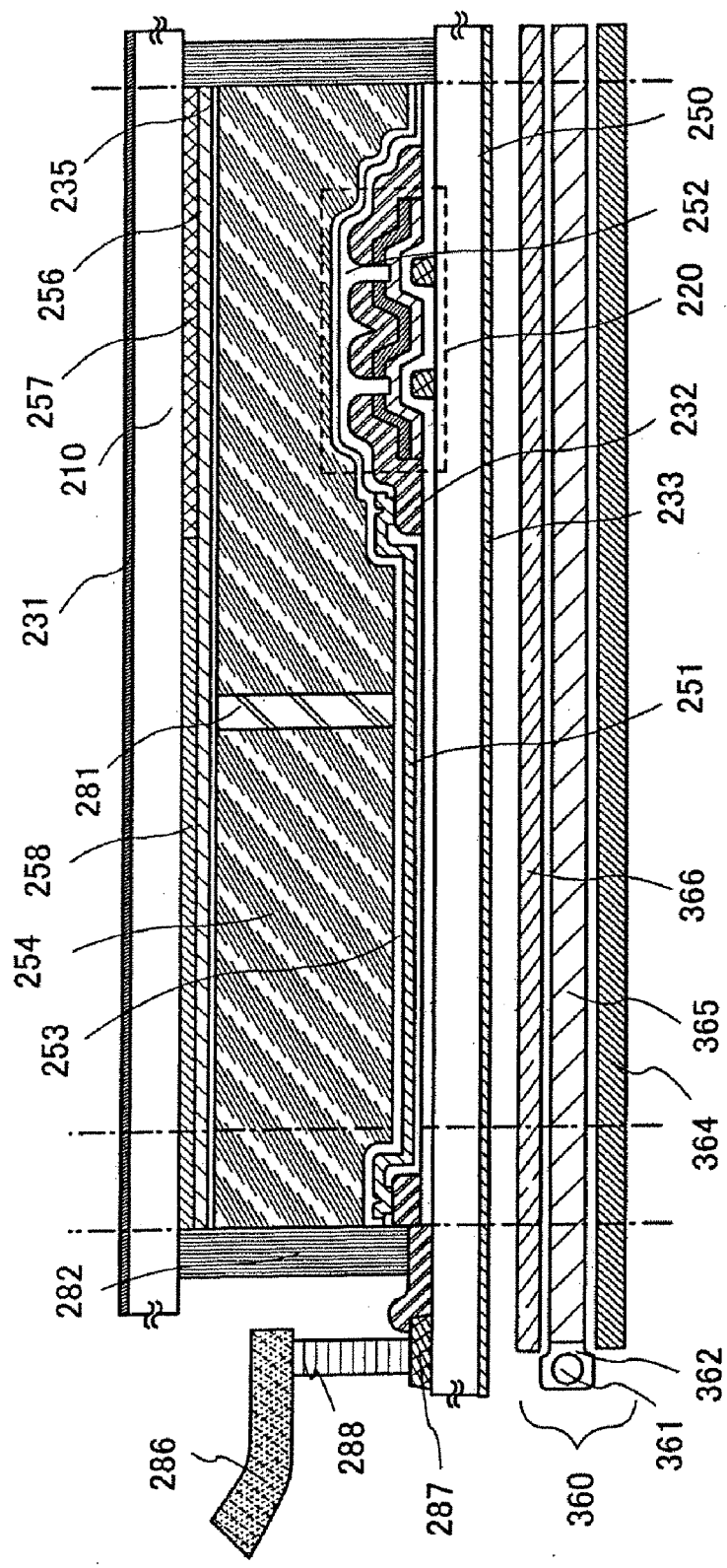
FIG. 18 illustrates a display device of the invention.

A display device shown in FIG. 18 includes over a substrate 250 a transistor 220 which is an inversely staggered thin film transistor, a pixel electrode layer 251, insulating layers 252 and 253, a liquid crystal layer 254, a spacer 281, an insulating layer 235, a counter electrode layer 256, a color filter 258, a black matrix 257, a counter substrate 210, and polarizing plates (polarizers) 231 and 233 in a pixel region; and includes a sealant 282, a terminal electrode layer 287, an anisotropic conductive layer 288, and an FPC 286 in a sealing region.

Each of a gate electrode layer, a semiconductor layer, a source electrode layer, and a drain electrode layer of the transistor 220 which is the inversely staggered thin film transistor as well as the pixel electrode 251 can be formed by the method shown in Embodiment Mode 3 which includes the steps of depositing a light-absorbing film of a conductive material or a semiconductor material on a first substrate and irradiating the light-absorbing film with laser light, so that desired patterns can be selectively transferred to a second substrate. In this manner, the use of the invention can simplify a process and prevent waste of materials; therefore, a display device can be fabricated at low cost with high productivity.

In this embodiment mode, an amorphous semiconductor layer is used as a semiconductor layer, and a semiconductor layer having one conductivity type may be formed as required. In this embodiment mode, a semiconductor layer and an n-type amorphous semiconductor layer that is a semiconductor layer having one conductivity type are stacked. When an n-type semiconductor layer is formed, an n-channel thin film transistor with an NMOS structure can be obtained; when a p-type semiconductor layer is formed, a p-channel thin film transistor with a PMOS structure can be obtained. Further, it is also possible to form a CMOS structure having an n-channel thin film transistor and a p-channel thin film transistor.

In order to impart a conductivity type to the semiconductor layer, the semiconductor layer may be doped with an element which imparts a conductivity type so that impurity regions are formed in the semiconductor layer, whereby and an n-channel thin film transistor or a p-channel thin film transistor can be formed. Instead of forming an n-type semiconductor layer, it is also possible to impart a conductivity type to the semiconductor layer by performing plasma treatment with a $PH_3$ gas.

In this embodiment mode, the transistor 220 is an inversely staggered n-channel thin film transistor. It is also possible to use a channel-protective inversely staggered thin film transistor in which a protective layer is provided over a channel region of a semiconductor layer.

Next, the structure of a backlight unit 360 will be described. The backlight unit 360 includes a fluorescent light source 361 such as a cold cathode tube, a hot cathode tube, a light-emitting diode, an inorganic EL element, or an organic EL element; a lamp reflector 362 which efficiently guides fluorescence to a light guide plate 365; the light guide plate 365 which totally reflects light and guides the light to the entire plane; a diffusion plate 366 which reduces unevenness of luminance; and a reflection plate 364 which reuses light that has leaked to the bottom side of the light guide plate 365.

A control circuit for controlling the luminance of the light source 361 is connected to the backlight unit 360. The luminance of the light source 361 can be controlled by signals supplied from the control circuit.

In this embodiment mode, the insulating layer 252 is formed so as to have an opening which exposes a source or drain electrode layer 232 as shown in Embodiment Modes 1 and 2. Specifically, in the step of forming the insulating layer 252, a mask is provided in a region where the opening is to be formed, so that an insulating film is formed in a region excluding the mask. After the formation of the insulating film, the mask is removed physically or chemically, so that an insulating layer having an opening in the region where the mask has been provided is formed. Thus, the insulating layer 252 having an opening above the source or drain electrode layer 232 can be formed.

The shape of the opening reflects the shape of the mask. Therefore, any mask with which an opening with a desired shape can be formed is acceptable. The mask can have a columnar shape (e.g., a prism, a cylinder, or a triangular prism), a needle shape, or the like. In addition, the depth direction of the opening can be determined by the force generated upon providing the mask and by the film strength of the conductive layer that is provided with the mask. When a needle-shaped mask having a sharp end is provided in such a manner that a part of the sharp end sticks into the conductive layer, an opening with a recessed portion can be formed in the conductive layer. Further, after the formation of the opening, the conductive layer exposed at the bottom of the opening may be removed by etching, using the insulating layer having the opening as a mask.

The insulating layer can be formed by an evaporation method, a PVD (Physical Vapor Deposition) method such as a sputtering method, a CVD (Chemical Vapor Deposition) method such as a low-pressure CVD (LPCVD) method or a plasma CVD method, or the like. In the invention, a region above the conductive layer where the opening is to be formed is physically blocked with a mask so that the material for forming the insulating layer does not adhere to the conductive layer. Thus, a non-formation region of the insulating layer can be determined physically and, therefore, an insulating layer having an opening can be formed with high accuracy. Thus, using the invention can fabricate a highly reliable semiconductor device and display device with high yield.

According to the invention, an insulating layer having an opening can be selectively formed without using a photolithography process. Therefore, the number of steps and materials can be reduced.

The pixel electrode layer 251 is formed in the opening where the source or drain electrode layer is exposed, whereby the source or drain electrode layer and the pixel electrode layer 251 can be electrically connected.

This embodiment mode can be combined with any of Embodiment Modes 1 to 3 as appropriate.

According to the invention, a display device can be fabricated by a simplified process with a reduced number of complicated photolithography steps. Therefore, waste of materials can be reduced and cost reduction can be achieved. Thus, a display device with high performance and high reliability can be fabricated with high yield.

(Embodiment Mode 11)

This embodiment mode will describe an example of a highly reliable display device that is fabricated at low cost through a simplified process.

Figure 21:
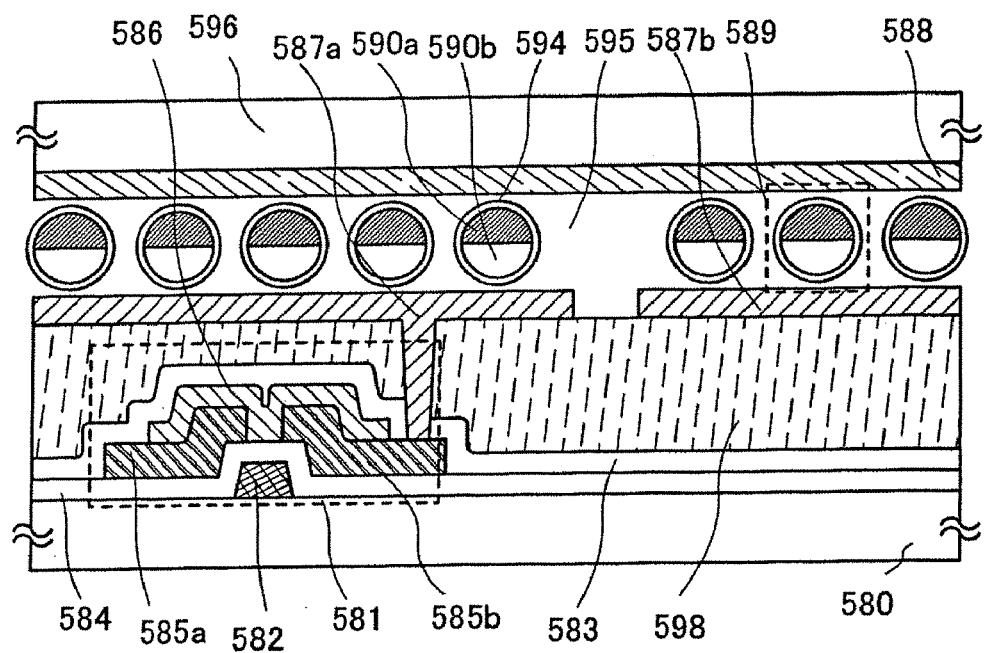
FIG. 21 illustrates a display device of the invention.

FIG. 21 shows active matrix electronic paper which applies the invention. Although an active matrix structure is shown in FIG. 21, the invention can also be applied to a passive matrix structure.

A twist ball display method can be applied to the electronic paper. A twist ball display method is a method in which spherical particles each colored in black and white are arranged between a first electrode layer and a second electrode layer, and a potential difference is generated between the first electrode layer and the second electrode layer so as to control the direction of the spherical particles, whereby display is performed.

A transistor 581 is an inverse coplanar thin film transistor and includes a gate electrode layer 582, a gate insulating layer 584, wiring layers 585a and 585b, and a semiconductor layer 586. In addition, the wiring layer 585b is in contact with and electrically connected to first electrode layers 587a and 587b at an opening formed in insulating layers 583 and 598. Between the first electrode layer 587a and a second electrode layer 588, spherical particles 589 each having a black region 590a and a white region 590b are provided, which are surrounded by a cavity 594 filled with liquid. The circumference of the spherical particles 589 is filled with a filler 595 such as resin (see FIG. 21). Note that reference numerals 580 and 596 in the drawing denote substrates.

In this embodiment mode, each of the gate electrode layer, the semiconductor layer, the source electrode layer, the drain electrode layer, the electrode layer, and the like can be formed by the method shown in Embodiment Mode 3 which includes the steps of depositing a light-absorbing conductive film on a first substrate and irradiating the light-absorbing conductive film with laser light, so that desired patterns can be selectively transferred to a second substrate. In this manner, the use of the invention can simplify a process and prevent waste of materials; therefore, cost reduction can be achieved.

In this embodiment mode, the insulating layer 583 is formed so as to have an opening which exposes the wiring layer 585b as shown in Embodiment Modes 1 and 2. Specifically, in the step of forming the insulating layer 583, a mask is provided in a region where the opening is to be formed, so that an insulating film is formed in a region excluding the mask. After the formation of the insulating film, the mask is removed physically or chemically, so that an insulating, layer having an opening in the region where the mask has been provided is formed. Thus, the insulating layer 583 having an opening above the wiring layer 585b can be formed.

The shape of the opening reflects the shape of the mask. Therefore, any mask with which an opening with a desired shape can be formed is acceptable. The mask can have a columnar shape (e.g., a prism, a cylinder, or a triangular prism), a needle shape, or the like. In addition, the depth direction of the opening can be determined by the force generated upon providing the mask and by the film strength of the conductive layer that is provided with the mask. When a needle-shaped mask having a sharp end is provided in such a manner that a part of the sharp end sticks into the conductive layer, an opening with a recessed portion can be formed in the conductive layer. Further, after the formation of the opening, the conductive layer exposed at the bottom of the opening may be removed by etching, using the insulating layer having the opening as a mask.

The insulating layer can be formed by an evaporation method, a PVD (Physical Vapor Deposition) method such as a sputtering method, a CVD (Chemical Vapor Deposition) method such as a low-pressure CVD (LPCVD) method or a plasma CVD method, or the like. In the invention, a region above the conductive layer where the opening is to be formed is physically blocked with a mask so that the material for forming the insulating layer does not adhere to the conductive layer. Thus, a non-formation region of the insulating layer can be determined physically and, therefore, an insulating layer having an opening can be formed with high accuracy. Thus, using the invention can fabricate a highly reliable semiconductor device and display device with high yield.

According to the invention, an insulating layer having an opening can be selectively formed without using a photolithography process. Therefore, the number of steps and materials can be reduced.

The first electrode layer 587*a* is formed in the opening where the insulating layer 585*b* is exposed, whereby the wiring layer 585*b* and the first electrode layer 587*a* can be electrically connected.

Instead of twist balls, an electrophoretic element can also be used. In that case, transparent liquid and microcapsules with a diameter of about 10 to 200 μm which contain positively charged white microparticles and negatively charged black microparticles are used. When an electric field is applied to the microcapsules by the first and second electrode layers, the white and black microparticles move in directions opposite to each other, whereby white or black can be displayed. A display element utilizing such a principle is an electrophoretic display element, which is generally called electronic paper. The electrophoretic display element has higher reflectivity than a liquid crystal display element. Therefore, it does not require an auxiliary light, consumes low power, and a display portion can be recognized even in a dim place. In addition, even when power is not supplied to the display portion, an image that has been displayed once can be retained. Therefore, even when a display device having a display function is put away from a radio source, an image that has been displayed once can be retained.

The transistor may have any structure as long as it can function as a switching element. Further, a semiconductor layer can be formed using various semiconductors such as an amorphous semiconductor, a crystalline semiconductor, a polycrystalline semiconductor, and a microcrystalline semiconductor. It is also possible to form an organic transistor using an organic compound.

Although a display device with an active matrix structure is specifically described in this embodiment mode, the invention can also be applied to a passive matrix display device. For a passive matrix display device also, a wiring layer, an electrode layer, and the like can be formed by the method shown in Embodiment Mode 3 which includes the steps of depositing a light-absorbing conductive film on a first substrate and irradiating the light-absorbing conductive film with laser light, so that desired patterns can be selectively transferred to a second substrate.

This embodiment mode can be combined with any of Embodiment Modes 1 to 3 as appropriate.

According to the invention, a display device can be fabricated by a simplified process with a reduced number of complicated photolithography steps. Therefore, waste of materials can be reduced and cost reduction can be achieved. Thus, a display device with high performance and high reliability can be fabricated with high yield.

(Embodiment Mode 12)

Next, an example where driver circuits are mounted on a display panel that is fabricated in accordance with Embodiment Modes 4 to 11 will be described.

Figure 26A:
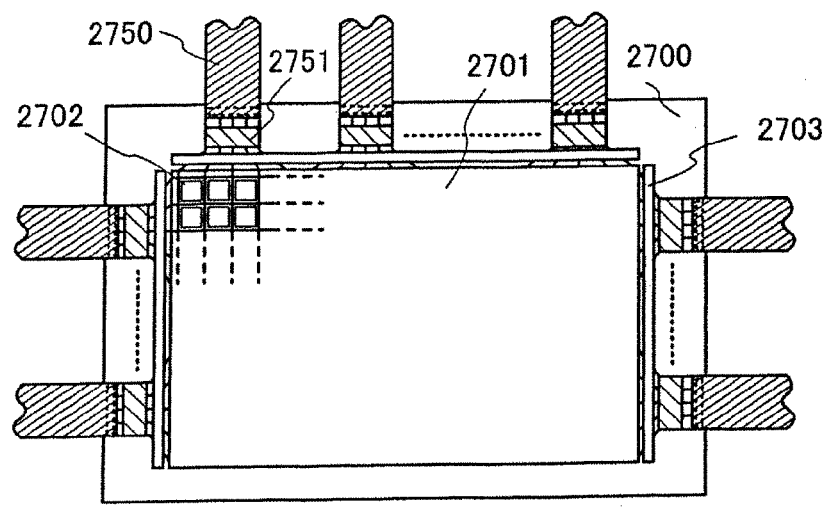
FIGS. 26A and 26B are plan views of display devices of the invention.

First, a display device formed using a COG method will be described with reference to FIG. 26A. A pixel portion 2701 having a matrix arrangement of pixels 2702 is formed over a substrate 2700. A substrate having a plurality of driver circuits is cut into rectangles, and driver circuits (also referred to as driver ICs) 2751 obtained thereby are mounted on the substrate 2700. FIG. 26A shows an example where a plurality of driver ICs 2751 are provided and FPCs 2750 are mounted on the ends of the driver ICs 2751. Further, it is also possible to provide a single driver IC with a length approximately equal to the length of a side of the pixel portion on the signal line side, and to mount a tape on the end of the driver IC.

Figure 26B:
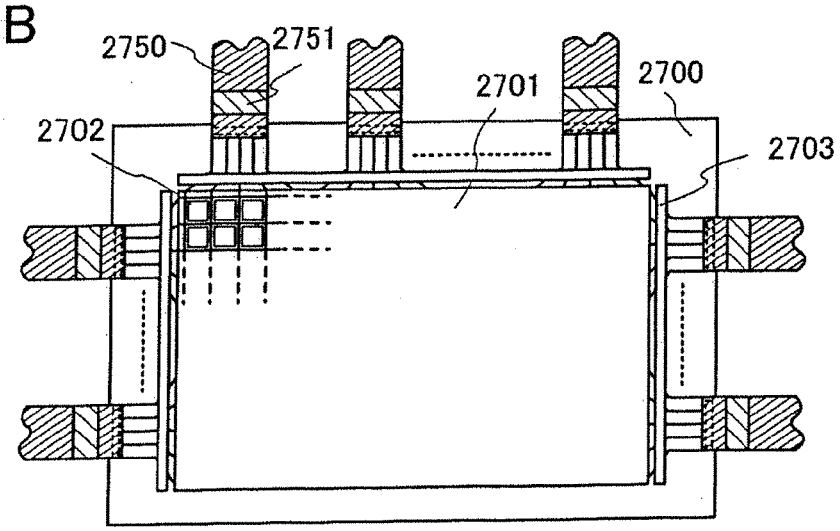

Alternatively, a TAB method may also be used. In that case, as shown in FIG. 26B, a plurality of tapes may be attached to a display panel, and driver ICs may be mounted on the tapes. It is also possible to mount a single driver IC on a single tape just as in the case of the COG method. In that case, it is preferable to use a metal piece or the like for fixing the driver IC for reinforcement purposes.

In order to improve productivity, the above-described driver ICs that are mounted on the display panel are preferably formed in plurality numbers over a rectangular substrate with one side of 300 to 1000 nm.

That is, a plurality of circuit patterns, each of which has a driver circuit portion and input/output terminals as one unit, may be formed over a substrate and the circuit patterns may be divided finally. The length of a long side of a driver IC is determined in consideration of the length of one side of the pixel portion or the pixel pitch. For example, a driver IC may be formed to be a rectangle with a long side of 15 to 80 mm and a short side of 1 to 6 mm. Alternatively, a driver IC may be formed to have a long side with a length equal to the length of one side of the pixel portion or the sum of the lengths of one side of the pixel region and one side of each driver circuit.

The advantage of providing driver ICs, when compared with IC chips, is in the external dimensions, specifically the length of a long side. When driver ICs each having a long side of 15 to 80 mm are used, the number of the driver ICs required to be mounted corresponding to a pixel portion can be suppressed than the case of using IC chips. Therefore, production yield can be improved. Further, when driver ICs are formed over a glass substrate, there is no restriction on the shape of a mother substrate. This is a great advantage compared with the case of forming IC chips out of a circular silicon wafer.

Figure 25A:
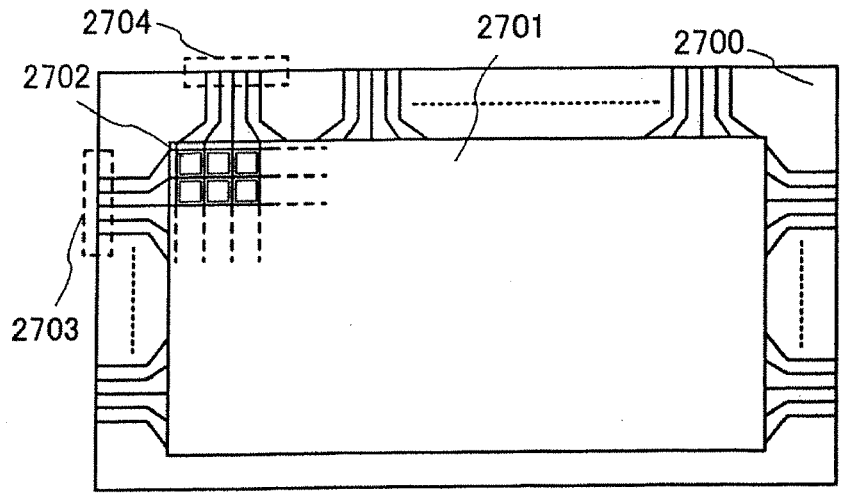
FIGS. 25A to 25C are plan views of display devices of the invention.
Figure 25B:
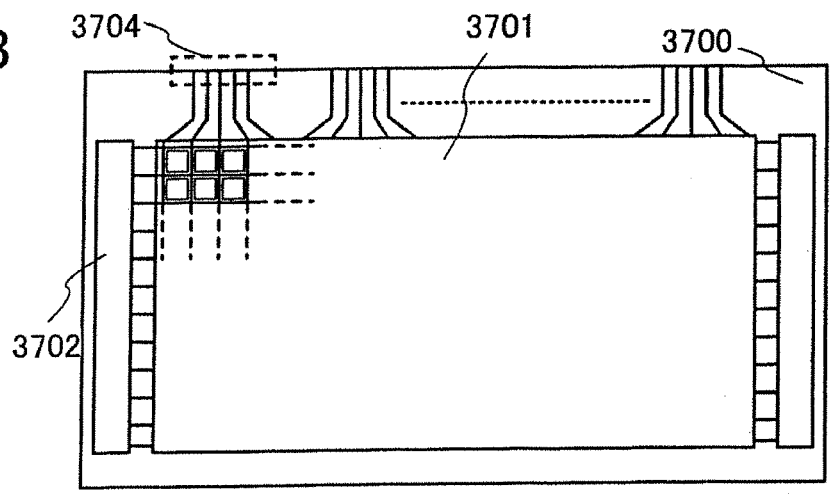

Further, when a scan line driver circuit 3702 is formed over the same substrate as the pixel portion as shown in FIG. 25B, driver ICs having signal line driver circuits are provided in the external region of a pixel portion 3701. In order to form a pixel region that can perform RGB full-color display, 3072 signal lines are required for the XGA class and 4800 signal lines are required for the UXGA class. The signal lines of such numbers are gathered per block at the end of the pixel portion 3701, forming lead wires. The lead wires are gathered in accordance with the pitch of external terminals.

Driver ICs are preferably formed by using a crystalline semiconductor over a substrate. Such a crystalline semiconductor is preferably formed by CW laser irradiation. Therefore, a CW solid-state laser or gas laser is used as a laser oscillator which can generate the CW laser light. Using a CW laser can form a crystalline semiconductor layer with few crystal defects and large grain size to form a transistor. Further, excellent mobility and response speed can be achieved and, therefore, the operation frequency of elements can be improved as compared with conventional techniques. Further, small variations in characteristics as well as high reliability can be achieved. In order to further improve the operation frequency, it is preferable to control the channel length direction of transistors and laser scan direction to be the same direction. This is because the highest mobility can be obtained when the channel length direction of transistors and the laser scan direction with respect to the substrate are approximately in parallel with each other (preferably, −30 to 30 degrees). Note that a channel length direction is the same direction as a current flow direction, i.e., the direction in which charges move in the channel formation region. A transistor formed in this manner has an active layer formed of a polycrystalline semiconductor layer whose crystal grains extend in the channel direction. This means crystal grain boundaries are formed roughly along the channel direction.

In performing laser crystallization, the width of laser light is preferably reduced to a large degree. Specifically, the width of the laser light (beam spot) is preferably reduced to about 1 to 3 mm which is equal to the length of the short side of the driver IC. In addition, in order to secure sufficient and efficient energy density for an irradiation object, an irradiation region of the laser light preferably has a linear form. Note that a "linear form" herein does not mean a line in a strict sense but means a rectangle or a prolate ellipsoid with an aspect ratio of two or more (preferably, 10 to 10000). In this manner, when the width of the laser light (beam spot) is made equal to the length of the short side of a driver IC, a method of fabricating a display device with improved productivity can be provided.

It is also possible to form both of the scan line driver circuit and the signal line driver circuit using driver ICs as shown in FIGS. 26A and 26B. In that case, driver ICs with different specifications are preferably used for the scan line driver circuit and the signal line driver circuit.

In the pixel region, signal lines and scan lines intersect with each other to form a matrix, and a transistor is formed at each intersection. In the invention, TFTs whose channels are formed from an amorphous semiconductor or a semi-amorphous semiconductor are used as the transistors disposed in the pixel region. An amorphous semiconductor is formed by a plasma CVD method, a sputtering method, or the like. A semi-amorphous semiconductor can be formed by a plasma CVD method at a temperature equal to or lower than 300° C. When a semi-amorphous semiconductor is used, transistors with a desired thickness can be formed in a short time even over a non-alkali glass substrate having external dimensions of, for example, 550×650 mm. Such fabrication technique is effective for fabricating a display device with a large display screen. A semi-amorphous TFT whose channel formation region is formed from SAS can obtain an electron field-effect mobility of 2 to 10 $cm^2/V \cdot sec$. Further, using the invention can form a desired pattern with high controllability and, therefore, minute wirings without defects such as a short circuit can be stably formed. Thus, a display panel which can realize a system-on-panel can be fabricated.

When TFTs whose semiconductor layers are formed from SAS are used, a scan line driver circuit can also be formed over the same substrate as a pixel portion. Meanwhile, when TFTs whose semiconductor layers are formed from AS are used, both of a scan line driver circuit and a signal line driver circuit are preferably formed using driver ICs.

In that case, driver ICs with different specifications are preferably used for the scan line driver circuit and the signal line driver circuit. For example, although transistors that constitute the scan-line-side driver IC are required to have a withstand voltage of about 30 V, they require a driving frequency not higher than 100 kHz. Therefore, not a very high-speed operation is required. Thus, the transistors that constitute the scan-line-side driver IC are preferably designed to have a sufficiently long channel (L). On the other hand, although transistors that constitute the signal-line-side driver IC are required to have a withstand voltage of about 12 V at the most, they require a driving frequency of 65 MHz at 3 V, and thus require a high-speed operation. Therefore, the channel length and the like of the transistors that constitute the driver ICs are preferably designed at the micron scale.

A method of mounting the driver ICs is not particularly limited, and a COG method, a wire bonding method, or a TAB method can be used.

When the thickness of each driver IC is designed to be equal to the thickness of a counter substrate, the driver IC and the counter substrate can have substantially the same height. Therefore, a display device as a whole can be made thin. Further, when the substrates are formed using the same material, thermal stress is not generated even when a temperature change occurs in the display device. Therefore, the characteristics of the circuit having TFTs are not degraded. Furthermore, when driver circuits are formed using driver ICs that are longer than IC chips as shown in this embodiment mode, the number of driver ICs to be mounted for one pixel region can be reduced.

In this manner, the driver circuits can be built into the display panel.

(Embodiment Mode 13)

An example where a semiconductor layer of a display panel (an EL display panel or a liquid crystal display panel) fabricated in accordance with Embodiment Modes 4 to 11) is formed using an amorphous semiconductor or SAS and a scan line driver circuit is formed over a substrate will be described.

Figure 31:
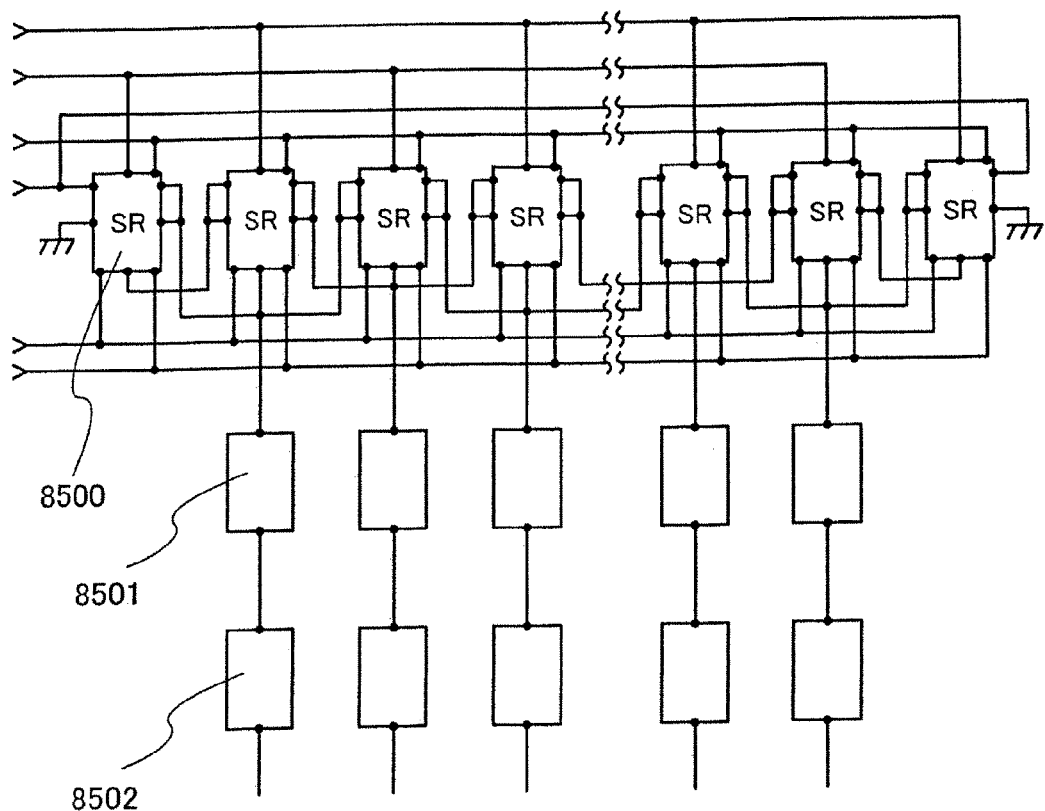
FIG. 31 illustrates a circuit configuration of a scan line driver circuit of a display panel of the invention which is constructed from TFTs.

FIG. 31 is a block diagram of a scan line driver circuit constructed from n-channel TFTs that are formed using SAS having an electron field-effect mobility of 1 to 15 $cm^2/V \cdot sec$.

In FIG. 31, a block indicated by reference numeral 8500 corresponds to a pulse output circuit which outputs sampling pulses of one stage, and a shift-register includes n pulse output circuits. Reference numeral 8501 denotes a buffer circuit, which is connected to a pixel 8502.

Figure 32:
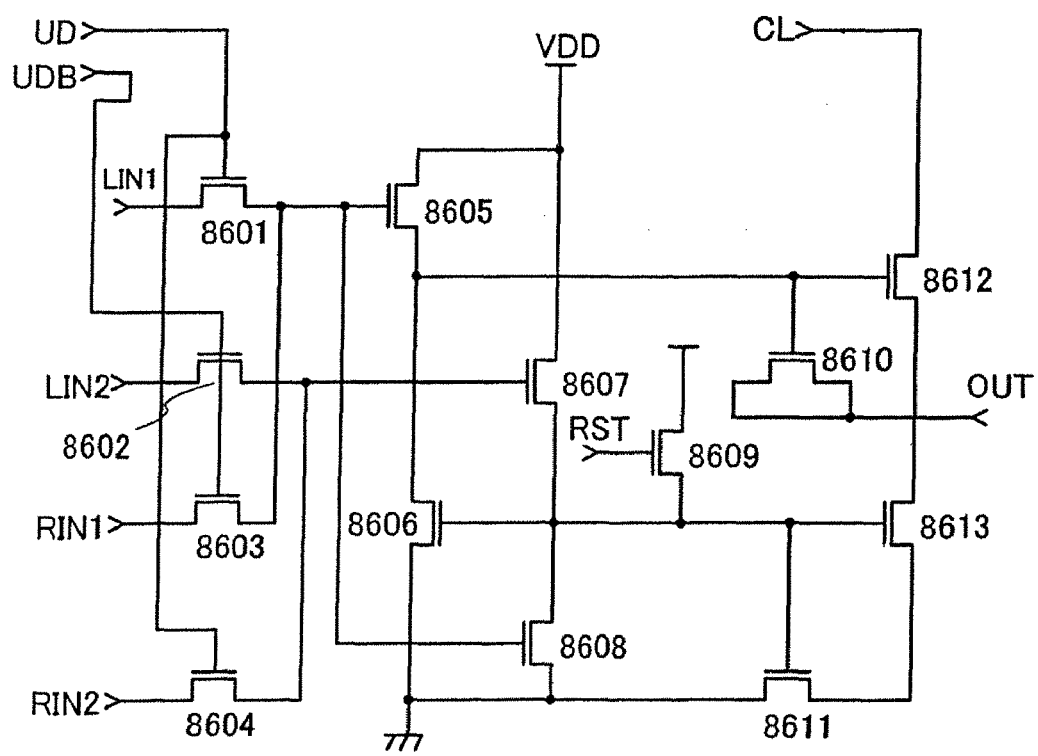
FIG. 32 illustrates a circuit configuration of a scan line driver circuit of a display panel of the invention which is constructed from TFTs (a shift register circuit)

FIG. 32 shows a specific configuration of the pulse output circuit 8500, which is constructed from n-channel TFTs 8601 to 8613. The size of the n-channel TFTs formed from SAS may be determined in consideration of the operating characteristics of the TFTs. For example, provided that the channel length is 8 µm, the channel width may be designed to be in the range of 10 to 80 µm.

Figure 33:
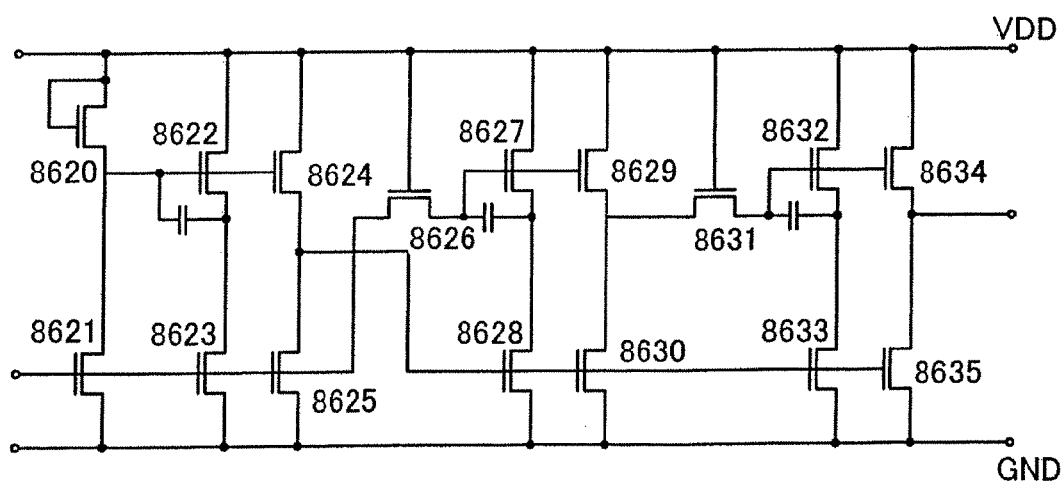
FIG. 33 illustrates a circuit configuration of a scan line driver circuit of a display panel of the invention which is constructed from is (a buffer circuit)

FIG. 33 shows a specific configuration of the buffer circuit 8501. The buffer circuit is also constructed from n-channel TFTs 8620 to 8635. The size of the n-channel TFTs formed from SAS may be determined in consideration of the operating characteristics of the TFTs. For example, provided that the channel length is 10 µm, the channel width is designed to be in the range of 10 to 1800 µm.

In order to build such circuits, TFTs should be connected with wirings.

In this manner, driver circuits can be built into a display panel.

(Embodiment Mode 14)

Figure 16:
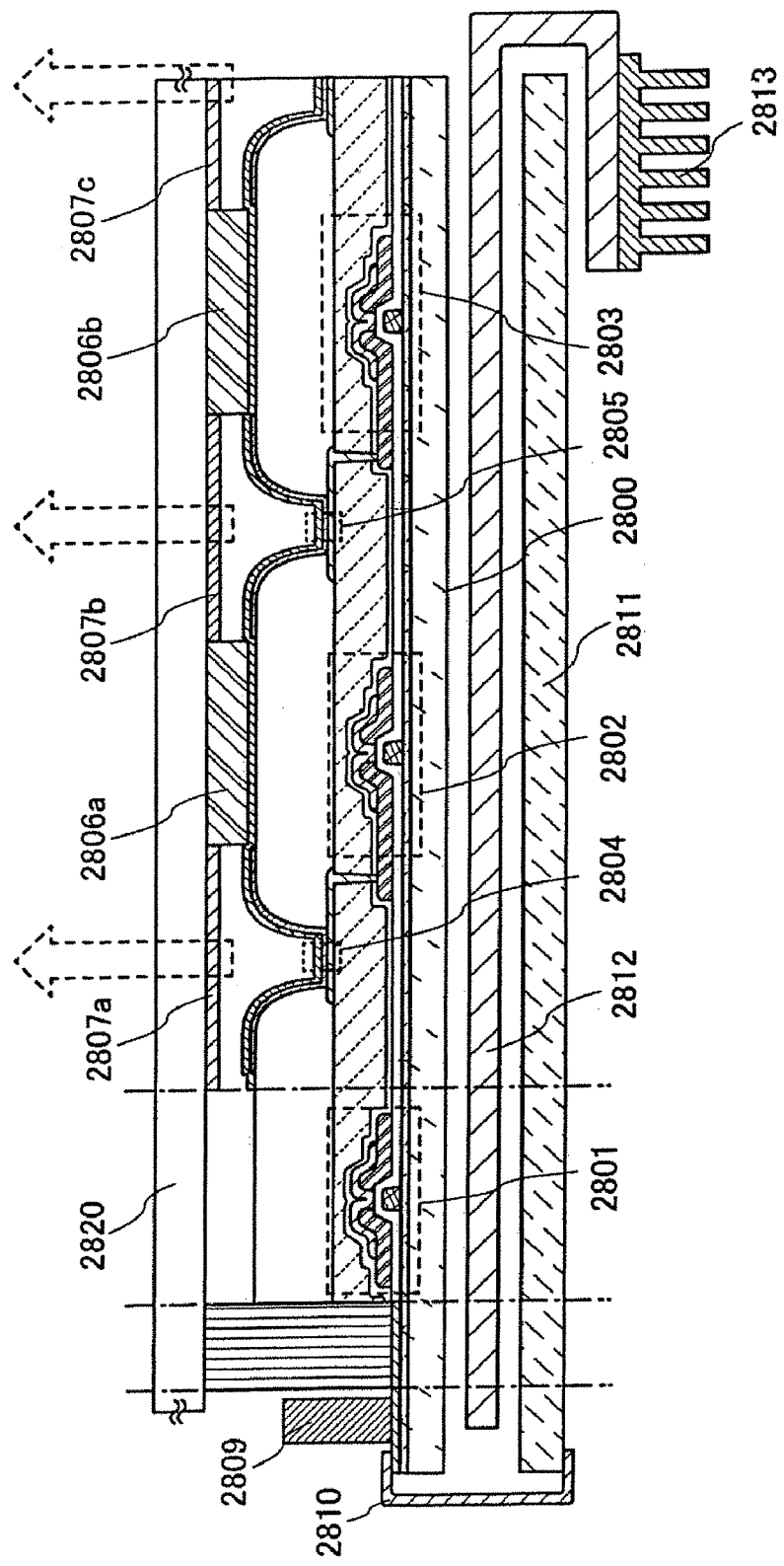
FIG. 16 is a cross-sectional view which exemplarily illustrates the structure of a display module of the invention.

This embodiment mode will be described with reference to FIG. 16. FIG. 16 shows an example where an EL display module is constructed by using a TFT substrate 2800 that is fabricated in accordance with the invention. In FIG. 16, a pixel portion having pixels is formed over the TFT substrate 2800.

In FIG. 16, a protection circuit 2801, which includes a TFT similar to the TFT formed in the pixel or such a TFT whose gate and source or drain are connected together to function as a diode, is provided on the outer side of the pixel portion (between a driver circuit and the pixels). A driver circuit 2809 can be any of a driver IC formed from a single-crystalline semiconductor, a stick driver IC formed from a polycrystalline semiconductor film over a glass substrate, a driver circuit formed from SAS, and the like.

A sealing substrate 2820 is attached to the TFT substrate 2800 with spacers 2806a and 2806b, which are formed by a droplet discharge method, interposed therebetween. The spacers are preferably provided to keep a constant distance between the two substrates even when the substrates are thin or the area of the pixel portion is large. A space above light-emitting elements 2804 and 2805 connected to TFTs 2802 and 2803, respectively between the TFT substrate 2800 and the sealing substrate 2820 may be filled with a solidified resin material which has a light-transmitting property with respect to light at least in the visible range, or may be filled with anhydrous nitrogen or an inert gas.

FIG. 16 shows a top-emission structure in which light emitted from the light-emitting elements 2804 and 2805 travels in the direction of the arrows. Pixels having different emission colors, i.e., red, green, and blue are formed, whereby multi-color display can be performed. Further, when colored layers 2807a to 2807c corresponding to red, green, and blue colors are provided on the sealing substrate 2820, the color purity of light emitted to the outside can be increased. Furthermore, it is also possible to form white-light-emitting elements in the pixels and combine them with the colored layers 2807a to 2807c.

The driver circuit 2809 that is an external circuit is connected to scan line connection terminals or signal line connection terminals provided at one end of an external circuit board 2811 through a wiring board 2810. In addition, a heat pipe 2813 (a pipe-form highly efficient heat conduction device) and a heat sink 2812, which are used to dissipate heat to the outside of the device, may also be provided to be in contact with or close to the TFT substrate 2800 in order to increase the heat-sink effect.

Although FIG. 16 shows an EL display module with a top-emission structure, a bottom-emission structure or a dual-emission structure in which light is emitted to both the top and bottom sides may also be constructed by changing the structure of the light-emitting elements or the position of the external circuit board.

Such an EL display module may also be constructed so as to reflect outside light by using retardation plates and a polarizing plate. In the case of constructing a display device with a top-emission structure, an insulating layer functioning as a partition may be colored to form a black matrix. Such a partition can be formed by a droplet discharge method or the like, and can be formed with a black resin such as pigment or with a mixture of a resin material such as polyimide and carbon black or the like. Stacked layers of such materials may also be used. Further, a partition may also be formed by depositing different materials in the same region a plurality of times by a droplet discharge method. As the retardation plates, a λ/4 plate and a λ/2 plate may be used and designed so as to control light. Specifically, light-emitting elements, a sealing substrate (a sealant), retardation plates (a λ/4 plate and a λ/2 plate), and a polarizing plate are sequentially stacked from the side of the TFT substrate, whereby light emitted from the light-emitting elements passes through these stacked layers and finally passes through the polarizing plate to go to outside. Such retardation plates and polarizing plate may be provided on the light-emission side. As for a dual-emission display device in which light is emitted to both the top and bottom sides, such retardation plates and polarizing plate may be provided on each side. Further, an anti-reflection film may also be provided on the outer side of the polarizing plate. Accordingly, images with higher definition and resolution can be displayed.

It is also possible to form a sealed structure by bonding a resin film to the side of the TFT substrate 2800 having the pixel portion with the use of a sealant or an adhesive resin. Although a glass substrate is used for sealing in this embodiment mode, various sealing methods using plastic, a film, and the like can also be used. Further, a gas barrier film for preventing moisture penetration is preferably provided on the surface of the resin film. With a film-sealed structure, further reduction in thickness and weight can be achieved.

This embodiment mode can be combined with any of Embodiment Modes 1 to 8, 12, and 13 as appropriate.

(Embodiment Mode 15)

Figure 20A:
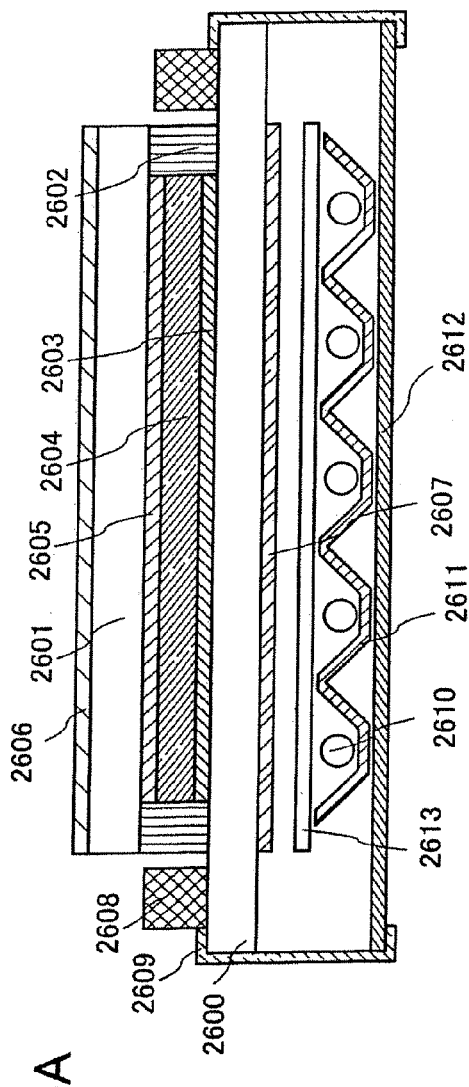
FIGS. 20A and 20B are cross-sectional views which exemplarily illustrate the structures of display modules of the invention.
Figure 20B:
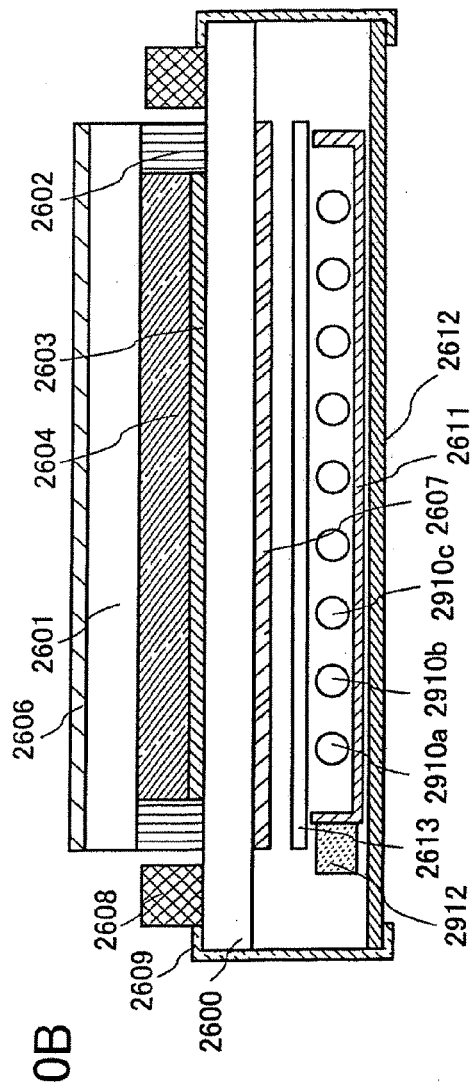

This embodiment mode will be described with reference to FIGS. 20A and 20B. FIGS. 20A and 20B each show an example of constructing a liquid crystal display module using a TFT substrate 2600 that is fabricated by using the invention.

FIG. 20A shows an example of a liquid crystal display module in which the TFT substrate 2600 and a counter substrate 2601 are bonded with a sealant 2602, and a pixel portion 2603 and a liquid crystal layer 2604 are provided therebetween to form a display region. A colored layer 2605 is necessary to perform color display. In order to perform RGB display, colored layers corresponding to red, green, and blue colors are provided for respective pixels. A polarizing plate 2606 is provided on the outer side of the counter substrate 2601, while a polarizing plate 2607 and a diffusion plate 2613 are provided on the outer side of the TFT substrate 2600. A light source includes a cold cathode tube 2610 and a reflection plate 2611. An external circuit board 2612, which has external circuits such as a control circuit and a power supply circuit, is connected to the TFT substrate 2600 with a flexible wiring board 2609. Further, a retardation plate may also be provided between the polarizing plate and the liquid crystal layer. A driver circuit 2608 that is an external circuit is connected to scan line connection terminals or signal line connection terminals provided at one end of the external circuit board 2612 through the flexible wiring board 2609.

The liquid crystal display module can use any of a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Ferroelectric Liquid Crystal) mode, an AFLC (AntiFerroelectric Liquid Crystal) mode, and the like.

FIG. 20B shows an example of an FS-LCD (Field Sequential-LCD) in which an OCB mode is applied to the liquid crystal display module shown in FIG. 20A. The FS-LCD emits red light, green light, and blue light during one frame period and can perform color display by combining images using a time division method. Since each light is emitted by a light emitting diode, a cold cathode tube, or the like, a color filter is not necessary. Therefore, it is not necessary to provide color filters of three primary colors and restrict the display region of each color, and thus all of three colors can be displayed in any region. On the other hand, since light of three colors is emitted during one frame period, high-speed response is required for liquid crystals. By using an FLC mode in combination with an FS method and an OCB mode for a display device of the invention, a display device or a liquid crystal television device with high performance and high image quality can be completed.

An OCB-mode liquid crystal layer has a so-called π-cell structure. In the π-cell structure, liquid crystal molecules are aligned so that their pretilt angles are plane-symmetric with respect to a center plane between an active matrix substrate and a counter substrate. The alignment state of a π-cell structure is splay alignment when a voltage is not applied between the substrates but shifts to bend alignment when a voltage is applied therebetween. This bend alignment exhibits white display. When a voltage is further applied, liquid crystal molecules of bend alignment become perpendicular to both the substrates so that light is not transmitted. With the OCB mode, a response speed about 10 times higher than that of a conventional TN mode can be achieved.

As an alternative mode corresponding to the FS method, it also possible to use, for example, HV(Half V)-FLC or SS(Surface Stabilized)-FLC that uses FLC (Ferroelectric Liquid Crystal) capable of high-speed operation. Nematic liquid crystals having relatively low viscosity can be used for the OCB mode, while smectic liquid crystals having a ferroelectric phase and the like can be used for the HV-FLC and the SS-FLC.

The optical response speed of a liquid crystal display module can be increased by narrowing the cell gap of the liquid crystal display module. Alternatively, the optical response speed can also be increased by decreasing the viscosity of a liquid crystal material. The increase in response speed is particularly effective in the case where a pixel region of a TN-mode liquid crystal display module has a pixel pitch less than or equal to 30 μm. Furthermore, the response speed can also be increased by using an overdrive method by which a voltage applied is increased (or decreased) for a moment.

FIG. 20B shows a transmissive liquid crystal display module in which a red light source 2910*a*, a green light source 2910*b*, and a blue light source 2910*c* are provided as light sources. A controller 2912 is also provided for switching each of the red light source 2910*a*, the green light source 2910*b*, and the blue light source 2910*c*. The controller 2912 controls the emission of each color. Light enters the liquid crystals, and images are combined by a time division method, so that color display is performed.

By using the invention in the above manner, a liquid crystal display module with high definition and high reliability can be fabricated.

This embodiment mode can be combined with any of Embodiment Modes 1 to 3 and Embodiment Modes 9 to 13 as appropriate.

(Embodiment Mode 16)

Figure 27:
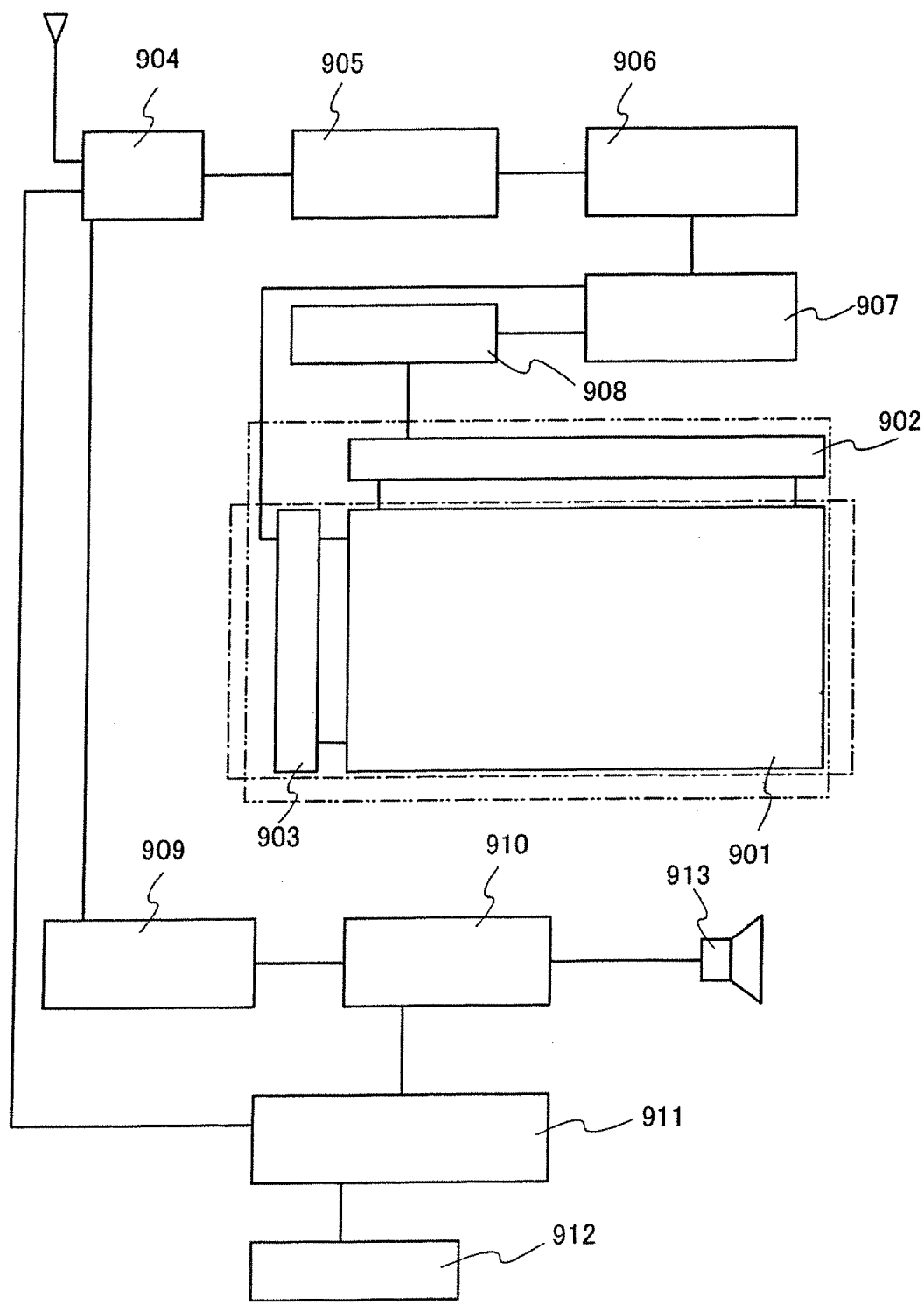
FIG. 27 is a block diagram showing the main structure of an electronic device to which the invention is applied.

With a display device formed in accordance with the invention, a television device (or simply called a television or a television receiver) can be completed. FIG. 27 shows a block diagram showing the main structure of a television device.

FIG. 25A is a plan view showing the structure of a display panel in accordance with the invention. A pixel portion 2701 having a matrix arrangement of pixels 2702, scan-line-side input terminals 2703, and signal-line-side input terminals 2704 are formed over a substrate 2700 having an insulating surface. The number of pixels can be determined in accordance with various standards. For examples, XGA for RGB full-color display requires 1024×768×3 (RGB) pixels; UXGA for RGB full-color display requires 1600×1200×3 (RGB) pixels; and full-spec high-vision RGB full-color display requires 1920×1080×3 (RGB) pixels.

Scan lines that extend from the scan-line-side input terminals 2703 and signal lines that extend from the signal-line-side input terminals 2704 intersect with each other, whereby the pixels 2702 are arranged in matrix. Each pixel 2702 includes a switching element and a pixel electrode connected thereto. A typical example of the switching element is a TFT. A gate electrode layer of the TFT is connected to a scan line, while a source or drain electrode layer of the TFT is connected to a signal line, whereby each pixel can be independently controlled by a signal input from outside.

Although FIG. 25A illustrates the structure of a display panel in which signals inputted to the scan lines and the signal lines are controlled by external driver circuits, it is also possible to mount driver IC 2751*s* on the substrate 2700 by a COG (Chip on Glass) method as shown in FIG. 26A. Alternatively, a TAB (Tape Automated Bonding) method shown in FIG. 26B may also be employed. The driver ICs can be constructed either by forming circuits on a single-crystalline semiconductor substrate or forming a circuit with TFT over a glass substrate. In FIGS. 26A and 26B, the driver ICs 2751 are connected to FPCs (Flexible Printed Circuits) 2750.

In the case of forming TFTs provided in the pixels by using a crystalline semiconductor, it is possible to form a scan line driver circuit 3702 over a substrate 3700 as shown in FIG. 25B. In FIG. 25B, a pixel portion 3701 is controlled by external circuits similarly to FIG. 25A in which the pixel portion is connected to the signal-line-side input terminals 2704. In the case of forming TFTs provided in the pixels by using a polycrystalline (or microcrystalline) semiconductor, a single-crystalline semiconductor, or the like which has high mobility, it is possible to form a pixel portion 4701, a scan line driver circuit 4702, and a signal line driver circuit 4704 over the same substrate 4700 as shown in FIG. 25C.

Figure 25C:
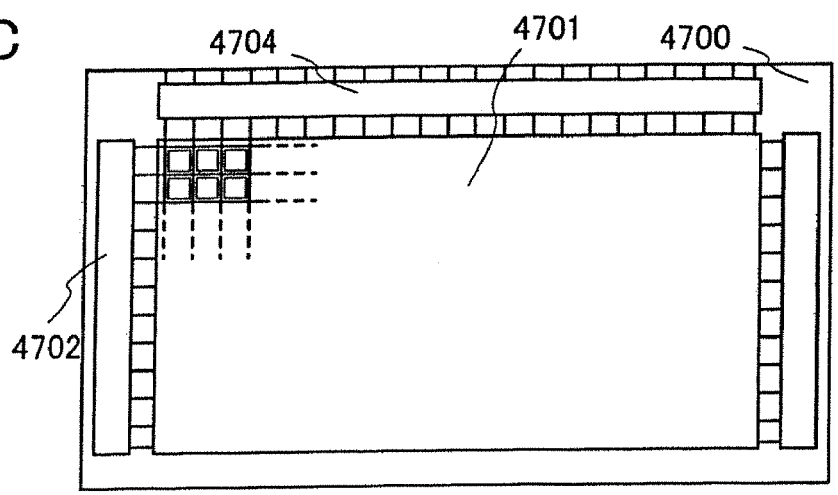

The display panel can have any of the structures shown in FIG. 25A in which only a pixel portion 901 in FIG. 27 is formed over the substrate, while a scan line driver circuit 903 and a signal line driver circuit 902 are mounted on the substrate by a TAB method as shown in FIG. 26B or a COG method as shown in FIG. 26A; the structure shown in FIG. 25B in which the pixel portion 901 and the scan line driver circuit 903 are formed with TFTs over the substrate, while the signal line driver circuit 902 is mounted on the substrate in the form of driver ICs; and the structure shown in FIG. 25C in which the pixel portion 901, the signal line driver circuit 902, and the scan line driver circuit 903 are formed over the same substrate.

FIG. 27 shows the structures of other external circuits, which include a video signal amplifier circuit 905 for amplifying video signals among signals received at a tuner 904, a video signal processing circuit 906 for converting signals outputted from the video signal amplifier circuit 905 into color signals corresponding to red, green, and blue colors, a control circuit 907 for converting the video signals so as to be input to the driver ICs, and the like. The control circuit 907 outputs signals to each of the scan line driver circuit 903 and the signal line driver circuit 902. In the case of digitally driving the display panel, a signal divider circuit 908 may be provided between the control circuit 907 and the signal line driver circuit 902 so that input digital signals can be divided into m signals before supplied to the pixel portion 901.

Audio signals among the signals received at the tuner 904 are transmitted to an audio signal amplifier circuit 909, and an output thereof is supplied to a speaker 913 through an audio signal processing circuit 910. The control circuit 911 receives control data on the receiving station (reception frequency) or sound volume from an input portion 912, and transmits signals to the tuner 904 and the audio signal processing circuit 910.

Figure 28A:
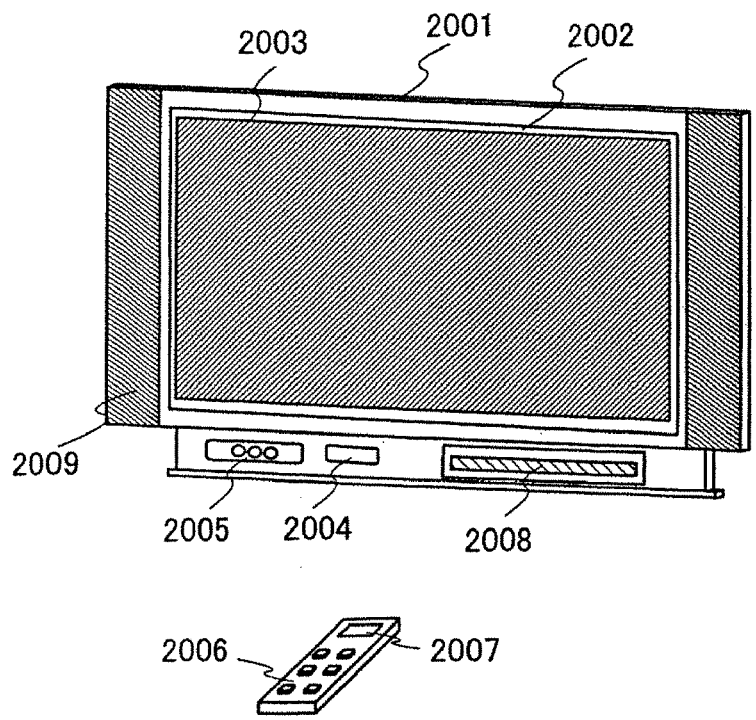
FIGS. 28A and 28B illustrate electronic devices to which the invention is applied.
Figure 28B:
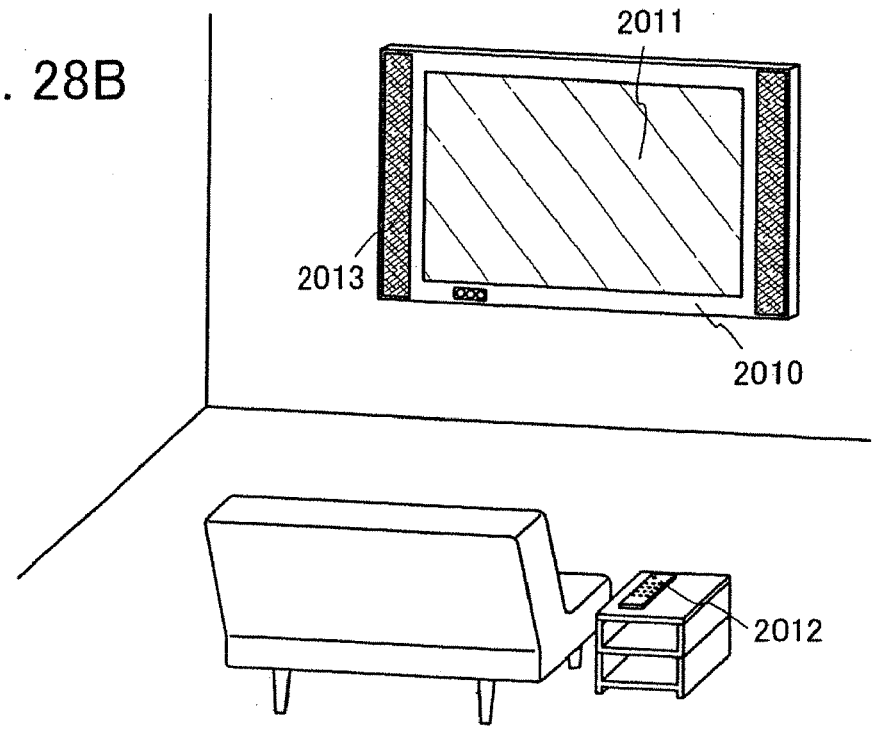

By incorporating the above-described display module into a housing as shown in FIGS. 28A and 28B, a television device can be completed. When a liquid crystal display module is used as a display module, a liquid crystal television device can be fabricated, and when an EL module is used, an EL television device can be fabricated. Further, a plasma television, electronic paper, and the like can also be fabricated. Referring to FIG. 28A, a display module constitutes a main display screen 2003, and other accessories such as speaker portions 2009 and operation switches are provided. As described above, a television device can be completed according to the invention.

A display panel 2002 is built into a housing 2001. When the television device is connected to wired or wireless communications networks via a modem 2004, data communication of one way (from a transmitter to a receiver) or two ways (between a transmitter and a receiver or between receivers) can be performed with a receiver 2005. The television device can be operated with switches incorporated in the housing or with a separate remote controller 2006. The remote controller 2006 may also be provided with a display portion 2007 for displaying data to be output.

In addition, the television device may also have additional functions of displaying channels or sound volume such as a sub-display screen 2008 having a second display panel in addition to the main display screen 2003. In this structure, both the main display screen 2003 and the sub-display screen 2008 can be formed with liquid crystal display panels of the invention. Alternatively, it is also possible to form the main display screen 2003 with an EL display panel having excellent viewing angles and form the sub-display screen 2008 with a liquid crystal display panel capable of low-power-consumption drive. As a further alternative, in order to achieve low-power-consumption drive, it is also possible to form the main display screen 2003 with a liquid crystal display panel and form the sub-display screen 2008 with an EL display panel, in which case the sub-display screen 2008 may have a blinking function. With the invention, a highly reliable display device can be fabricated even when a large substrate and a large number of TFTs and electronic components are used.

FIG. 28B shows a television device having a large display portion with a size of 20 to 80 inches, for example and includes a housing 2010, a display portion 2011, a remote controller 2012 which is an operating portion, speaker portions 2013, and the like. The invention is applied to the fabrication of the display portion 2011. The television device shown in FIG. 28B is of a wall-mounted type and does not require large space.

Needless to say, the invention can be applied not to only television devices but also various objects such as monitors of personal computers and large display media such as information display boards at the train station or the airport and advertising display boards on the streets.

This embodiment mode can be combined with any of Embodiment Modes 1 to 15 as appropriate.

(Embodiment Mode 17)

Electronic devices in accordance with the invention include television devices (or simply called televisions or television receivers), digital cameras, digital video cameras, mobile phone sets (or simply called mobile phones) portable information terminals such as PDA, portable game machines, computer monitors, computers, audio reproducing devices such as car audio sets, image reproducing devices having recording media such as home-use game machines, and the like. Specific examples of such electronic devices will now be described with reference to FIGS. 29A to 29E.

Figure 29A:
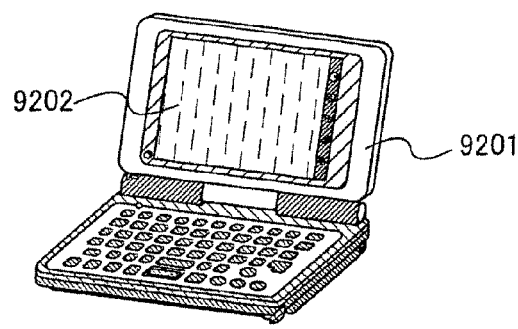
FIGS. 29A to 29E illustrate electronic devices to which the invention is applied.

A portable information terminal shown in FIG. 29A includes a main body 9201, a display portion 9202, and the like. The display device of the invention can be applied to the display portion 9202. As a result, a fabrication process can be simplified and cost reduction can be achieved. Therefore, a highly reliable portable information terminal can be provided at low cost.

Figure 29B:
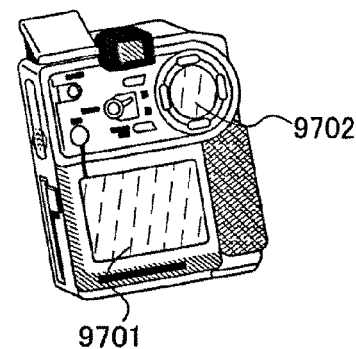

A digital video camera shown in FIG. 29B includes display portions 9701 and 9702 and the like. The display device of the invention can be applied to the display portions 9701 and 9702. As a result, a fabrication process can be simplified and cost reduction can be achieved. Therefore, a highly reliable digital camera can be provided at low cost.

Figure 29C:
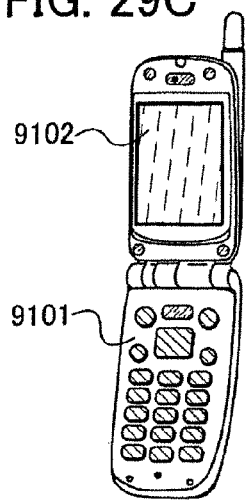

A portable phone shown in FIG. 29C includes a main body 9101, a display portion 9102, and the like. The display device of the invention can be applied to the display portion 9102. As a result, a fabrication process can be simplified and cost reduction can be achieved. Therefore, a highly reliable portable phone can be provided at low cost.

Figure 29D:
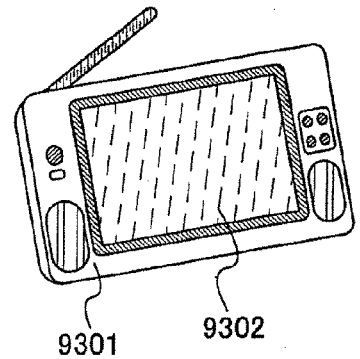

A portable television device shown in FIG. 29D includes a main body 9301, a display portion 9302, and the like. The display device of the invention can be applied to the display portion 9302. As a result, a fabrication process can be simplified and cost reduction can be achieved. Therefore, a highly reliable television device can be provided at low cost. The display device of the invention can be applied to various television devices such as a compact television device built into a portable terminal typified by a portable phone, a medium-size television device that can be carried about, and a large television device (e.g., 40 inches or more).

Figure 29E:
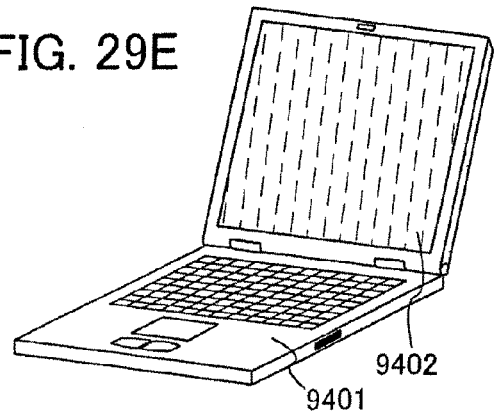

A portable computer shown in FIG. 29E includes a main body 9401, a display portion 9402, and the like. The display device of the invention can be applied to the display portion 9402. As a result, a fabrication process can be simplified and cost reduction can be achieved. Therefore, a highly reliable computer can be provided at low cost.

As described above, electronic devices with high reliability and high performance can be provided at low cost by the use of the display device of the invention.

This embodiment mode can be combined with any of Embodiment Modes 1 to 16 as appropriate.

The present application is based on Japanese Priority application No. 2006-231956 filed on Aug. 29, 2006 with the Japanese Patent Office, the entire contents of which are hereby incorporated by reference.

What is claimed is:

1. A method for manufacturing a semiconductor device comprising the steps of:
providing a mask on a conductive layer;
forming an insulating film over the conductive layer provided with the mask;
removing the mask to form an opening in the insulating film;
removing a part of the conductive layer exposed at the bottom of the opening by etching; and
forming a conductive film in the opening so as to be in contact with the conductive layer.

2. The method for manufacturing a semiconductor device according to claim 1, wherein the mask has a plurality of projecting portions on a supporting substrate.

3. The method for manufacturing a semiconductor device according to claim 2, wherein the supporting substrate has a plurality of openings.

4. The method for manufacturing a semiconductor device according to claim 1, wherein the insulating film is formed by an evaporation method, a sputtering method, or a chemical vapor deposition method.

5. The method for manufacturing a semiconductor device according to claim 4, wherein the mask is provided on the conductive layer so as to form a recessed portion in a surface of the conductive layer.

6. The method for manufacturing a semiconductor device according to claim 1, wherein the mask has a needle shape.

7. The method for manufacturing a semiconductor device according to claim 1, wherein the mask is removed by etching.

8. The method for manufacturing a semiconductor device according to claim 1, wherein the conductive layer is transferred to a substrate by laser irradiation.

9. A method for manufacturing a semiconductor device comprising the steps of:

forming a thin film transistor including a gate electrode layer, a gate insulating layer, a semiconductor layer, a source electrode layer, and a drain electrode layer;

providing a mask on the source electrode layer or the drain electrode layer;

forming an insulating film over the thin film transistor having the source electrode layer or the drain electrode layer provided with the mask;

removing the mask to form an opening in the insulating film;

removing a part of the source electrode layer or the drain electrode layer exposed at the bottom of the opening by etching; and forming a pixel electrode layer in the opening so as to be in contact with the source electrode layer or the drain electrode layer.

10. The method for manufacturing a semiconductor device according to claim 9, wherein the mask has a plurality of projecting portions on a supporting substrate.

11. The method for manufacturing a semiconductor device according to claim 10, wherein the supporting substrate has a plurality of openings.

12. The method for manufacturing a semiconductor device according to claim 9, wherein the insulating film is formed by an evaporation method, a sputtering method, or a chemical vapor deposition method.

13. The method for manufacturing a semiconductor device according to claim 9, wherein the mask has a needle shape.

14. The method for manufacturing a semiconductor device according to claim 9, wherein the mask is provided on the source electrode layer or the drain electrode layer so as to form a recessed portion in a surface of the source electrode layer or the drain electrode layer.

15. The method for manufacturing a semiconductor device according to claim 9, wherein the mask is removed by etching.

16. The method for manufacturing a semiconductor device according to claim 9, wherein the source electrode layer or the drain electrode layer is transferred to a substrate by laser irradiation.

17. The method for manufacturing a semiconductor device according to claim 9, wherein the semiconductor layer comprises an amorphous semiconductor.

18. The method for manufacturing a semiconductor device according to claim 9, wherein the semiconductor layer comprises an organic semiconductor.

19. A method for manufacturing a semiconductor device comprising the steps of:

forming a thin film transistor including a gate electrode layer, a gate insulating layer, a semiconductor layer, a source electrode layer, and a drain electrode layer;

providing a mask on the source electrode layer or the drain electrode layer;

forming an insulating film over the thin film transistor having the source electrode layer or the drain electrode layer provided with the mask;

removing the mask to form an opening in the insulating film;

removing a part of the source electrode layer or the drain electrode layer exposed at the bottom of the opening by etching;

forming a first electrode layer in the opening so as to be in contact with the source electrode layer or the drain electrode layer;

forming an electroluminescent layer over the first electrode layer; and forming a second electrode layer over the electroluminescent layer.

20. The method for manufacturing a semiconductor device according to claim 19, wherein the mask has a plurality of projecting portions on a supporting substrate.

21. The method for manufacturing a semiconductor device according to claim 20, wherein the supporting substrate has a plurality of openings.

22. The method for manufacturing a semiconductor device according to claim 19, wherein the insulating film is formed by an evaporation method, a sputtering method, or a chemical vapor deposition method.

23. The method for manufacturing a semiconductor device according to claim 19, wherein the mask has a needle shape.

24. The method for manufacturing a semiconductor device according to claim 19, wherein the mask is provided on the source electrode layer or the drain electrode layer so as to form a recessed portion in a surface of the source electrode layer or the drain electrode layer.

25. The method for manufacturing a semiconductor device according to claim 19, wherein the mask is removed by etching.

26. The method for manufacturing a semiconductor device according to claim 19, wherein the source electrode layer or the drain electrode layer is transferred to a substrate by laser irradiation.

27. The method for manufacturing a semiconductor device according to claim 19, wherein the semiconductor layer comprises an amorphous semiconductor.

28. The method for manufacturing a semiconductor device according to claim 19, wherein the semiconductor layer comprises an organic semiconductor.

29. The method for manufacturing a semiconductor device according to claim 19, wherein the electroluminescent layer comprises an organic compound.

* * * * *

UNITED STATES PATENT AND TRADEMARK OFFICE
CERTIFICATE OF CORRECTION

| | | |
|---|---|---|
| PATENT NO. | : 8,409,905 B2 | |
| APPLICATION NO. | : 13/270271 | |
| DATED | : April 2, 2013 | |
| INVENTOR(S) | : Koichiro Tanaka | |

It is certified that error appears in the above-identified patent and that said Letters Patent is hereby corrected as shown below:

In the Specification:

Col. 5, line 27, "from is" should read "from TFTs"

Col. 20, line 29, "one or of rare" should read "one or more of rare"

Col. 26, line 59, "fillet." should read "filler."

Col. 28, line 41, "$O_2$ or $BCl_3$" should read "$Cl_2$ or $BCl_3$"

Col. 36, line 36, "eledrode layer" should read "electrode layer"

Col. 40, line 59, "860 includes first layer 840" should read "860 includes a first layer 840"

Col. 41, line 7, "provement in heat resistance" should read "improvement in heat resistance"

Col. 41, line 58, "another or anic" should read "another organic"

Col. 43, line 24, "(juloidin-9-yl)pethenyl" should read "(juloidin-9-yl)ethenyl"

Col. 47, line 19, "resistance beating" should read "resistance heating"

Col. 48, lines 38-39, "mixing them a mortar" should read "mixing them in a mortar"

Col. 48, lines 53-54, "impurity element a solution" should read "impurity element in a solution"

Signed and Sealed this
Seventeenth Day of June, 2014

Michelle K. Lee
*Deputy Director of the United States Patent and Trademark Office*